(12) United States Patent
Asai et al.

(10) Patent No.: US 12,352,820 B2
(45) Date of Patent: Jul. 8, 2025

(54) SERVER AND EXTERNAL TERMINAL FOR DETERIORATION DEGREE DETERMINATION SYSTEM FOR SECONDARY BATTERY, AND DETERIORATION DEGREE DETERMINATION SYSTEM

(71) Applicant: DENSO CORPORATION, Kariya (JP)

(72) Inventors: Tomomi Asai, Kariya (JP); Nobuo Yamamoto, Kariya (JP); Hiroyasu Suzuki, Kariya (JP); Katsuki Hayashi, Kariya (JP); Yuya Minabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 244 days.

(21) Appl. No.: 18/068,691

(22) Filed: Dec. 20, 2022

(65) Prior Publication Data

US 2023/0122626 A1    Apr. 20, 2023

Related U.S. Application Data

(63) Continuation of application No. PCT/JP2021/022682, filed on Jun. 15, 2021.

(30) Foreign Application Priority Data

Jun. 30, 2020    (JP) .................................. 2020-113171

(51) Int. Cl.
*G01R 31/392*    (2019.01)
*G01R 31/371*    (2019.01)
(Continued)

(52) U.S. Cl.
CPC ......... *G01R 31/392* (2019.01); *G01R 31/371* (2019.01); *G01R 31/3842* (2019.01); *H02J 7/005* (2020.01)

(58) Field of Classification Search
CPC   G01R 31/392; G01R 31/3842; G01R 31/371; H02J 7/005
See application file for complete search history.

(56) References Cited

U.S. PATENT DOCUMENTS 8,615,372 B2 * 12/2013 Tomura ................. H01M 10/48
702/63
2013/0085696 A1    4/2013 Xu et al.
(Continued)

FOREIGN PATENT DOCUMENTS

JP           5259443 B2      8/2013
JP       2017228103 A      12/2017
(Continued)

OTHER PUBLICATIONS

U.S. Appl. No. 18/068,650, filed Dec. 20, 2022, Asai et al.
U.S. Appl. No. 18/068,828, filed Dec. 20, 2022, Asai et al.

*Primary Examiner* — Walter L Lindsay, Jr.
*Assistant Examiner* — Milton Gonzalez
(74) *Attorney, Agent, or Firm* — Harness, Dickey & Pierce, P.L.C.

(57) ABSTRACT

A server for a deterioration degree determination system for a secondary battery includes an estimation formula memory unit and an update unit. The estimation formula memory unit stores an estimation formula for determining a deterioration degree based on a battery characteristic related to transition of a battery state over a predetermined voltage section in the secondary battery or a battery characteristic relationship value related to the battery characteristic. The update unit that updates the estimation formula stored in the estimation formula memory unit based on the battery characteristic related to the transition of the battery state of the secondary battery acquired by charging and discharging the secondary battery in an external terminal.

12 Claims, 38 Drawing Sheets

(51) Int. Cl.
*G01R 31/3842* (2019.01)
*H02J 7/00* (2006.01)

(56) References Cited

U.S. PATENT DOCUMENTS

| | | |
|---|---|---|
| 2013/0314050 A1* | 11/2013 | Matsubara ................ H02J 7/00 320/134 |
| 2014/0019001 A1 | 1/2014 | Nishizawa |
| 2014/0336964 A1 | 11/2014 | Okumura et al. |
| 2020/0403415 A1 | 12/2020 | Inoue et al. |
| 2021/0048482 A1 | 2/2021 | Ukumori |
| 2021/0123980 A1 | 4/2021 | Kataoka et al. |

FOREIGN PATENT DOCUMENTS

| | | |
|---|---|---|
| JP | 2019125482 A | 7/2019 |
| JP | 6555440 B1 | 8/2019 |
| WO | WO-2011160258 A1 | 12/2011 |
| WO | WO-2012133212 A1 | 10/2012 |
| WO | WO-2012137456 A1 | 10/2012 |
| WO | WO-2020012720 A1 | 1/2020 |

* cited by examiner (a)

(b)

(a)

(b)

SERVER AND EXTERNAL TERMINAL FOR DETERIORATION DEGREE DETERMINATION SYSTEM FOR SECONDARY BATTERY, AND DETERIORATION DEGREE DETERMINATION SYSTEM

CROSS REFERENCE TO RELATED APPLICATIONS

The present application is a continuation application of International Patent Application No. PCT/JP2021/022682 filed on Jun. 15, 2021, which designated the U.S. and claims the benefit of priority from Japanese Patent Application No. 2020-113171 filed on Jun. 30, 2020. The entire disclosures of all of the above applications are incorporated herein by reference.

TECHNICAL FIELD

The present disclosure relates to a server and an external terminal for a deterioration degree determination system for a secondary battery, and the deterioration degree determination system.

BACKGROUND

A secondary battery has been widely used as a power supply for various devices. The secondary battery deteriorates with use, but the progress degree of the deterioration varies, and thus it is necessary to acquire the deterioration degree for each secondary battery. It is difficult to directly detect the deterioration degree and the like from the secondary battery, and thus it is estimated from various types of information of the secondary battery.

SUMMARY

The present disclosure describes a server and an external terminal for a deterioration degree determination system for a secondary battery, which are capable of determining a deterioration degree of the secondary battery with high accuracy, and the deterioration degree determination system including the server and the external terminal.

BRIEF DESCRIPTION OF DRAWINGS

Objects, features and advantages of the present disclosure will become more apparent from the following detailed description with reference to the accompanying drawings. In the drawings.

DETAILED DESCRIPTION

Figure 1:
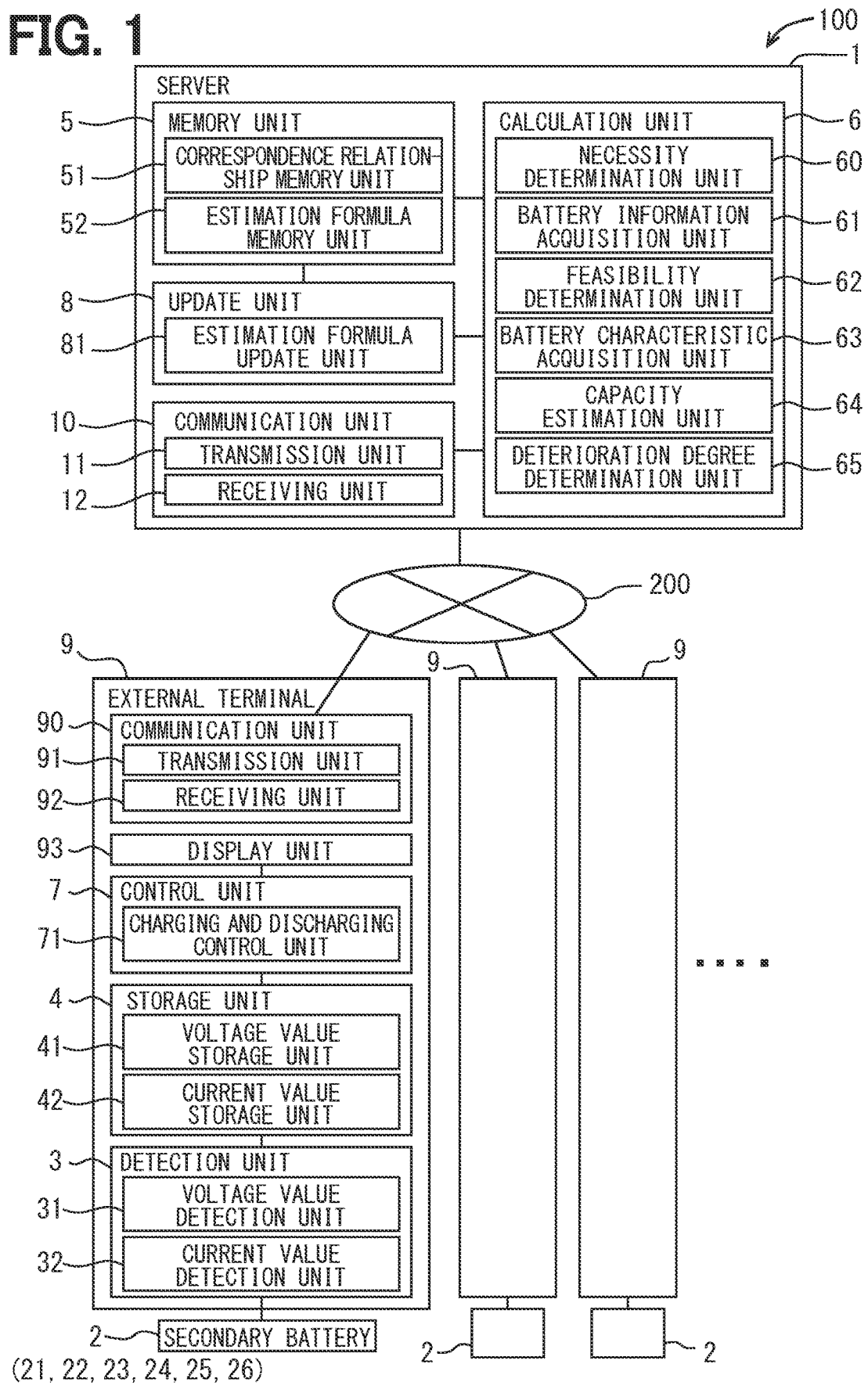
FIG. 1 is a conceptual diagram showing a configuration of the deterioration degree determination system in an embodiment 1.

To begin with, a relevant technology will be described only for understanding the embodiments of the present disclosure.

As a configuration to estimate the deterioration degree of a secondary battery, there is a configuration in which the deterioration degree of the full charging capacity of the secondary battery is estimated based on a predetermined reference by using the history of the battery capacity of the secondary battery.

In such a configuration, a reference for estimating the deterioration degree is prepared in advance. On the other hand, the tendency of deterioration of the secondary battery changes with time, and thus in the configuration in which the deterioration degree is estimated based on a reference prepared in advance without changing the estimation reference of the deterioration degree accordingly, it is difficult to maintain high determination accuracy.

The present disclosure provides a server and an external terminal for a deterioration degree determination system for a secondary battery, which are capable of determining a deterioration degree of the secondary battery with high accuracy, and the deterioration degree determination system including the server and the external terminal.

According to a first aspect of the present disclosure, a server for a deterioration degree determination system for determining a deterioration degree for a secondary battery includes: an estimation formula memory unit that stores an estimation formula for determining a deterioration degree based on a battery characteristic related to transition of a battery state over a predetermined voltage section in the secondary battery or a battery characteristic relationship value related to the battery characteristic; and an update unit that updates the estimation formula stored in the estimation formula memory unit based on the battery characteristic related to the transition of the battery state of the secondary battery acquired by charging and discharging the secondary battery in an external terminal.

According to a second aspect of the present disclosure, an external terminal is for a deterioration degree determination system for a secondary battery including a server for deterioration degree determination in which an estimation formula for determining a deterioration degree of a secondary battery is stored. The external terminal includes: a battery characteristic acquisition unit that acquires a battery characteristic related to transition of a battery state over a predetermined voltage section in the secondary battery; and a transmission unit that transmits the battery characteristic acquired by the battery characteristic acquisition unit or a battery characteristic relationship value related to the battery characteristic to the server.

According to a third aspect of the present disclosure, a deterioration degree determination system for a secondary battery includes the server, and the external terminal, and in which the deterioration degree determination system is configured to perform deterioration degree determination based on a comparison result between the estimation formula and the battery characteristic or the battery characteristic relationship value in the server or the external terminal.

In the server for the deterioration degree determination system for the secondary battery according to the first aspect, the estimation formula for determining the deterioration degree is configured to be updated based on the battery characteristic related to the transition of the battery state in the secondary battery acquired by discharging the secondary battery. Accordingly, the estimation formula follows the tendency of deterioration of the secondary battery that changes with time, and thus the deterioration degree of the secondary battery can be determined with high accuracy.

The external terminal for the deterioration degree determination system for the secondary battery according to the second aspect above has a configuration suitable for updating the estimation formula for determining a deterioration degree by the server. Accordingly, the above estimation formula, by being used in combination with the above server, can be made to follow the tendency of deterioration of the secondary battery that changes over time, such that the deterioration degree of the secondary battery can be determined with high accuracy.

The deterioration degree determination system for a secondary battery according to the third aspect above includes the server and the external terminal, is configured to determine the deterioration degree of the secondary battery, and has a configuration suitable for updating the estimation formula for determining a deterioration degree in the server. Accordingly, the estimation formula can be made to follow the tendency of the deterioration of the secondary battery that changes with time, and thus the deterioration degree of the secondary battery can be determined with high accuracy.

As described above, according to the aspects of the present disclosure, it is possible to provide the deterioration degree determination system for a secondary battery capable of determining the deterioration degree of the secondary battery with high accuracy.

Embodiment 1

An embodiment of a server for a deterioration degree determination system for a secondary battery will be described with reference to FIGS. 1 to 6. In the present specification, the server for the deterioration degree determination system is also referred to as a "server".

As shown in FIG. 1, a server 1 of the present embodiment 1 is the server 1 for a deterioration degree determination system 100 to determine the deterioration degree of a secondary battery 2.

The server 1 includes an estimation formula memory unit 52 and an update unit 8.

The estimation formula memory unit 52 stores an estimation formula for determining the deterioration degree based on the battery characteristic related to the transition of the battery state over a predetermined voltage section in the secondary battery 2 or the battery characteristic relationship value related to the battery characteristic.

An update unit 8 updates the estimation formula stored in the estimation formula memory unit 52 based on the battery characteristic related to the transition of the battery state of the secondary battery 2 acquired by discharging the secondary battery 2 in an external terminal 9.

Hereinafter, the deterioration degree determination system 100 including the server 1 of the present embodiment 1 will be described in detail.

As shown in FIG. 1, the deterioration degree determination system 100 is configured such that a server 1 and the external terminal 9 are connected to each other via a communication network 200. The server 1 is configured with an arithmetic device. For example, the server 1 can be configured with a single computer or multiple computers. Multiple external terminals 9 can be provided. For example, each of the external terminals can be disposed at a base sales office in each region, and the server 1 can be disposed at one management office to make connection via the communication network 200. The communication network may be a dedicated line, or an existing one such as the Internet and a telephone line may be used.

In the deterioration degree determination system 100 shown in FIG. 1, the type of secondary batteries 21 to 26 of which the deterioration degree is to be determined is not limited, and the known secondary battery such as a nickel-metal hydride battery and a lithium ion battery can be a target. The secondary batteries 21 to 26 may have a single cell or multiple cells. In the present embodiment 1, as shown in (a) in FIG. 2, the secondary batteries 21 to 26 form a secondary battery module that is a module that can be individually attached to and detached from a battery pack 20. The number of secondary batteries in the battery pack 20 is not particularly limited, but in the present embodiment 1, the number is six, and the secondary batteries 21 to 26 are connected in series. Instead of the above-mentioned, the secondary batteries 21 to 26 may be connected in parallel. As shown in (b) in FIG. 2, the corresponding battery pack 20 is mounted on a vehicle 900 as a battery.

Next, the server 1 will be described. As shown in FIG. 1, in the present embodiment 1, the server 1 includes a memory unit 5, a calculation unit 6, the update unit 8, and a communication unit 10.

The memory unit 5 shown in FIG. 1 is configured with a non-volatile memory, and includes a correspondence relationship memory unit 51 and the estimation formula memory unit 52. In the present embodiment 1, the correspondence relationship memory unit 51 stores the correspondence relationship between the battery characteristic and a total capacity. The form of the corresponding correspondence relationship is not particularly limited, and can be, for example, a calculation formula, a map, a graph, and a table. The corresponding correspondence relationship can be created by machine learning using the measurement-purpose secondary battery, or created based on the actual measurement value obtained by performing an accelerated deterioration test by using the measurement-purpose secondary battery, or created by a calculation formula that logically derives the correspondence relationship between the battery characteristic and the total capacity in a predetermined voltage section by using the model of the secondary battery. The correspondence relationship stored in the correspondence relationship memory unit 51 is appropriately set according to the battery characteristic acquired by the battery characteristic acquisition unit 63 described later.

The above-mentioned total capacity can be the capacity from a fully discharged state to a fully charged state in the charging time. Alternatively, the total capacity can be the capacity from the fully charged state to the fully discharged state in the discharging time. The fully discharged state may be an effective fully discharged state defined by a system such as a vehicle on which the secondary battery 2 is mounted, and may be a state in which the lower limit voltage set by the user who uses the deterioration degree determination system 100 has been reached. The fully charged state may be an effective fully charged state defined by the system such as the vehicle and the like, or may be a state in which the upper limit voltage specified by the user has been reached.

The estimation formula memory unit 52 shown in FIG. 1 stores, in advance, a battery characteristic acquisition reference that is a reference of the necessity determination of acquiring the battery characteristic of the secondary battery 2 used in a necessity determination unit 60 described later, a feasibility determination reference that is a reference of the feasibility of the determination of the deterioration degree in the secondary battery 2 used in a feasibility determination unit 62 described later, and an estimation formula for determining the deterioration degree used in a deterioration degree determination unit 65 described later. The corresponding reference and the estimation formula are appropriately set according to the mode of determination in the necessity determination unit 60, the feasibility determination unit 62, and the deterioration degree determination unit 65, respectively. In the present embodiment 1, the estimation formula is set with multiple estimation formulas such that the deterioration degree can be divided into five stages and determined.

The calculation unit 6 shown in FIG. 1 is configured with a predetermined arithmetic device, and includes the necessity determination unit 60, the battery information acquisition unit 61, the feasibility determination unit 62, the battery characteristic acquisition unit 63, a capacity estimation unit 64 as an estimation unit, and the deterioration degree determination unit 65.

The necessity determination unit 60 shown in FIG. 1 determines the necessity of acquiring the battery characteristic for each secondary battery 2 based on the comparison result between the battery information including the information related to the secondary battery 2 and the battery characteristic acquisition reference stored in the estimation formula memory unit 52. In the present embodiment 1, the result of the feasibility of deterioration degree determination by the feasibility determination unit 62 described later is used as the battery characteristic acquisition reference, and the necessity determination unit 60 determines that the acquisition of the battery characteristic is necessary with respect to the secondary battery of which the determination of the deterioration degree is determined to be not feasible based on the feasibility determination reference by the feasibility determination unit 62. The timing at which the necessity determination unit 60 performs the necessity determination is not limited, and may be performed each time the feasibility is determined by the feasibility determination unit 62, may be performed when the determination count of the feasibility by the feasibility determination unit 62 reaches a predetermined count, may be performed after a predetermined time has elapsed from the previous necessity determination, or may be performed as a combination thereof.

The battery information acquisition unit 61 shown in FIG. 1 acquires battery information that is information related to the secondary batteries 21 to 26. The corresponding battery information may be the history information of the secondary batteries 21 to 26, or can also be the history information replaced with or together with the battery characteristic described later. In the present embodiment 1, the battery information acquisition unit 61 acquires the battery characteristic acquired by the battery characteristic acquisition unit 63 described later as battery information.

The feasibility determination unit 62 shown in FIG. 1 determines the feasibility of the deterioration degree determination for each of the secondary batteries 21 to 26 based on the battery information acquired by the battery information acquisition unit 61 or the battery information relationship value calculated from the corresponding battery information, and the feasibility determination reference stored in the estimation formula memory unit 52. In the present embodiment 1, the secondary battery for which the determination of the deterioration degree is determined to be infeasible by the feasibility determination unit 62 is one outside the area of the training data used when the determination reference of the deterioration degree is defined in the deterioration degree determination unit 65 described later, and is one belonging to an unlearned area. Therefore, regarding the corresponding secondary battery, there is a possibility that the determination accuracy cannot be sufficiently ensured by the present deterioration degree determination, and thus the deterioration degree determination described later may not be performed. Accordingly, the determination accuracy can be improved as a whole by being able to perform the determination of the deterioration degree for the secondary battery in which determination accuracy can be sufficiently ensured.

Figure 4:
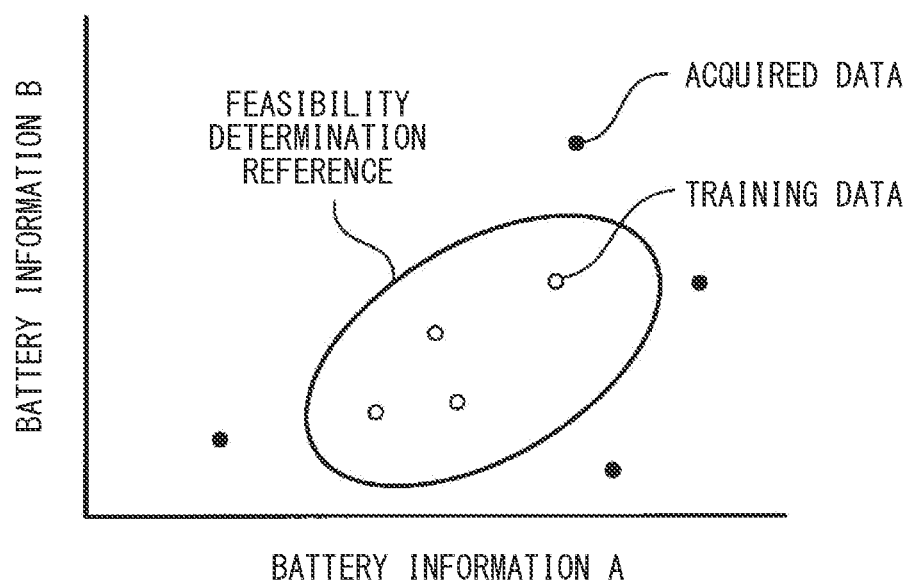
FIG. 4 is a conceptual diagram showing a feasibility determination reference in the embodiment 1.

The feasibility determination reference used in the feasibility determination unit 62 shown in FIG. 1 can be created by machine learning using a measurement-purpose secondary battery, be created based on the test measurement value obtained by performing an accelerated deterioration test by using the measurement-purpose secondary battery or the measured value acquired from the used secondary battery, or be created by a relational expression that logically derives the feasibility determination reference by using the model of the secondary battery. The corresponding feasibility determination reference can be expressed as upper and lower limit values, only an upper limit value or only a lower limit value, or in a map format. For example, as shown in FIG. 4, a predetermined range calculated by performing machine learning by using the correspondence relationship between a battery information A and a battery information B acquired from the measurement-purpose secondary battery as training data, can be used as the feasibility determination reference. That is, the distance between the data with respect to the corresponding training data can be used as the feasibility determination reference. The distance between the corresponding data can be defined based on the Mahalanobis distance, the Euclidean distance, the Manhattan distance, the Chebyshev distance, and the like.

In the present embodiment 1, the feasibility determination unit 62 is configured to perform feasibility determination based on the Mahalanobis distance calculated as a comparison result between the battery information relationship value calculated from the battery information acquired by the battery information acquisition unit and the feasibility determination reference, by using the preset relational expression related to multiple battery information. Multiple feasibility determination references may be set. That is, after the feasibility of the first deterioration degree determination is determined based on the first feasibility determination reference, the feasibility of the second deterioration degree determination with respect to the secondary battery for which the first deterioration degree determination is determined to be not feasible, may be determined based on the second feasibility determination reference.

The battery characteristic acquisition unit 63 acquires the battery characteristic in a predetermined voltage section of the secondary batteries 21 to 26. The battery characteristic of the secondary batteries 21 to 26 can be, for example, a characteristic based on the voltage transition and the temperature transition of the secondary battery 2 in a predetermined voltage section Vs. The corresponding voltage transition, for example, can be calculated based on at least one of the section capacity of the secondary batteries 21 to 26 in the predetermined voltage section, the ratio of the voltage change of the secondary batteries 21 to 26 with respect to the capacity change of the secondary battery 2 in the predetermined voltage section, and the ratio of the voltage change of the secondary batteries 21 to 26 with respect to the elapsed time in the predetermined voltage section. The predetermined voltage section can be a voltage section in which the deterioration degree of the secondary batteries 21 to 26 and the transition of the battery state show a correlation. Such a voltage section can be set based on the type and configuration of the secondary batteries 21 to 26, or can be derived by machine learning using the secondary battery. The battery characteristic acquisition unit 63 may acquire the absolute value of the acquired value as the battery characteristic. The predetermined voltage section Vs in which the battery characteristic of the secondary batteries 21 to 26 is acquired can be set for each of the secondary batteries 21 to 26, or can be appropriately changed.

The battery characteristic acquisition unit 63 acquires the battery characteristic in a specific voltage section or capacity section for the secondary battery for which the determination of the deterioration degree is determined to be infeasible by the feasibility determination unit 62. The corresponding voltage section or capacity section is not particularly limited, and may be a section having the total capacity or may be a section having a predetermined capacity. The battery characteristic in the corresponding specific capacity section is referred to as a capacity battery characteristic. For example, the capacity battery characteristic in the total capacity can be a characteristic based on the voltage transition and the temperature transition of the secondary battery 2 in the voltage section from the fully discharged state to the fully charged state in the time of charging or the voltage section from the fully charged state to the fully discharged state in the discharging time.

Figure 3:
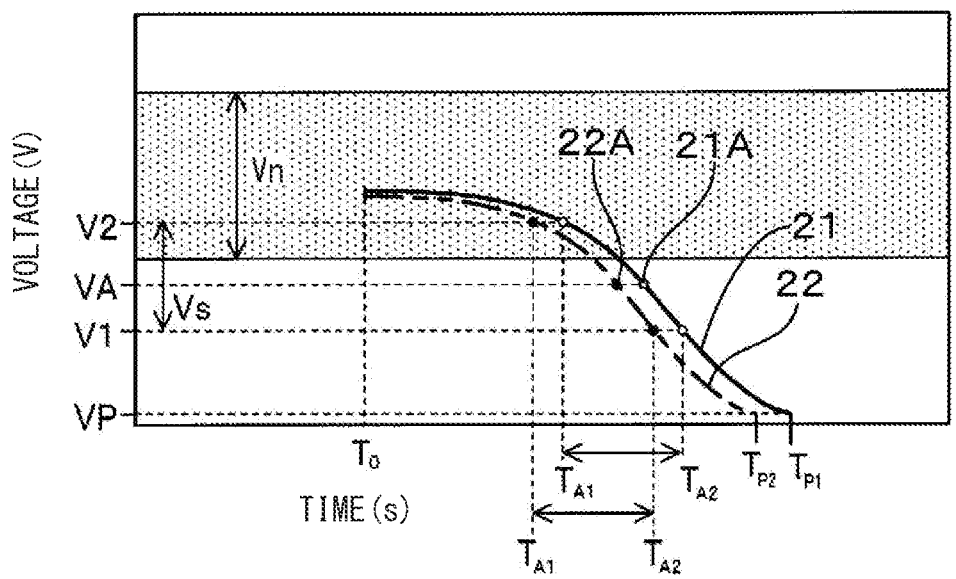
FIG. 3 is a conceptual diagram showing a battery characteristic in the embodiment 1.

In the present embodiment 1, the discharging voltage characteristic is used as the battery characteristic. As shown in FIG. 3, the discharging voltage characteristic is calculated based on the voltage transition when the secondary battery 2 is discharged to a discharging target voltage VP. The discharging target voltage VP is not particularly limited, but can be a voltage equal to or lower than the lower limit value in a normal use range Vn for the voltage value of the secondary battery 2.

The voltage transition, for example, can be calculated based on at least one of the section capacity of the secondary battery 2 in the predetermined voltage section Vs, the ratio of the voltage change of the secondary battery 2 with respect to the capacity change of the secondary battery 2 in the predetermined voltage section Vs, and the ratio of the voltage change of the secondary battery 2 with respect to the elapsed time in the predetermined voltage section Vs.

The predetermined voltage section Vs can be a voltage section in which the deterioration degree of the secondary battery 2 and the transition of the battery state show a correlation. Such the voltage section Vs can be set based on the type and configuration of the secondary battery 2, or can be derived by machine learning using the secondary battery 2. For example, in the present embodiment 1, as shown in FIG. 3, the predetermined voltage section Vs is a section from a voltage value V1 to a voltage value V2. The voltage section Vs is a section in which the difference in the discharging voltage characteristic is remarkable according to the deterioration degree of the secondary battery 2.

In the present embodiment 1, the capacity estimation unit 64 shown in FIG. 1 is provided as an estimation unit. In the present embodiment 1, the capacity estimation unit 64 estimates the total capacity of the secondary battery 2 for which the deterioration degree determination is determined to be feasible by the feasibility determination unit 62 based on the battery characteristic acquired by the battery characteristic acquisition unit 63. For the estimation of the total capacity, a prediction model such as a regression formula created based on the training data acquired in advance can be used, and for example, linear regression, Lasso regression, Ridge regression, decision tree, and support vector regression can be used.

The deterioration degree determination unit 65 shown in FIG. 1 determines the deterioration degree of the secondary battery 2 based on the battery characteristic or the battery characteristic relationship value. The battery characteristic relationship value is a value calculated based on the battery characteristic, and in the present embodiment 1, the estimation result of the capacity estimation unit 64 is adopted as the battery characteristic relationship value. Therefore, in the present embodiment 1, the deterioration degree determination unit 65 determines the deterioration degree of the secondary battery 2 based on the estimation result of the capacity estimation unit 64. The determination method can be performed by comparing the estimation result of the capacity estimation unit 64 with the estimation formula stored in advance in the estimation formula memory unit 52.

The update unit 8 shown in FIG. 1 is configured with a predetermined arithmetic device and includes an estimation formula update unit 81. The estimation formula update unit 81 updates the battery characteristic acquisition reference, that is, the feasibility determination reference and the estimation formula stored in the estimation formula memory unit 52. The corresponding update can be performed by, with respect to the secondary battery for which the determination of the deterioration degree is determined to be infeasible by the feasibility determination unit 62 described above, acquiring the measured value of the total capacity by charging and discharging the corresponding secondary battery by the charging and discharging control unit 71, acquiring the capacity battery characteristic by the battery characteristic acquisition unit 63 based on the measured values of the total capacity, and updating the feasibility determination reference and the estimation formula stored in the estimation formula memory unit 52 with the measured value as additional training data. Accordingly, the determination reference can be updated according to the change over time of the secondary battery, and thus high determination accuracy can be maintained. The timing at which the estimation formula update unit 81 performs the update is not limited, and may be when the capacity battery characteristic is acquired, may be when the number of data of the capacity battery characteristic reaches a predetermined number, and may be after a predetermined time has elapsed from the previous update timing, or the update timing may be determined by combining the above-mentioned.

The communication unit 10 shown in FIG. 1 is configured with an arithmetic device capable of transmitting and receiving data by connecting to the communication network 200 by wire or wirelessly, and includes a transmission unit 11 and a receiving unit 12. Based on the determination result of the feasibility determination unit 62, the transmission unit 11 transmits instruction information indicating the acquisition of the capacity battery characteristic of the secondary battery 2 to the external terminal 9 described later. The instruction information may be transmitted when the number of secondary batteries 2, for which the feasibility determination unit 62 determines that it is necessary to acquire the capacity battery characteristic, reaches a predetermined number. In the present embodiment 1, the receiving unit 12 receives the measured value of the capacity as the acquired information acquired by the external terminal 9 that has received the instruction information, from the external terminal 9. The transmission unit 11 and the receiving unit 12 may be capable of transmitting and receiving all information between the server 1 and the external terminal 9.

Next, the external terminal 9 will be described. As shown in FIG. 1, in the present embodiment 1, the external terminal 9 includes a detection unit 3, a storage unit 4, a control unit 7, a communication unit 90, and a display unit 93.

The detection unit 3 shown in FIG. 1 includes a voltage value detection unit 31 and a current value detection unit 32. The voltage value detection unit 31 is configured with a predetermined voltmeter and detects the voltage values of the secondary batteries 21 to 26. The current value detection unit 32 is configured with a predetermined ammeter and detects the current value flowing through the secondary batteries 21 to 26. The open circuit voltage of the secondary batteries 21 to 26 is configured to be acquired based on the voltage value detected by the voltage value detection unit 31.

The storage unit 4 shown in FIG. 1 is configured with a rewritable non-volatile memory, and includes a voltage value storage unit 41 and a current value storage unit 42. The voltage value storage unit 41 stores the voltage value detected by the voltage value detection unit 31, and the current value storage unit 42 stores the current value detected by the current value detection unit 32.

The control unit 7 shown in FIG. 1 includes a charging and discharging control unit 71. The charging and discharging control unit 71 controls to charge and discharge the secondary battery 2. The charging and discharging control unit 71 is configured with an arithmetic device capable of executing a predetermined program. The "charging and discharging" by the charging and discharging control unit 71 includes any of a case of only charging, a case of only discharging, a case of discharging and then charging, and a case of charging and then discharging.

The communication unit 90 shown in FIG. 1 is configured with an arithmetic device capable of transmitting and receiving data by connecting to the communication network 200 by wire or wirelessly, and includes a transmission unit 91 and a receiving unit 92. The transmission unit 91 and the receiving unit 92 can transmit and receive all information between the external terminal 9 and the server 1. In the present embodiment 1, the transmission unit 91 can transmit each value detected by the detection unit 3 of the external terminal 9 to the server 1, and the receiving unit 12 can receive the reference value, the deterioration degree determination result, the update information, and the like from the server 1.

The display unit 93 shown in FIG. 1 is configured to be able to display various types of information. In the present embodiment 1, the deterioration degree determination result, the update information, and the like can be displayed.

The flow of a method for determining the deterioration degree by the deterioration degree determination system 100 of the present embodiment 1 will be described below.

Figure 2:
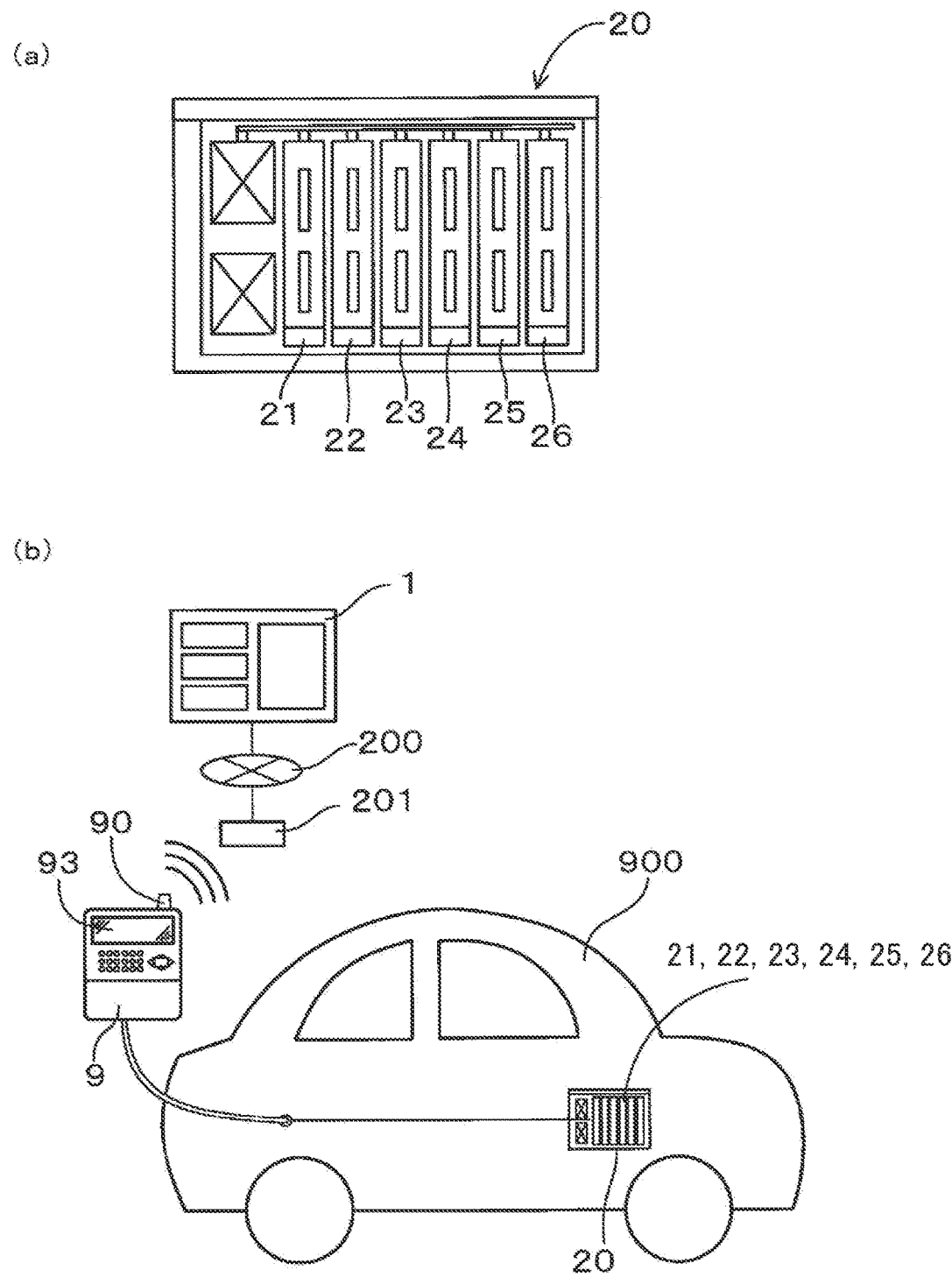
FIG. 2 is a conceptual diagram showing a configuration of a battery pack and a conceptual diagram of a vehicle mounted with the battery pack in the embodiment 1.
Figure 5:
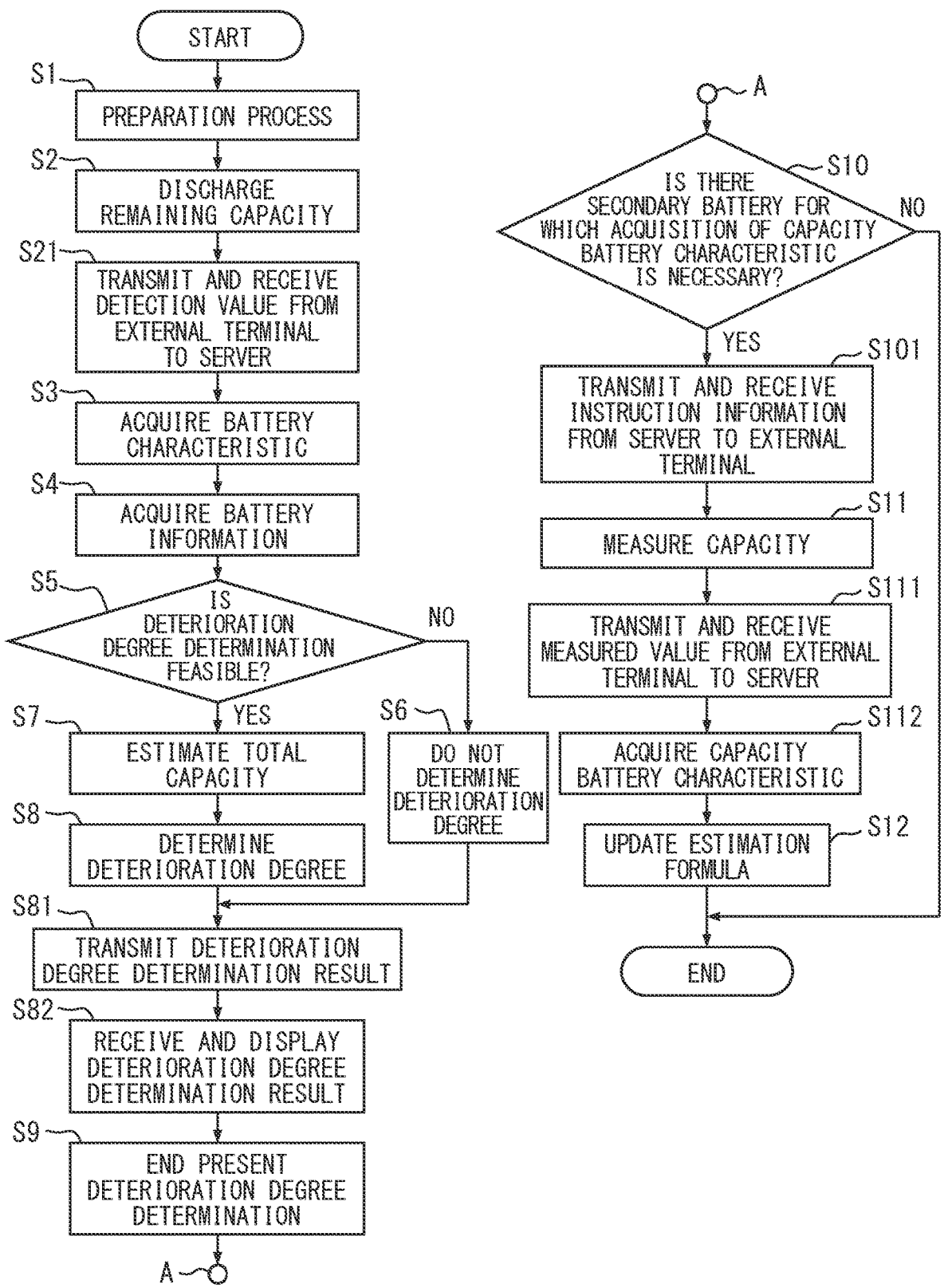
FIG. 5 is a flowchart showing a method for determining a deterioration degree of a secondary battery in the embodiment 1.

First, in a step S1 shown in FIG. 5, as a preparation process, the secondary batteries 21 to 26 in the form of a module are taken out from the used battery pack 20 shown in (a) in FIG. 2 at the base sales office having the external terminal 9. In a step S2, the charging and discharging control unit 71 uses the external terminal 9 to individually discharge the remaining capacity of the secondary batteries 21 to 26. As shown in FIG. 3, the discharging continues until the open circuit voltage reaches the predetermined discharging target voltage VP. When the secondary batteries 21 to 26 are nickel-metal hydride batteries, a memory effect may occur in the corresponding secondary batteries 21 to 26, but the cancellation of the memory effect is also performed at the same time for one, which is discharged down to the discharging target voltage VP or to a voltage close to the discharging target voltage VP, among the secondary batteries 21 to 26.

In the step S2 shown in FIG. 5, the detection unit 3 detects the voltage value and the current value in discharging together with the discharging of the remaining capacity, and in a step S21, the transmission unit 91 of the external terminal 9 transmits the detection value to the server 1, and the receiving unit 12 of the server 1 receives the detection value.

Thereafter, in a step S3 shown in FIG. 5, the battery characteristic acquisition unit 63 of the server 1 acquires the battery characteristic of each of the secondary batteries 21 to 26. In the present embodiment 1, the above-mentioned discharging voltage characteristic is acquired as the battery characteristic. As described above, the discharging voltage characteristic is based on the voltage transition in the predetermined voltage section Vs of each of the secondary batteries 21 to 26 shown in FIG. 3.

In the present embodiment 1, as shown in FIG. 3, with respect to the first secondary battery 21, the battery characteristic acquisition unit 63 acquires the voltage temporal change that indicates the relationship of the voltage change with respect to the passage of time from a discharging start $T_0$ to a discharging end $T_{P1}$ as the voltage transition. The differential value in a voltage VA within the predetermined voltage section Vs, that is, the slope of the tangent line at the voltage VA indicated by a reference numeral 21A in the graph of the voltage temporal change shown in FIG. 3 is calculated, and is used as the discharging voltage characteristic of the first secondary battery 21. As shown in FIG. 3, for the second secondary battery 22, the voltage temporal change is also acquired in the same manner as the voltage transition, and the differential value at the voltage VA within the predetermined voltage section Vs indicated by a reference numeral 22A is calculated and is used as the discharging voltage characteristic of the second secondary battery 22. Similarly, for the third to sixth secondary batteries 23 to 26, the voltage temporal change is acquired as the voltage transition, and the differential value at the voltage VA is calculated to be used as the respective discharging voltage characteristics.

In the present embodiment 1, as the discharging voltage characteristic, the voltage temporal change is acquired as the voltage transition to use the differential value in the voltage VA within the predetermined voltage section Vs, but instead of the above-mentioned, the ratio of the voltage change between the two points in the voltage temporal change derived as the voltage transition, that is, the slope of the straight line passing through the corresponding two points in the graph of the voltage temporal change may be calculated and used as the discharging voltage characteristic. For example, as two points in the voltage temporal change of the first secondary battery 21 shown in FIG. 3, two points of start time $T_{A1}$ and end time $T_{A2}$ of the voltage section Vs can be adopted, and the same two points can also be adopted in the other secondary batteries 22 to 26.

In a step S4 of FIG. 5, the battery information acquisition unit 61 of the server 1 acquires the battery characteristic acquired by the battery characteristic acquisition unit 63 as battery information. Thereafter, in a step S5, the feasibility determination unit 62 determines the feasibility of the determination of the deterioration degree. Specifically, the feasibility determination unit 62 determines the feasibility of the determination of the deterioration degree based on whether the distance between the data of the feasibility determination reference stored in the estimation formula memory unit 52 and the battery information relationship value calculated from the acquired battery information is within a predetermined range, that is, whether the corresponding battery information relationship value is within the feasibility determination reference shown in FIG. 4.

When the acquired battery information is not within the feasibility determination reference, the feasibility determination unit 62 determines that the determination of the deterioration degree is not feasible, and proceeds to No in the step S5 shown in FIG. 5. In a step S6, among the secondary batteries 21 to 26, with respect to one for which the determination of the deterioration degree is infeasible, the process proceeds to a step S9 described later without determining the deterioration degree.

On the other hand, in the step S5 shown in FIG. 5, when the acquired battery information is within the feasibility determination reference, the feasibility determination unit 62 determines that the determination of the deterioration degree is feasible, and proceeds to Yes in the step S5. In a step S7, the capacity estimation unit 64 estimates the total capacity for, among the secondary batteries 21 to 26, one for which the determination of the deterioration degree is determined to be feasible based on the battery characteristic acquired by the battery characteristic acquisition unit 63. In the present embodiment 1, the capacity estimation unit 64 estimates the total capacity of the secondary batteries 21 to 26 from the discharging voltage characteristic acquired by the battery characteristic acquisition unit 63 as the battery characteristic, based on the correspondence relationship between the total capacity and the discharging voltage characteristic based on the prediction model stored in the correspondence relationship memory unit 51.

Thereafter, in a step S8 shown in FIG. 5, the deterioration degree determination unit 65 determines the deterioration degree of the secondary batteries 21 to 26 based on the total capacity estimated by the capacity estimation unit 64. In a step S81, the transmission unit 11 of the server 1 transmits the deterioration degree determination result to the external terminal 9. The process proceeds to a step S82, and the deterioration degree determination result is received by the receiving unit 92 of the external terminal 9 and displayed on the display unit 93. The process proceeds to the step S9, and the present deterioration degree determination is ended.

Thereafter, the process proceeds to the symbol A shown in FIG. 5, and in a step S10, the necessity determination unit 60 determines the necessity of acquiring the capacity battery characteristic. In the present embodiment 1, the acquisition of the capacity battery characteristic is determined to be necessary for the secondary battery for which the determination of the deterioration degree is determined to be infeasible by the feasibility determination unit 62 in the step S5, and the acquisition of the capacity battery characteristic is determined to be unnecessary for the secondary battery for which the determination of the deterioration degree is determined to be feasible. When in the step S10, determination is made that there is no secondary battery for which the acquisition of the capacity battery characteristic is determined to be necessary, the process proceeds to No in the step S10, and the control flow is ended. On the other hand, when in the step S10, determination is made that there is a secondary battery for which the acquisition of the capacity battery characteristic is determined to be necessary, the process proceeds to Yes in the step S10.

Thereafter, the process proceeds to a step S101 shown in FIG. 5, and the transmission unit 11 of the server 1 transmits the instruction information, which indicates the acquisition of the capacity battery characteristic of the secondary battery 2 for which the acquisition of the capacity battery characteristic is determined to be necessary, to the external terminal 9, and the receiving unit 92 of the external terminal 9 receives the corresponding instruction information.

Thereafter, in a step S11 shown in FIG. 5, the charging and discharging control unit 71 charges and discharges the secondary battery 2 for which the acquisition of the capacity battery characteristic is determined to be necessary based on the above instruction information, and the capacity is measured and the measured value is acquired. After the measurement, in a step S111, the transmission unit 91 of the external terminal 9 transmits the measured value to the server 1, and the receiving unit 12 of the server 1 receives the corresponding measured value. In a step S112, the battery characteristic acquisition unit 63 acquires the capacity battery characteristic based on the measured value, and in a step S12, the estimation formula update unit 81 updates the estimation formula stored in the estimation formula memory unit 52 with the corresponding capacity battery characteristic as additional training data. In the present embodiment 1, the feasibility determination reference, that is, the battery characteristic acquisition reference is also updated. Both of the corresponding reference values will be used for the deterioration degree determination from the next time onward.

Next, a method for manufacturing a rebuilt product by using and assembling the secondary battery 2 forming the module taken out from the used battery pack 20 into the new battery pack 20 will be described below.

Figure 6:
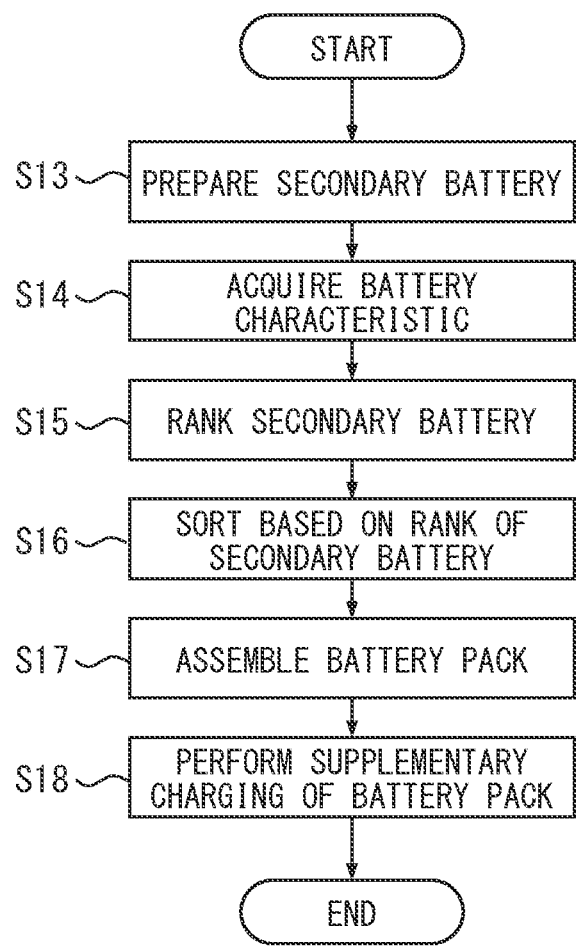
FIG. 6 is a flowchart showing a method for manufacturing the battery pack in the embodiment 1.

First, in a step S13 shown in FIG. 6, multiple secondary batteries 2 taken out from the battery pack 20 are prepared. In a step S14, the battery characteristic of each of the secondary batteries 2 is acquired. The acquisition of the corresponding battery characteristic can be performed as in the case of acquiring the battery characteristic in the deterioration degree determination system 100 of the present embodiment 1. Thereafter, in a step S15, the secondary battery 2 is ranked based on the corresponding battery characteristic or the battery characteristic relationship value calculated based on the corresponding battery characteristic. In the present embodiment 1, the total capacity of the secondary battery 2 is estimated based on the battery characteristic as the battery characteristic relationship value, and the secondary battery 2 is ranked based on whether the absolute value of the deterioration degree of the secondary battery 2 calculated from the corresponding total capacity is within a predetermined range. In the present embodiment 1, the absolute value of the deterioration degree is divided into a predetermined range of five stages, and the ranks are A, B, C, D, and E in order from the one with the smallest absolute value of the deterioration degree. The ranking criteria can be set as appropriate.

Next, in a step S16 shown in FIG. 6, the secondary batteries 21 to 26 are selected based on the rank. In the present embodiment 1, sorting is performed for each rank. Accordingly, the secondary batteries 2 included in the same rank have the same deterioration degree. In a step S17, the secondary batteries 2 of the same rank are combined to assemble the battery pack 20 to create a rebuilt product. Accordingly, the secondary battery 2 included in the battery pack 20 of a rebuilt product has the same absolute value of the deterioration degree, and the difference in the deterioration degree can be set to a predetermined reference value or less. The reference value for the difference in the deterioration degree can be appropriately set according to the ranking reference. In the present embodiment 1, the battery pack 20 is created of the secondary batteries 2 of the same rank, but is not limited thereto, and the battery pack 20 may be created within a predetermined range of ranks, for example, the battery pack 20 may be created from the secondary batteries 2 included in the A rank and the B rank. The secondary battery 2 ranked at the lowest rank E may be discarded as unusable, or may be disassembled and used for recycling of members.

Thereafter, in the present embodiment 1, in step S18 shown in FIG. 6, supplementary charging is performed in units of the battery pack 20. Accordingly, the secondary batteries 21 to 26 can be used as the battery pack 20.

Next, the operation effect of the deterioration degree determination system 100 and the server 1 of the present embodiment 1 will be described in detail. In the server 1 for the deterioration degree determination system for the secondary battery of the present embodiment 1, the estimation formula for determining the deterioration degree is configured to be updated based on the capacity battery characteristic related to the transition of the battery state in the secondary battery 2 acquired by discharging the secondary battery 2. Accordingly, the estimation formula follows the tendency of deterioration of the secondary battery 2 that changes with time, such that the deterioration degree of the secondary battery can be determined with high accuracy.

In the present embodiment 1, in the server 1, the estimation formula memory unit 52 stores the battery characteristic acquisition reference that is the reference of the necessity determination of acquiring the capacity battery characteristic in the secondary battery 2 prepared in advance. The server 1 incudes the necessity determination unit 60 that determines the necessity of acquiring the capacity battery characteristic for each secondary battery 2 based on the comparison result between the battery information including the information related to the secondary battery 2 and the battery characteristic acquisition reference, the transmission unit 11 that transmits the instruction information indicating the acquisition of the capacity battery characteristic of the secondary battery 2 to the external terminal based on the determination result of the necessity determination unit 60, and the receiving unit 12 that receives the measured value of the capacity as the acquired information acquired by the external terminal 9 that has received the corresponding instruction information, from the external terminal 9. The update unit 8 updates the estimation formula by using the capacity battery characteristic based on the measured value received by the receiving unit 12. Accordingly, in the server 1, the necessity determination of acquiring the capacity battery characteristic of the secondary battery 2 is performed, and then the estimation formula can be updated by using the capacity battery characteristic, such that the determination of the deterioration degree of the secondary battery is feasible with high accuracy.

In the present embodiment 1, the update unit 8 is configured to update the battery characteristic acquisition reference by using the capacity battery characteristic based on the measured value received by the receiving unit 12. Accordingly, the battery characteristic acquisition reference can be made to follow the tendency of the deterioration of the secondary battery 2 that changes with time, and the deterioration degree of the secondary battery can be determined with high accuracy.

In the present embodiment 1, the necessity determination unit 60 determines the feasibility of the deterioration degree determination of the secondary battery 2 based on the battery characteristic acquisition reference, and it is defined to determine that the acquisition of the capacity battery characteristic of the secondary battery for which the deterioration degree determination is determined to be infeasible is necessary. Accordingly, the estimation formula can be updated by acquiring the capacity battery characteristic of the secondary battery for which the deterioration degree determination is determined to be infeasible, and the determination of the deterioration degree of the secondary battery is feasible with high accuracy.

Figure 7:
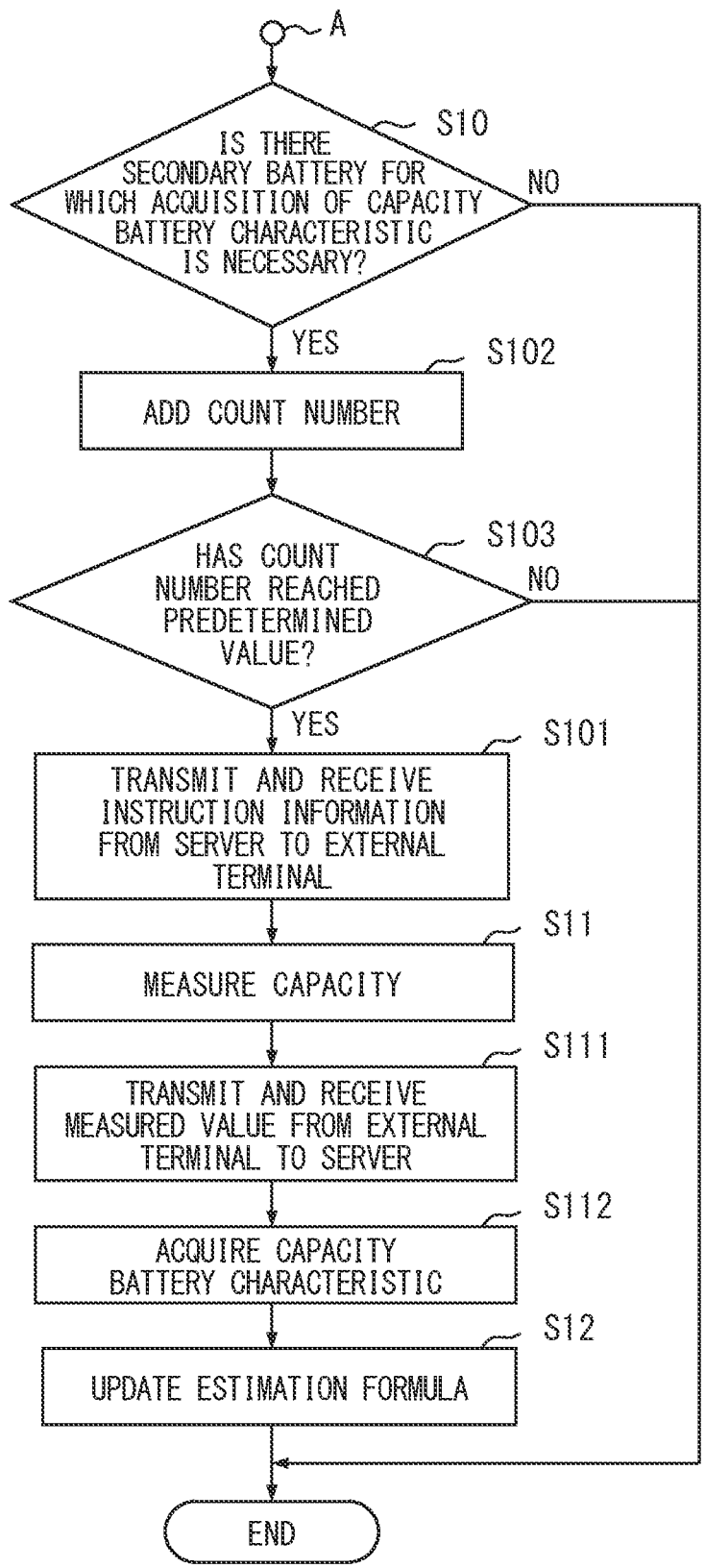
FIG. 7 is a flowchart showing a method for determining a deterioration degree of a secondary battery in a modified embodiment 1.

In the present embodiment 1, the transmission unit 11 of the server 1 transmits the above instruction information each time the necessity determination unit 60 determines that acquisition of the capacity battery characteristic is necessary, but instead of the above-mentioned, in a modified embodiment 1, as shown in FIG. 7, when determination is made in the step S10 that there is a secondary battery for which the acquisition of the capacity battery characteristic is determined to be necessary, the process proceeds from Yes in the step S10 to a step S102, and the count number of a counter (not shown) provided in the server 1 is increased. When determination is made in a step S103 that the count number has not reached a predetermined value, the process proceeds to No in the step S103, and the transmission unit 11 does not transmit the instruction information to the external terminal 9 and the flow is ended. On the other hand, when determination is made in the step S103 that the count number has reached a predetermined value, the transmission unit 11 proceeds from Yes in the step S103 to the step S101, and the step S101 and subsequent steps are performed as in the case of the present embodiment 1.

According to the modified embodiment 1, when the number of secondary batteries 2, for which the necessity determination unit 60 determines that it is necessary to acquire the capacity battery characteristic, reaches a predetermined number, the transmission unit 11 of the server 1 transmits the above-mentioned instruction information. Accordingly, it is possible to restrict the update frequency of the estimation formula from becoming excessively high and update the estimation formula at an appropriate frequency, and it is possible to restrict the calculation load of the server 1 from becoming excessively large while the high determination accuracy of the deterioration degree is maintained.

Figure 8:
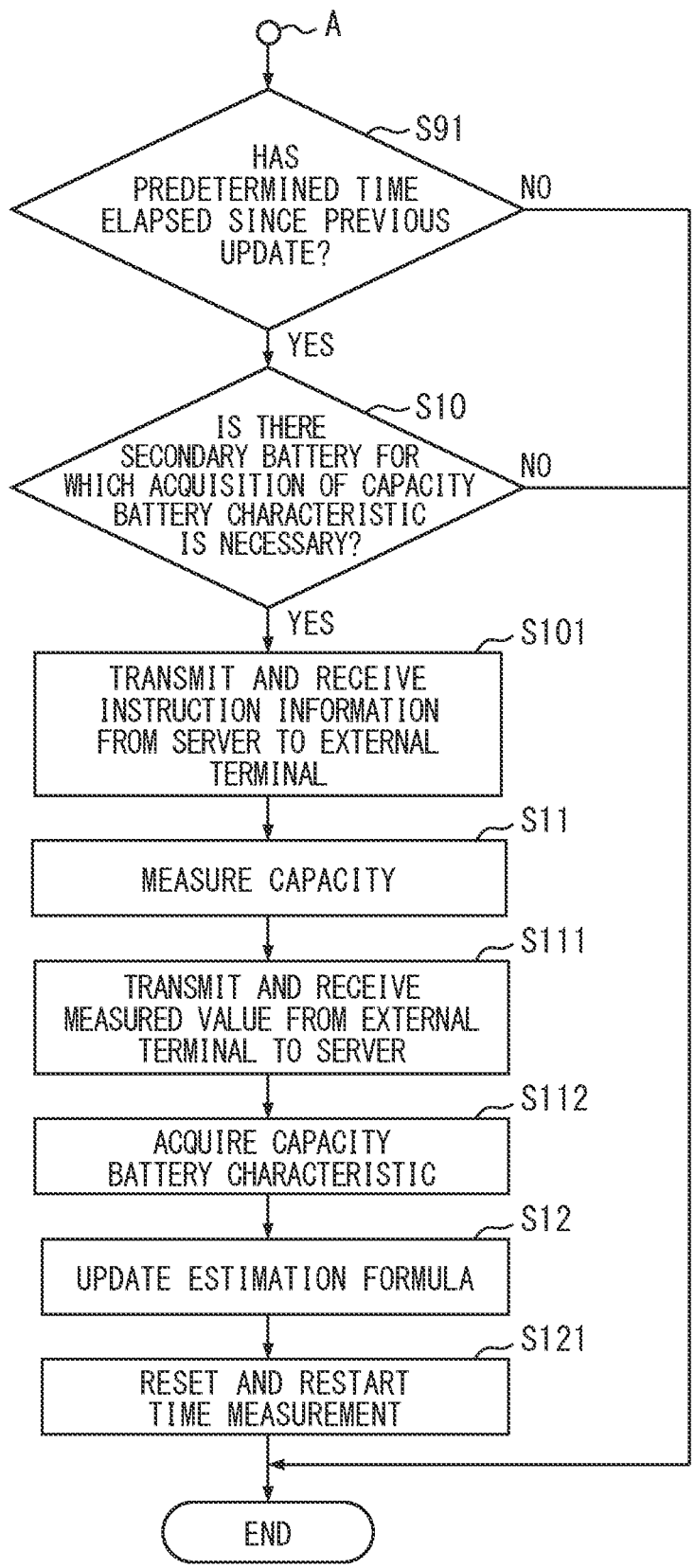
FIG. 8 is a flowchart showing a method for determining a deterioration degree of a secondary battery in a modified embodiment 2.

Instead of the counter of the modified embodiment 1, the server 1 may have a time measuring unit (not shown) in a modified embodiment 2. In the modified embodiment 2, the time measuring unit starts time measurement at the time point of updating. In the control flow in the modified embodiment 2, as shown in FIG. 8, the process proceeds from the symbol A to a step S91, and the time measuring unit of the server 1 determines whether a predetermined time has elapsed after the previous update. When determination is made that the predetermined time has not elapsed, the process proceeds to No in the step S91, and the flow is ended without determining the necessity of acquiring the capacity battery characteristic. On the other hand, when determination is made in the step S91 that the predetermined time has elapsed, the process proceeds from Yes in the step S91 to the step S10, and the steps S10 and subsequent steps are performed as in the case of the present embodiment 1. After the step S12, the time measurement in the time measuring unit is reset and restarted in a step S121.

According to the modified embodiment 2, the necessity determination unit 60 determines the necessity of acquiring the capacity battery characteristic when a predetermined time has elapsed from the previous update performed by the update unit 8. Accordingly, it is possible to restrict the update frequency of the estimation formula from becoming excessively high and update the estimation formula at an appropriate frequency, and it is possible to restrict the calculation load of the server 1 from becoming excessively large while the high determination accuracy of the deterioration degree is maintained.

In the present embodiment 1, the server 1 further includes a deterioration degree determination unit that compares the estimation formula with the battery characteristic or the battery characteristic relationship value and determines the deterioration degree of the secondary battery based on the comparison result, and the transmission unit 11 of the server 1 transmits the determination result by the deterioration degree determination unit to the external terminal. Accordingly, the calculation load on the external terminal 9 can be reduced, and the processing capacity required for the external terminal 9 can be reduced. Accordingly, the miniaturization and the manufacturing cost reduction of the external terminal 9 are attempted, which contributes to the construction of the deterioration degree determination system 100 using a large number of external terminals 9.

In the deterioration degree determination system 100 of the present embodiment 1, the deterioration degree of the secondary battery is determined based on the battery characteristic or the battery characteristic relationship value related to the voltage transition in the predetermined voltage section acquired from the secondary battery 2. Therefore, the deterioration degree can be determined by a simple process. By setting a voltage section that shows a high correlation between the voltage transition of the secondary battery 2 and the deterioration degree as the voltage section to acquire the battery characteristic of the secondary battery 2, the deterioration degree of the secondary battery 2 can be determined in high accuracy. Before performing the determination of the deterioration degree of the secondary battery 2, determination is made on whether the determination of the deterioration degree is feasible for each secondary battery 2, and then the determination of the deterioration degree is performed for the secondary battery 2 for which the determination of the deterioration degree is determined to be feasible. Therefore, the determination accuracy can be improved as a whole by performing the determination of the deterioration degree for the secondary battery 2 in which determination accuracy can be sufficiently ensured.

In the deterioration degree determination system 100 of the present embodiment 1, the feasibility determination unit 62 performs the feasibility determination based on a comparison result between the battery information relationship value calculated from the battery information acquired by the battery information acquisition unit 61 and the feasibility determination reference, by using the preset relational expression related to multiple battery information. Accordingly, the determination accuracy can be improved by appropriately adjusting the relational expression.

According to the deterioration degree determination system 100 of the present embodiment 1, the battery pack 20 includes the multiple secondary batteries 2 having a usage history, and it is possible to provide the battery pack in which the battery characteristic related to the transition of the battery state of the predetermined voltage section Vs in the secondary battery 2 or the battery characteristic relationship value calculated based on the battery characteristic is within a predetermined range. In the battery pack as a rebuilt product, the battery pack 20 having a small variation in battery characteristics can be provided. As the voltage section Vs for acquiring the battery characteristic of the secondary battery 2, by setting the voltage section Vs showing a high correlation between the voltage transition of the secondary battery 2 and the deterioration degree, the variation in the deterioration degree of the secondary battery 2 included in the battery pack 20 becomes small, and thus the life extension and the quality improvement of the battery pack 20 can be attempted.

In the present embodiment 1, the capacity estimation unit 64 estimates the total capacity of the secondary batteries 21 to 26 from the battery characteristic acquired by the battery characteristic acquisition unit 63, and the deterioration degree determination unit 65 determines the deterioration degree of the secondary batteries 21 to 26 based on the corresponding estimation result, but instead of the above-mentioned, the total capacity based on the battery characteristic acquired by the battery characteristic acquisition unit 63 may be not estimated, and the deterioration degree determination unit 65 may determine the deterioration degree of the secondary batteries 21 to 26. The battery characteristic acquisition unit 63 may acquire the absolute value of the acquired value as the battery characteristic, and the deterioration degree determination unit 65 may determine the deterioration degree based on the corresponding absolute value. The deterioration degree determination unit 65 may determine the deterioration degree of the secondary batteries 21 to 26 based on the difference in the battery characteristic acquired by the battery characteristic acquisition unit 63.

In the present embodiment 1, the battery pack 20 is assembled by classifying the secondary batteries 21 to 26 into classes such that the deterioration degree of the secondary batteries 21 to 26 is within a predetermined range, but the battery pack 20 may be assembled by classifying the secondary batteries 21 to 26 into classes such that the difference between the deterioration degree and the deterioration degree of the secondary batteries 21 to 26 is within a predetermined range.

In the present embodiment 1, the battery characteristic is the discharging voltage characteristic based on the voltage transition in the predetermined voltage sections Vs1 and Vs2 in the secondary batteries 21 to 26. When the secondary batteries 21 to 26 are nickel-metal hydride batteries, at the time of reusing the used secondary batteries 21 to 26, the used secondary batteries 21 to 26 may be discharged for the purpose of canceling the memory effect, and by acquiring the discharging voltage characteristic during the discharging, the work process for reusing the secondary batteries 21 to 26 can be simplified.

Figure 9:
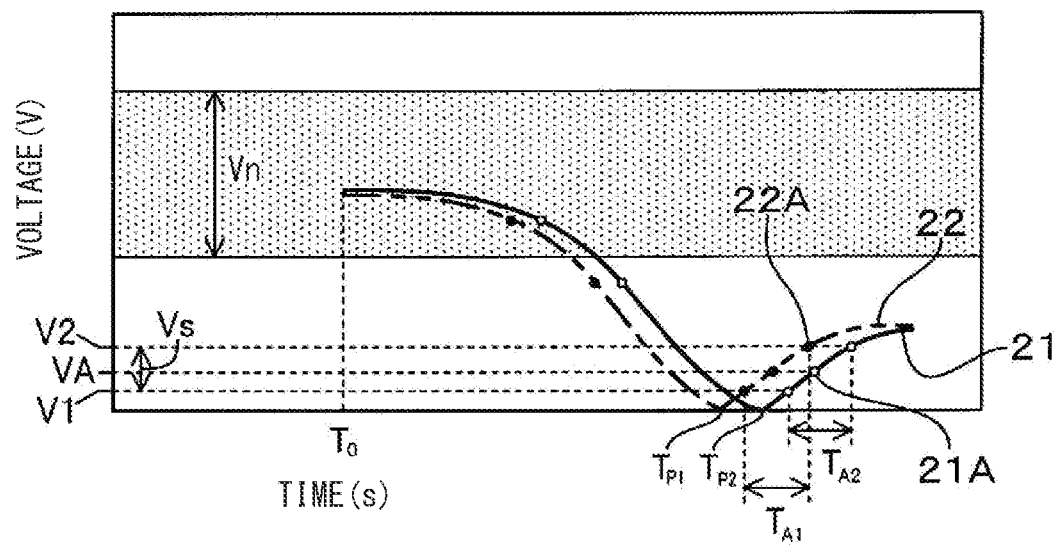
FIG. 9 is a conceptual diagram showing a battery characteristic in a modified embodiment 3.

In the present embodiment 1, the discharging voltage characteristic is calculated based on the voltage transition during the discharging of the secondary battery 2, but instead of or together with the above-mentioned, the discharging voltage characteristic may be calculated based on the voltage transition during the voltage relaxation in which the open circuit voltage is returned after discharging is performed to reach the discharging target voltage VP and the discharging is stopped. For example, as in a modified embodiment 3 shown in FIG. 9, in the first secondary battery 21, based on the voltage transition in the predetermined voltage section Vs in the voltage relaxation after the time $T_{P1}$ at which discharging is stopped after the discharging is performed to reach the discharging target voltage VP, the differential value at the predetermined voltage VA indicated by the reference numeral 21A can be calculated and used as the discharging voltage characteristic. Similarly, in the second secondary battery 22, based on the voltage transition in the predetermined voltage section Vs in the voltage relaxation after time $T_{P2}$ at which the discharging is stopped, the differential value at the predetermined voltage VA indicated by the reference numeral 22A can be calculated and be used as the discharging voltage characteristic, and also similarly for the other secondary batteries 23 to 26 (not shown), the discharging voltage characteristic can be acquired based on the voltage transition in the predetermined voltage section Vs in the voltage relaxation. Also in this case, the same operation effect as the operation effect of the present embodiment 1 is obtained.

In the present embodiment 1, the capacity estimation unit 64 that estimates the total capacity of the secondary battery by using the battery characteristic acquired by the battery characteristic acquisition unit 63 as the battery characteristic relationship value, is provided, and the deterioration degree determination unit 65 determines the deterioration degree of the secondary batteries 21 to 26 based on the estimation result of the capacity estimation unit 64. Accordingly, the deterioration degree of the secondary batteries 21 to 26 can be detected with high accuracy.

In the present embodiment 1, as the voltage transition, the ratio of the voltage change of the secondary battery 2 to the elapsed time in the predetermined voltage section Vs, that is, the differential value in the voltage temporal change is calculated, and is used as the discharging voltage characteristic. Accordingly, the deterioration degree of the secondary battery 2 can be determined with high accuracy and easily.

Figure 10:
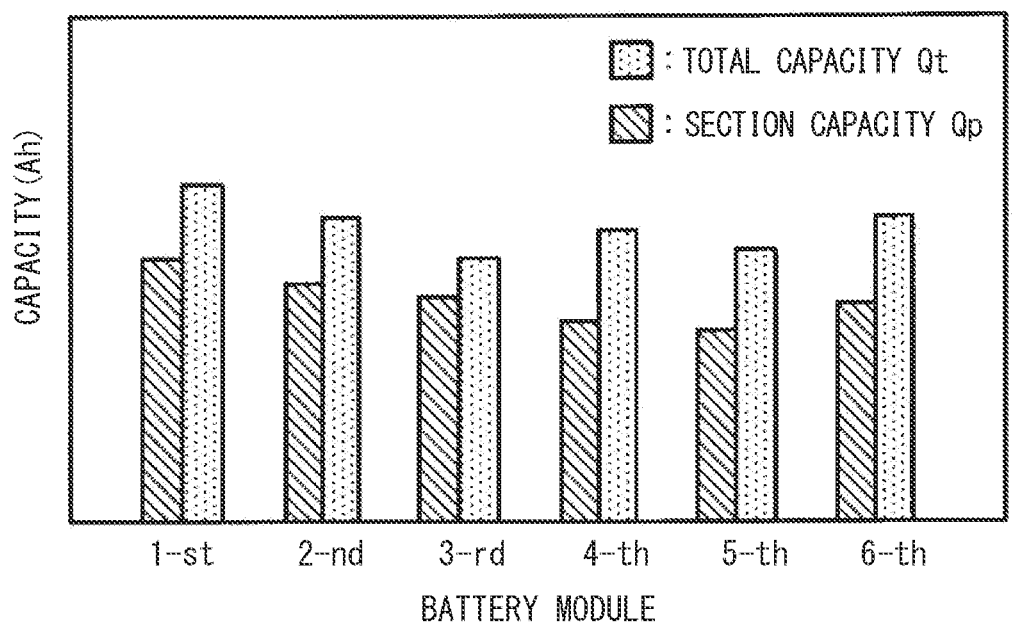
FIG. 10 is a conceptual diagram showing a battery characteristic in a modified embodiment 4.

The battery characteristic acquisition unit 63 may replace calculating the ratio of the voltage change of the secondary battery 2 to the elapsed time in the predetermined voltage section Vs as the voltage transition, or in addition to the above-mentioned, as in a modified embodiment 4 shown in FIG. 10, may calculate the capacity change amount of each of the secondary batteries 21 to 26 in the predetermined voltage section Vs as a section capacity Qp and use the section capacity Qp as the discharging voltage characteristic. The section capacity Qp can be calculated from the current value flowing through the secondary batteries 21 to 26 and the time during which the current flows in the voltage section Vs detected by the current value detection unit 32. Also in this case, the deterioration degree of the secondary battery 2 can be determined with high accuracy and easily based on the discharging voltage characteristic.

A total charging and discharging capacity Qt shown in FIG. 10 may be calculated as the capacity of all sections of discharging time $T_0$ to $T_{P1}$ and $T_0$ to $T_{P2}$ in each of the secondary batteries 21 to 26, and the capacity ratio, that is, the ratio of the section capacity Qp to the total charging and discharging capacity Qt may be calculated and be used as the discharging voltage characteristic. Instead of the total charging and discharging capacity Qt, a specific section capacity Qt' that is the capacity of the specific voltage section including the voltage section for calculating the battery characteristic may be calculated, and the capacity ratio that is a ratio of the section capacity Qp to the specific section capacity Qt' may be calculated and used as the discharging voltage characteristic. Also in this case, the deterioration degree of the secondary battery 2 can be determined with high accuracy and easily based on the discharging voltage characteristic.

Figure 11:
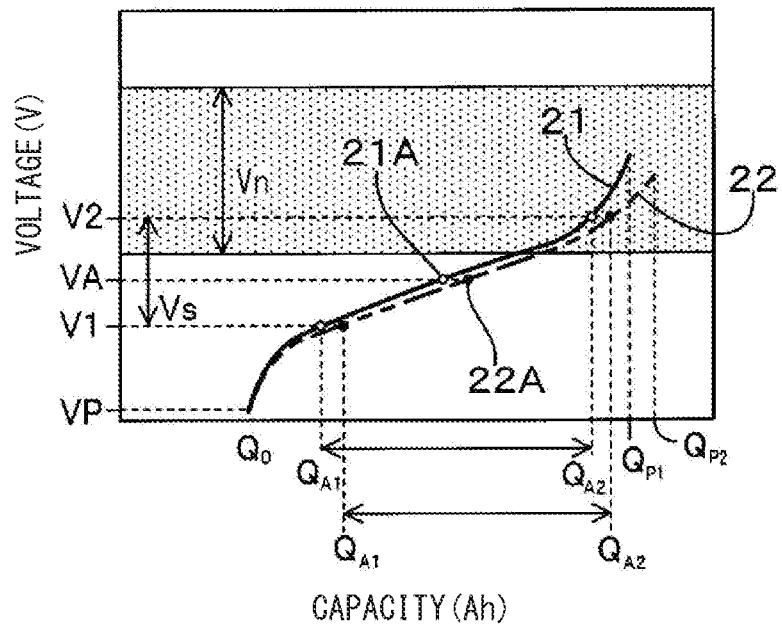
FIG. 11 is a conceptual diagram showing a battery characteristic in a modified embodiment 5.

In the present embodiment 1, as the discharging voltage characteristic, the voltage temporal change is acquired as the voltage transition to use the differential value in the voltage VA within the predetermined voltage section Vs, but instead of the above-mentioned, as in a modified embodiment 5 shown in FIG. 11, the voltage-capacity change indicating the relationship of the voltage change with respect to the capacity from a capacity $Q_0$ at the discharging start time to a capacity $Q_{p1}$ at the discharging end time as the voltage transition, may be acquired. The differential value in the voltage VA within the predetermined voltage section Vs, that is, the slope of the tangent line at the voltage VA in the graph of the voltage-capacity change may be calculated, and may be used as the discharging voltage characteristic of the first secondary battery 21. Also in this case, the same operation effect as the operation effect of the present embodiment 1 is obtained.

In the present embodiment 1, the battery characteristic acquisition unit 63 provided in the deterioration degree determination system 100 calculates the battery characteristic to acquire the battery characteristic, but instead of the above-mentioned, the deterioration degree determination system 100 may have an external input unit and calculate the battery characteristic by using an externally provided arithmetic device, such that by inputting the corresponding battery characteristic to the battery characteristic acquisition unit 63 via the external input unit, the battery characteristic acquisition unit 63 may acquire the battery characteristic.

Figure 12:
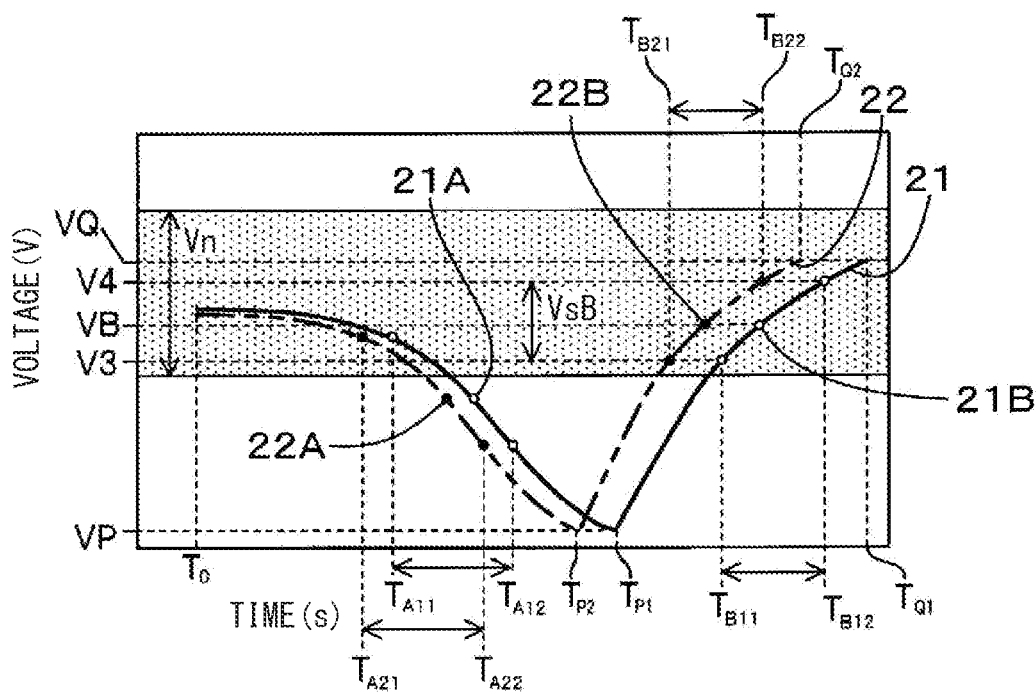
FIG. 12 is a conceptual diagram showing a battery characteristic in a modified embodiment 6.

In the present embodiment 1, the discharging voltage characteristic is adopted as the battery characteristic, but at the same time, as shown in a modified embodiment 6 shown in FIG. 12, the battery characteristic may include the charging voltage characteristic based on the voltage transition when the secondary batteries 21 to 26 are charged up to a predetermined charging target voltage VQ. The charging target voltage VQ is not particularly limited, but in the present embodiment 1, is set to be a value larger than the lower limit value of the normal use range Vn and smaller than the upper limit value thereof. The other configuration elements are the same as in the case of the embodiment 1.

In the present modified embodiment 6, the calculation of the voltage transition in charging can be performed in the same manner as the calculation of the voltage transition in the discharging voltage characteristic in the embodiment 1 and each modified embodiment, and the calculated result is used as the charging voltage characteristic. That is, as shown in FIG. 12, as the voltage transition, the voltage temporal change indicating the relationship of the voltage change with respect to the passage of time from the charging start, which are the discharging ends $T_{P1}$ and $T_{P2}$, to the charging ends $T_{Q1}$ and $T_{Q2}$ is acquired. The differential value in a voltage VB within a predetermined voltage section VsB, that is, the slope of the tangent line at the voltage VB indicated by a reference numeral 21B in the graph of the voltage temporal change shown in FIG. 12 is calculated, and is used as the charging voltage characteristic of the first secondary battery 21. As shown in FIG. 12, for the second secondary battery 22, the voltage temporal change is also acquired in the same manner as the voltage transition, and the differential value at the voltage VB within the predetermined voltage section Vs indicated by a reference numeral 22B is calculated and is used as the discharging voltage characteristic of the second secondary battery 22. Similarly, also for the third to sixth secondary batteries 23 to 26, the voltage temporal change is acquired as the voltage transition, and the differential value at the voltage VB is calculated to be used as the respective charging voltage characteristics. The predetermined voltage section VsB is a section from the voltage values V3 to V4, and is a section in which the difference in charging voltage characteristic is remarkable according to the deterioration degree of the secondary battery 2.

The charging voltage characteristic may be the ratio of the voltage change between two points of the start time TB11 and TB21 and the end time TB12 and TB22 of the predetermined voltage section VsB as in the case of calculating the discharging voltage characteristic in the above-described embodiment 1, may be the section capacity Qp in the voltage section VsB, or may be the capacity ratio of the section capacity Qp to the total charging and discharging capacity QT by calculating the capacity of all sections of charging time $T_{P1}$ to $T_{Q1}$ and $T_{P2}$ to $T_{Q2}$, that is, the total charging and discharging capacity QT when charging is performed to reach the charging target voltage VQ. Instead of the total charging and discharging capacity QT at the charging time up to the charging target voltage VQ, a specific section capacity QT' that is the capacity of the specific voltage section including the voltage section for calculating the battery characteristic may be calculated, and the capacity ratio of the section capacity Qp to the specific section capacity QT' may be calculated and used as the charging voltage characteristic.

In the present modified embodiment 6, the battery characteristic acquisition unit 63 acquires both the discharging voltage characteristic and the charging voltage characteristic, and the capacity estimation unit 64 estimates the total capacity of the secondary battery 2 based on the discharging voltage characteristic and the charging voltage characteristic. Accordingly the deterioration degree of the secondary battery 2 can be determined with higher accuracy.

When the battery pack 20 of a rebuilt product is manufactured by using the deterioration degree determination system 100 of the present modified embodiment 6, each of the secondary batteries 2 is charged before the battery pack 20 is assembled, and thus supplementary charging of the battery pack 20 in the step S18 in FIG. 6 becomes unnecessary.

In the present modified embodiment 6, the battery characteristic acquisition unit 63 acquires the charging voltage characteristic after acquiring the discharging voltage characteristic by discharging and then charging the secondary battery 2 but is not limited thereto, and may acquire the discharging voltage characteristic after acquiring the charging voltage characteristic by charging and then discharging the secondary battery.

In the present modified embodiment 6, the battery characteristic acquisition unit 63 acquires both the discharging voltage characteristic and the charging voltage characteristic, but instead of the above-mentioned, may acquire only the charging voltage characteristic. In this case, the determination accuracy may be inferior to the determination accuracy in the case of acquiring both the discharging voltage characteristic and the charging voltage characteristic. On the other hand, when the secondary batteries 21 to 26 are nickel-metal hydride batteries, a memory effect may occur, and when only the discharging voltage characteristic is acquired, in the discharging voltage characteristic, variation may occur in the voltage transition due to the influence of the memory effect, such that there is a concern that the improvement of the determination accuracy is restricted. However, when only the charging voltage characteristic, which is acquired after the remaining capacity is discharged, is acquired, the charging voltage characteristic is acquired after the cancellation of the memory effect is attempted, such that the influence of the memory effect is small, and the determination accuracy can be expected to be improved.

Figure 13:
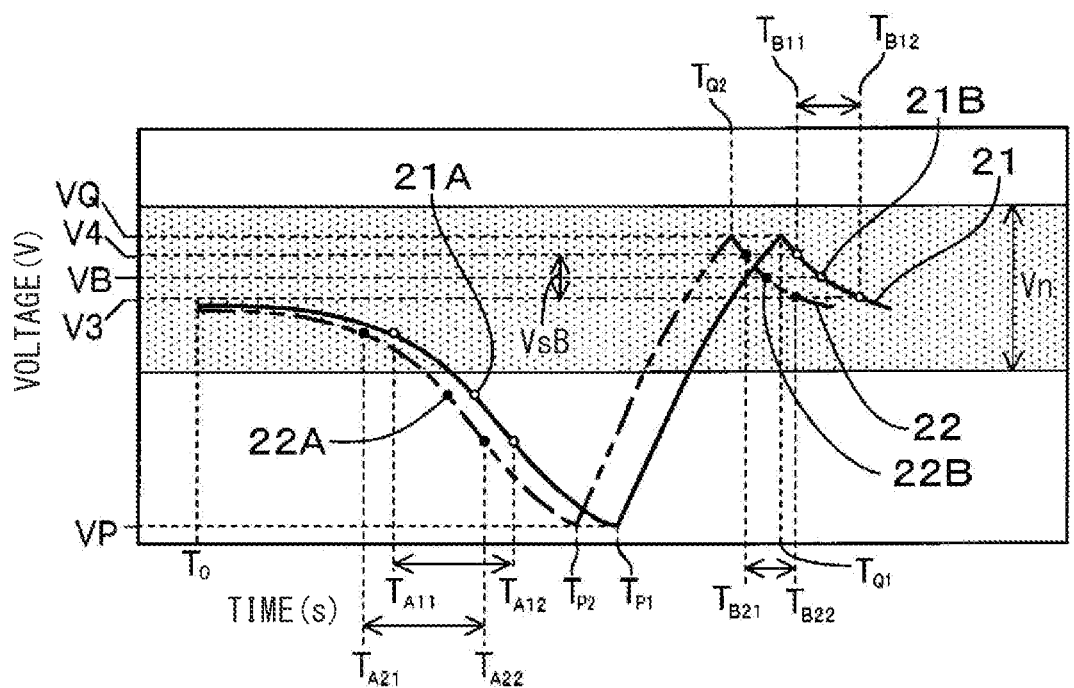
FIG. 13 is a conceptual diagram showing a battery characteristic in a modified embodiment 7.

The charging voltage characteristic in the present modified embodiment 6, as in the case of the discharging voltage characteristic of the embodiment 1, may be calculated based on the voltage transition during the voltage relaxation in which the open circuit voltage is returned after charging is performed to reach the predetermined charging target voltage VQ and the charging is stopped. For example, as in a modified embodiment 7 shown in FIG. 13, based on the voltage transition in the predetermined voltage section VsB in the voltage relaxation after time $T_{Q1}$ at which charging is stopped in the first secondary battery 21, the differential value at the predetermined voltage VB indicated by the reference numeral 21B may be calculated and used as the charging voltage characteristic. Similarly, based on the voltage transition in the predetermined voltage section VsB in the voltage relaxation after time $T_{Q2}$ at which charging is stopped in the second secondary battery 22, the differential value at the predetermined voltage VB indicated by the reference numeral 22B may be calculated and used as the charging voltage characteristic. Also in this case, the same operation effect as the operation effect of the present embodiment 1 is obtained.

As described above, according to the above aspect, it is possible to provide the deterioration degree determination system 100 for a secondary battery capable of determining the deterioration degree of the secondary battery 2 with high accuracy.

In the present modified embodiment 6, as in the modified embodiment of the case of the embodiment 1, the deterioration degree determination unit 65 may determine the deterioration degree of the secondary battery 2 based on the battery characteristic acquired by the battery characteristic acquisition unit 63 without estimating the total capacity. The battery characteristic acquisition unit 63 may acquire the absolute value of the acquired value as the battery characteristic, and the deterioration degree determination unit 65 may determine the deterioration degree based on the corresponding absolute value. The deterioration degree determination unit 65 may determine the deterioration degree of the secondary battery 2 based on the difference in the battery characteristic acquired by the battery characteristic acquisition unit 63. The battery pack 20 may be assembled by classifying the secondary battery 2 into classes such that the difference between the deterioration degree and the deterioration degree of the secondary battery 2 is within a predetermined range.

Embodiment 2

In the deterioration degree determination system 100 of the embodiment 1, as shown in FIG. 1, although the server 1 includes the memory unit 5, the calculation unit 6, the update unit 8, and the communication unit 10, and an external terminal 9 includes the detection unit 3, the storage unit 4, the control unit 7, the communication unit 90, and the display unit 93, some of the configuration included in the server 1 may be included in the external terminal 9. In the deterioration degree determination system 100 of the embodiment 2, as shown in FIG. 14, the server 1 includes the update unit 8 and the communication unit 10, and the external terminal 9 includes the detection unit 3, the storage unit 4, the memory unit 5, the calculation unit 6, the control unit 7, the communication unit 90, and the display unit 93.

Figure 14:
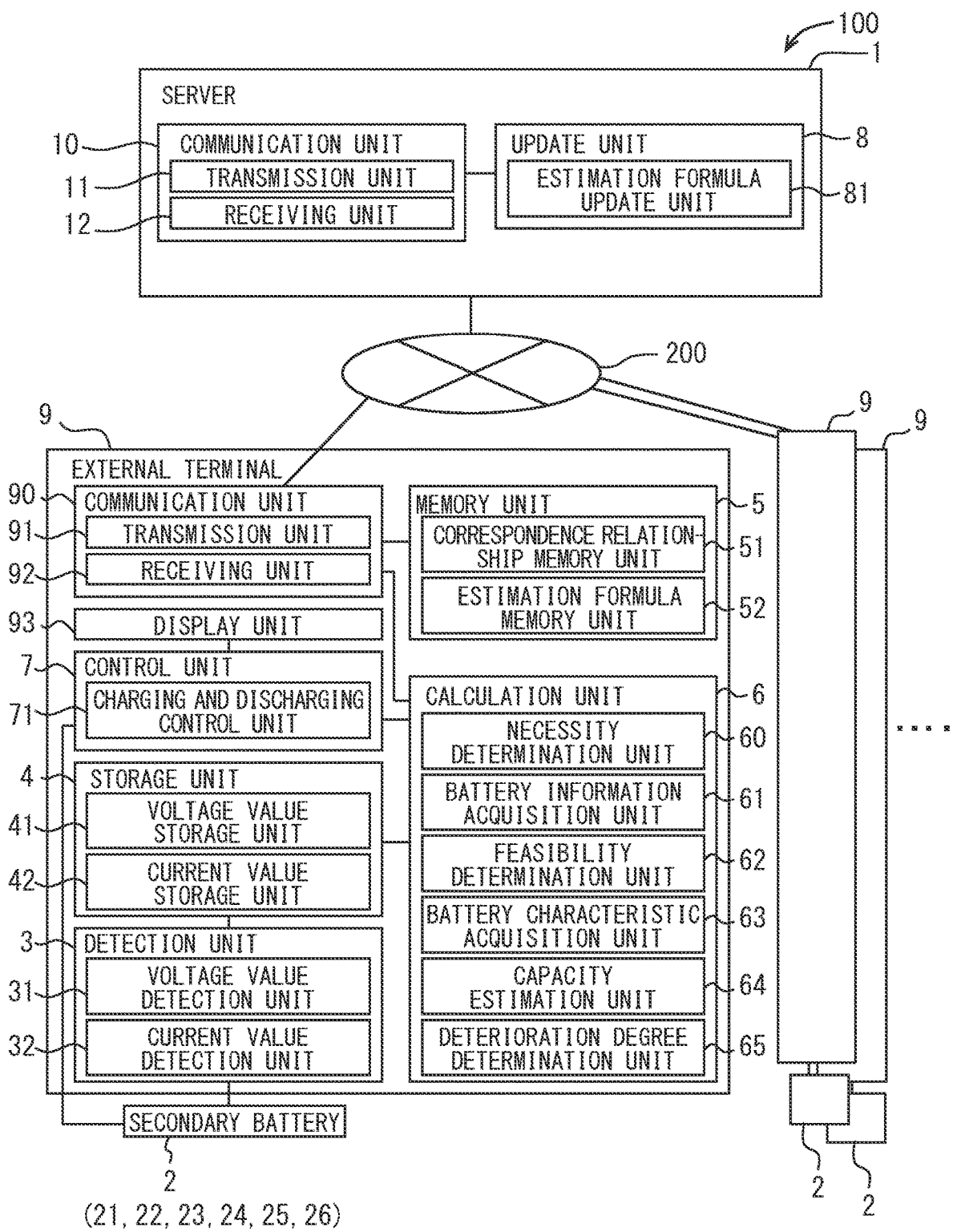
FIG. 14 is a conceptual diagram showing a configuration of the deterioration degree determination system in an embodiment 2.

In the present embodiment 2, the transmission unit 91 of the external terminal 9 shown in FIG. 14 transmits the capacity battery characteristic acquired by the battery characteristic acquisition unit 63 in the calculation unit 6 to the server 1. The receiving unit 12 of the server 1 receives the capacity battery characteristic transmitted from the external terminal 9, and the estimation formula update unit 81 of the server 1 creates the update information. The transmission unit 11 in the server 1 transmits the update information by the estimation formula update unit 81 to the external terminal 9. The receiving unit 92 of the external terminal 9 receives the update information transmitted from the server 1 and updates the estimation formula stored in the estimation formula memory unit 52 of the external terminal 9. The reference value stored in the estimation formula memory unit 52 of the external terminal 9 may be updated based on the update information. Other configurations are the same as in the case of the embodiment 1, and the same reference numerals as those in the case of the embodiment 1 are assigned and the description thereof will be omitted.

In the present embodiment 2, the server 1 further includes the transmission unit 11 that transmits the estimation formula updated by the update unit 8 to the external terminal 9, and the external terminal 9 includes the battery characteristic acquisition unit 63 that acquires the capacity battery characteristic by charging and discharging the secondary battery 2 and that transmission unit 91 that transmits the capacity battery characteristic to the server 1. Accordingly, in the server 1, the estimation formula and the like stored in each external terminal 9 can be updated based on the capacity battery characteristic received from the multiple external terminals 9, and thus the data traffic between the external terminal 9 and the server 1 can be reduced. Accordingly, a decrease in communication speed is prevented, and thus high determination accuracy can be maintained while delay in the deterioration degree determination is restricted. Also in the present embodiment 2, the same operation effect as the operation effect of the embodiment 1 is exhibited except the operation effect exhibited by the server 1 including the memory unit 5, the calculation unit 6, and the control unit 7 in the embodiment 1.

In the present embodiment 2, in addition to the above, the external terminal 9 further includes the estimation formula memory unit 52 in which the estimation formula and the like are stored, the receiving unit 92 that receives the update information, the update unit 8 that updates the estimation formula and the like based on the update information, the deterioration degree determination unit 65 that determines the deterioration degree of the secondary battery 2, and the display unit 93 that displays the determination result by the deterioration degree determination unit 65. Accordingly, the deterioration degree determination of the secondary battery can be performed only by the external terminal 9 without communicating with the server 1. Therefore, the deterioration degree determination can be performed although a good communication state cannot be ensured or the communication network 200 cannot be connected at the place, and the usability is improved.

The flow of a method for determining the deterioration degree by the deterioration degree determination system 100 of the present embodiment 2 will be described below.

Figure 15:
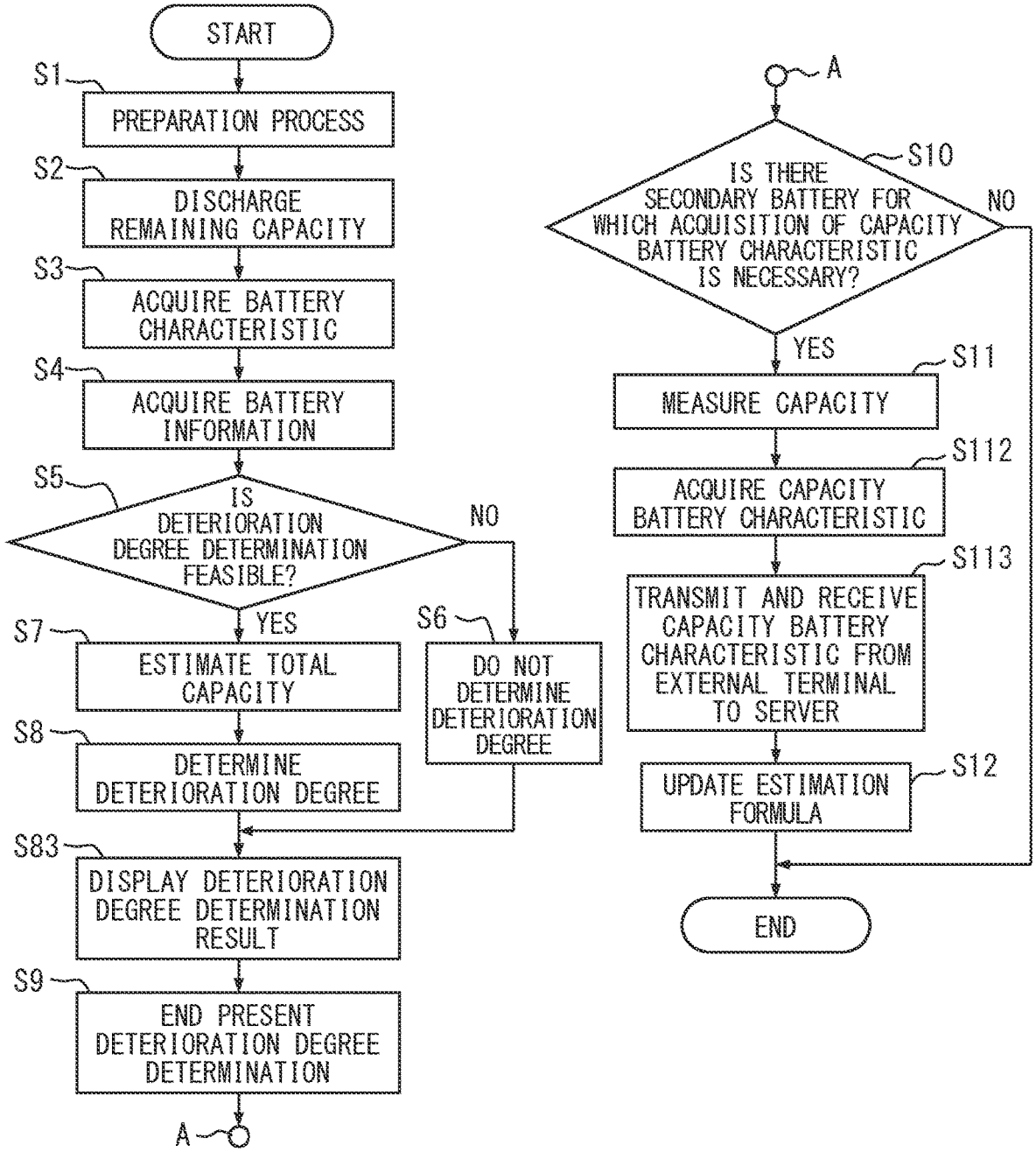
FIG. 15 is a flowchart showing a method for determining a deterioration degree of a secondary battery in a modified embodiment 8.

First, as in the steps S1 and S2 of the embodiment 1 shown in FIG. 5, the step S1 and the step S2 shown in FIG. 15 are performed, and the charging and discharging control unit 71 uses the external terminal 9 to individually discharge the remaining capacity of the secondary batteries 21 to 26. Similarly to the steps S3 to S8 of the embodiment 1 shown in FIG. 5, the steps S3 to S8 shown in FIG. 15 are performed on the external terminal 9. Thereafter, the process proceeds to a step S83 shown in FIG. 15, and the display unit 93 of the external terminal 9 displays the determination result. The process proceeds to the step S9, and the present deterioration degree determination is ended.

Thereafter, the process proceeds to the symbol A shown in FIG. 15, and in a step S10, the necessity determination unit 60 of the external terminal 9 determines the necessity of acquiring the capacity battery characteristic. Also in the present embodiment 2, as in the case of the embodiment 1, the acquisition of the capacity battery characteristic is determined to be necessary for the secondary battery for which the determination of the deterioration degree is determined to be infeasible by the feasibility determination unit 62 in the step S5, and the acquisition of the capacity battery characteristic is determined to be unnecessary for the secondary battery for which the determination of the deterioration degree is determined to be feasible. When in the step S10, determination is made that there is no secondary battery for which the acquisition of the capacity battery characteristic is determined to be necessary, the process proceeds to No in the step S10, and the control flow is ended. On the other hand, when in the step S10, determination is made that there is a secondary battery for which the acquisition of the capacity battery characteristic is determined to be necessary, the process proceeds to Yes in the step S10.

Thereafter, in the step S11 shown in FIG. 15, the charging and discharging control unit 71 of the external terminal 9 charges and discharges the secondary battery 2 for which the acquisition of the capacity battery characteristic is determined to be necessary based on the above instruction information and measures the capacity to acquire the measured value, and then in the step S112, the battery characteristic acquisition unit 63 of the external terminal 9 acquires the capacity battery characteristic based on the corresponding measured value.

The process proceeds to the step S101 shown in FIG. 15, the transmission unit 91 of the external terminal 9 transmits the capacity battery characteristic to the server 1, and the receiving unit 12 of the server 1 receives the capacity battery characteristic. Thereafter, in the step S12, the estimation formula update unit 81 transmits the instruction information, which indicates the update of the feasibility determination reference and the estimation formula stored in the estimation formula memory unit 52 with the corresponding capacity battery characteristic as additional training data, to the external terminal 9, and the receiving unit 92 of the external terminal 9 receives the instruction information. Accordingly, the corresponding feasibility determination reference and the corresponding estimation formula that update the feasibility determination reference and the estimation formula stored in the estimation formula memory unit 52 of the external terminal 9, are used for the deterioration degree determination from the next time onward. The deterioration degree determination system 100 and the server 1 of the embodiment 2 also have the same operation effect as the operation effect of the embodiment 1.

Figure 16:
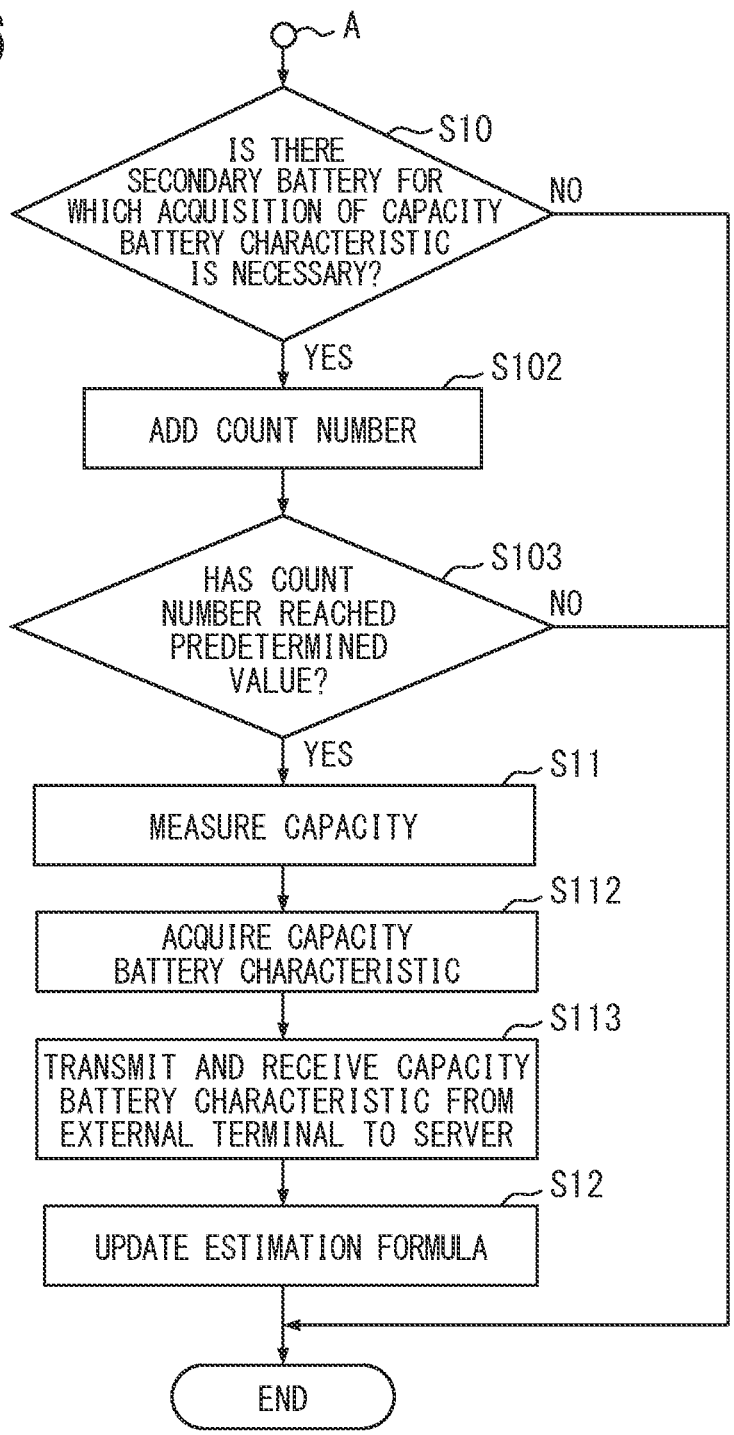
FIG. 16 is a flowchart showing a method for determining a deterioration degree of a secondary battery in a modified embodiment 9.

In the above-mentioned modified embodiment 1, the server 1 is further provided with a counter in the configuration of the embodiment 1, and similarly, in a modified embodiment 9, the counter is further provided in the external terminal 9 in the configuration of the embodiment 2. In the control flow in the modified embodiment 9, as shown in FIG. 16, when determination is made in the step S10 that there is a secondary battery for which the acquisition of the capacity battery characteristic is determined to be necessary, as in the embodiment 2, the process proceeds from Yes in the step S10 to the step S102, and the count number of the counter (not shown) provided in the external terminal 9 is increased. When determination is made in the step S103 that the count number has not reached a predetermined value, the process proceeds to No in the step S103, and the external terminal 9 does not measure the capacity and the flow is ended. On the other hand, when determination is made in the step S103 that the count number has reached a predetermined value, the process proceeds from Yes in the step S103 to the step S11, and the step S11 and subsequent steps are performed as in the case of the present embodiment 2. Even in the modified embodiment 9, it is possible to restrict the update frequency of the estimation formula from becoming excessively high and update the estimation formula at an appropriate frequency, and it is possible to restrict the calculation load of the external terminal 9 from becoming excessively large while the high determination accuracy of the deterioration degree is maintained.

Figure 17:
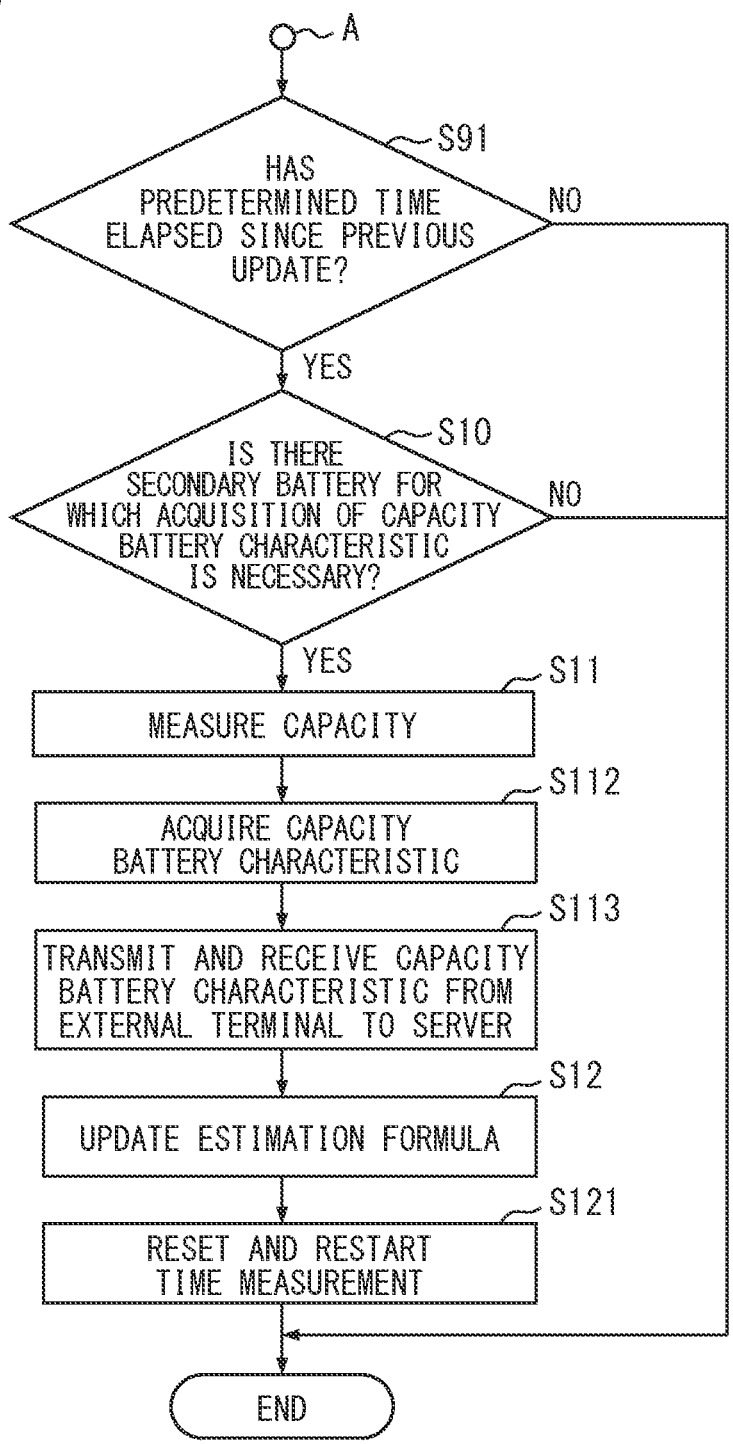
FIG. 17 is a flowchart showing a method for determining a deterioration degree of a secondary battery in a modified embodiment 10.

In the above-mentioned modified embodiment 2, the server 1 has a time measuring unit instead of the counter of the modified embodiment 1, but similarly, in a modified embodiment 10, the counter of the modified embodiment 9 is replaced and the external terminal 9 has the time measuring unit. In the modified embodiment 10, the time measuring unit starts time measurement at the time point at which the estimation formula update unit 81 updates. In the control flow in the modified embodiment 10, as shown in FIG. 17, the process proceeds from the symbol A to the step S91, and the time measuring unit of the external terminal 9 determines whether a predetermined time has elapsed after the previous update. When determination is made that the predetermined time has not elapsed, the process proceeds to No in the step S91, and the flow is ended without determining the necessity of acquiring the capacity battery characteristic. On the other hand, when determination is made in the step S91 that the predetermined time has elapsed, the process proceeds from Yes in the step S91 to the step S10, and the steps S10 and subsequent steps are performed as in the case of the present embodiment 2. After the step S12, the time measurement in the time measuring unit is reset and restarted in a step S121.

According to the modified embodiment 10, the necessity determination unit 60 determines the necessity of acquiring the capacity battery characteristic when a predetermined time has elapsed from the previous update performed by the update unit 8. Accordingly, it is possible to restrict the update frequency of the estimation formula from becoming excessively high and update the estimation formula at an appropriate frequency, and it is possible to restrict the calculation load of the external terminal 9 from becoming excessively large while the high determination accuracy of the deterioration degree is maintained.

Figure 18:
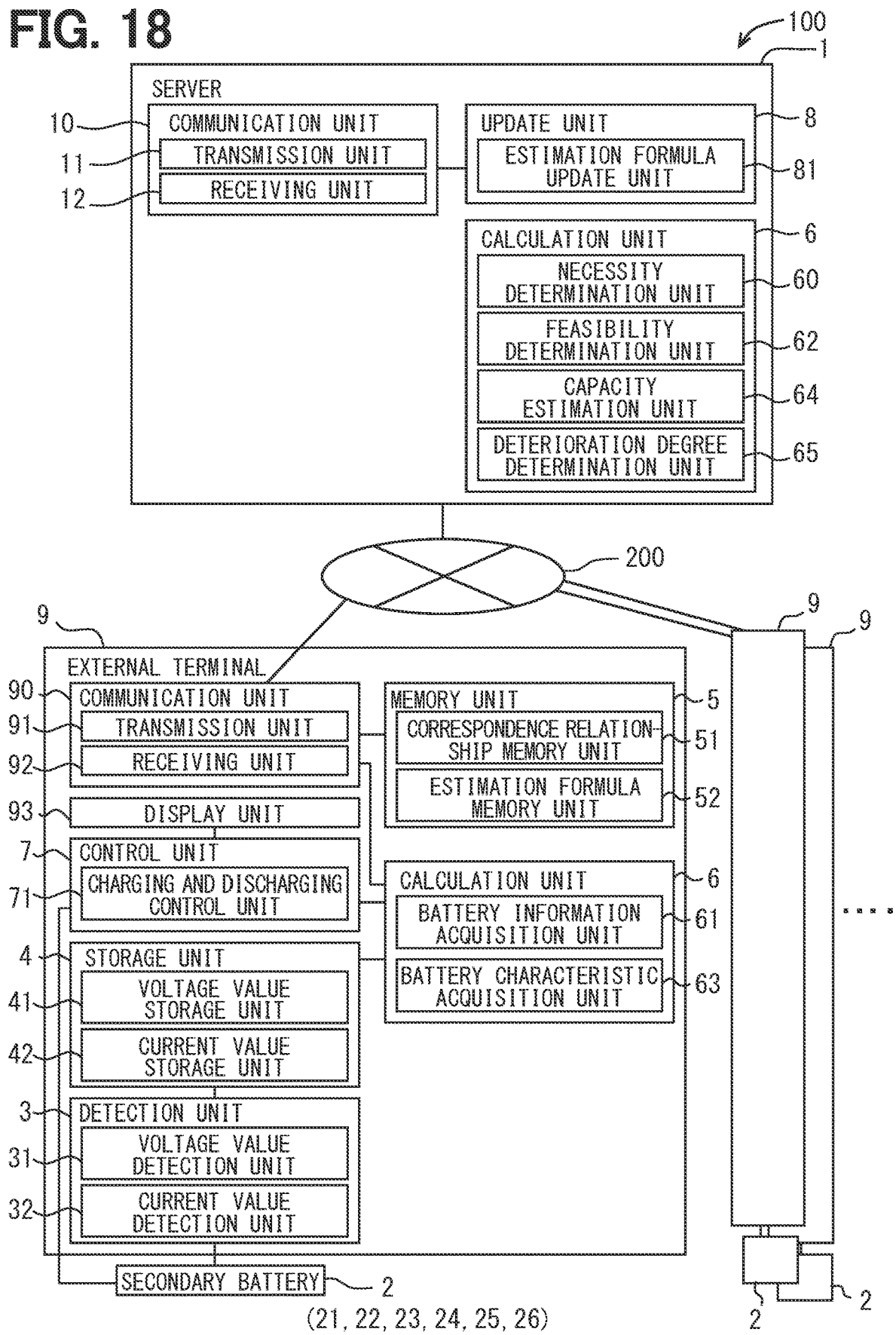
FIG. 18 is a conceptual diagram showing a battery characteristic in a modified embodiment 11.

In the present embodiment 2, the external terminal 9 has all the configuration elements of the calculation unit 6, but instead of the above-mentioned, the configuration element of the calculation unit 6 may be optionally distributed and provided between the server 1 and the external terminal 9. For example, in a modified embodiment 11 shown in FIG. 18, among the configuration elements of the calculation unit 6, the necessity determination unit 60, the feasibility determination unit 62, the capacity estimation unit 64, and the deterioration degree determination unit 65 may be provided in the server 1, and the battery information acquisition unit 61 and the battery characteristic acquisition unit 63 may be provided in the external terminal 9.

In the modified embodiment 11, the battery characteristic acquisition unit 63 in the external terminal 9 acquires the battery characteristic related to the transition of the battery state over a predetermined voltage section in the secondary battery 2 or the battery characteristic relationship value related to the battery characteristic, and the transmission unit 91 of the external terminal 9 transmits the battery characteristic acquired by the battery characteristic acquisition unit 63 or the battery characteristic relationship value to the server 1. Accordingly, while the data traffic between the external terminal 9 and the server 1 is reduced, the calculation load on the external terminal 9 can be reduced to restrict the specification required for the external terminal 9, such that the cost of the external terminal 9 can be reduced. Therefore, it is advantageous when the deterioration degree determination system 100 includes a large number of external terminals 9.

Embodiment 3

In the deterioration degree determination system 100 of the first above-described embodiment and embodiment 2, the battery information acquisition unit 61 acquires, as the battery information, the battery characteristic of the secondary battery 2 acquired by the battery characteristic acquisition unit 63. Instead of the above-mentioned, in the embodiment 3, the history information of the secondary battery 2 is acquired as the battery information. The history information of the secondary batteries 21 to 26 can include a charging electricity amount, a discharging electricity amount, a battery temperature, a charging state (SOC), an equalization frequency, an outside air temperature in each of the secondary batteries 21 to 26, the maximum value, the minimum value, the average value, the accumulated value, and the like in a predetermined period of the usage period, the temperature, and the like of a device mounted with the corresponding secondary battery. The predetermined period can be any period up to the present, and may be the entire period up to the present. Other configurations are the same as in the case of the embodiment 1, and the same reference numerals as those in the case of the embodiment 1 are assigned and the description thereof will be omitted.

Figure 19:
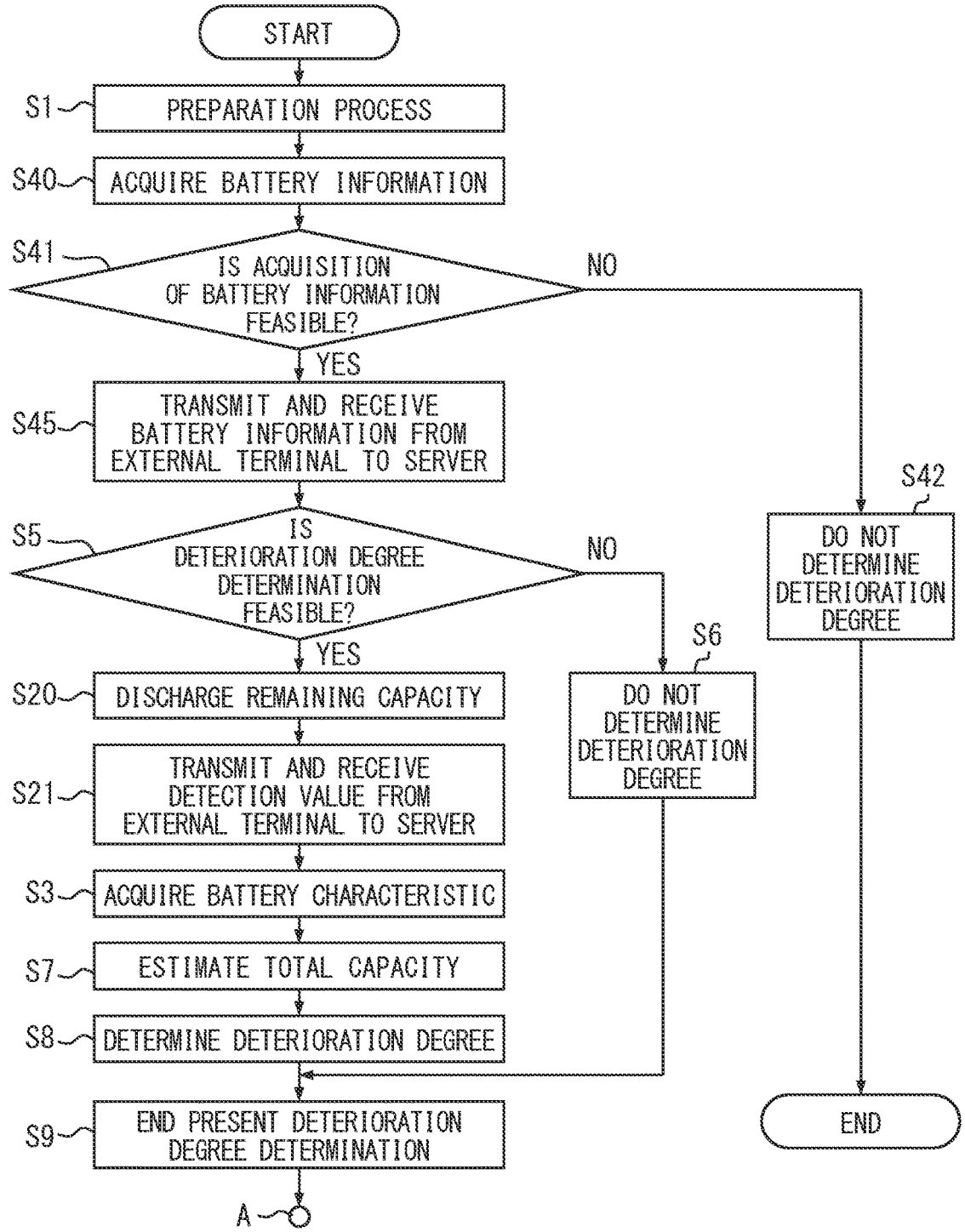
FIG. 19 is a flowchart showing a method for determining a deterioration degree of a secondary battery in an embodiment 3.

In the flow of the deterioration degree determination in the present embodiment 3, as shown in FIG. 19, first, the step S1 is performed as in the case of the embodiment 1. Thereafter, the process proceeds to a step S40, and the battery information acquisition unit 61 of the server 1 attempts to acquire the battery information of the secondary batteries 21 to 26 at the external terminal 9 via the communication network 200. In the present embodiment 3, the battery information acquisition unit 61, for example, attempts to acquire the history information of the charging electricity amount in each of the secondary batteries 21 to 26 as the battery information A, and attempts to acquire the temperature history in each of the secondary batteries 21 to 26 as the battery information B. The type of history information to be attempted to acquire here is not limited thereto.

Next, the process proceeds to a step S41 shown in FIG. 19, and determination is made on whether the battery information A and B can be acquired in the external terminal 9. When the battery information A and B cannot be acquired in the step S41, the process proceeds to No in the step S41, and in a step S42, the measurement is failure, such that the flow is ended without determining the deterioration degree of the secondary battery 2.

On the other hand, when the battery information can be acquired in the external terminal 9 in the step S41 shown in FIG. 19, the process proceeds to Yes in the step S41. In a step S45, the battery information is transmitted from the transmission unit 91 of the external terminal 9 to the server 1, and the battery information is received by the receiving unit 12 of the server 1. In the step S5, as in the case of the embodiment 1, the feasibility of the determination of the deterioration degree is determined by the feasibility determination unit 62 of the server 1. Among the secondary batteries 21 to 26, for one of which the acquired battery information is not within the feasibility determination reference, the determination of the deterioration degree is determined to be not feasible, steps S6 and S9 are performed as in the case of the embodiment 1, the process proceeds to the symbol A in FIG. 5, and steps S10 to S12 are performed to end the flow.

On the other hand, in the step S5 shown in FIG. 19, among the secondary batteries 21 to 26, for one of which the acquired battery information is within the feasibility determination reference, the feasibility determination unit 62 determines that the determination of the deterioration degree is feasible, the process proceeds to Yes in the step S5. In a step S20, among the secondary batteries 21 to 26, with respect to one for which the deterioration degree determination is determined to be feasible, the remaining capacity is individually discharged as in the step S5 of the embodiment 1 shown in FIG. 5. When the secondary batteries 21 to 26 are nickel-metal hydride batteries, the memory effect is also canceled at the same time.

Thereafter, in the step S21 shown in FIG. 19, as in the case of the embodiment 1, the transmission unit 91 transmits the detection value obtained by the detection unit 3 in the external terminal 9 to the server 1, and the receiving unit 12 of the server 1 receives the detection value. Thereafter, in the step S3, with respect to one for which the determination of the deterioration degree is determined to be feasible, the discharging voltage characteristic is acquired as the battery characteristic. As in the case of the embodiment 1, the steps S7 to S9 are performed, the process proceeds to the symbol A, and the steps S10 to S12 shown in FIG. 5 are performed to end the flow.

In the present embodiment 3, the battery information acquisition unit 61 acquires the history information of the secondary batteries 21 to 26 as the battery information. Accordingly, the feasibility of the determination of the deterioration degree is determined based on the history information of the secondary batteries 21 to 26, and thus the determination accuracy can be improved.

In the deterioration degree determination system 100 of the above-described embodiment 1, the battery information acquisition unit 61 acquires the battery characteristic of the secondary battery 2 acquired by the battery characteristic acquisition unit 63 as the battery information, and in the deterioration degree determination system 100 of the embodiment 3, the battery information acquisition unit 61 acquires the history information of the secondary battery 2 as the battery information. Instead of the above-mentioned, the deterioration degree determination system 100 of a modified embodiment 12 is configured to acquire both the battery characteristic acquired by the battery characteristic acquisition unit 63 and the history information of the secondary battery 2 as the battery information. Other configurations are the same as in the case of the embodiment 1 and the embodiment 3, and the same reference numerals as those in the embodiment 1 and the embodiment 3 are given and the description thereof will be omitted.

Figure 20:
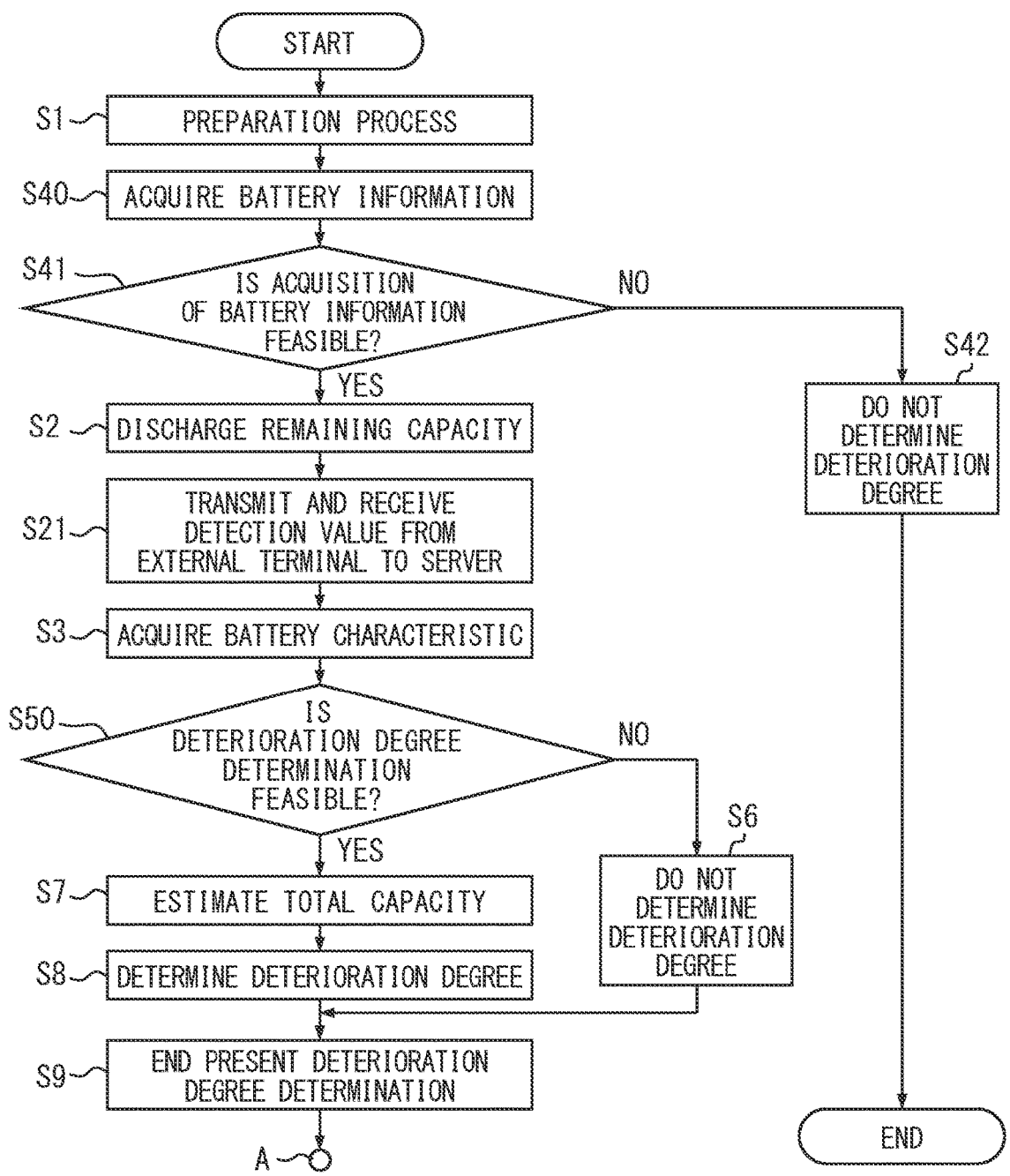
FIG. 20 is a flowchart showing a method for determining a deterioration degree of a secondary battery in a modified embodiment 12.

In the flow of the deterioration degree determination in the modified embodiment 12, as shown in FIG. 20, first, the step S1, the step S40, and the step S41 are performed as in the case of the embodiment 3. When the battery information cannot be acquired in the external terminal 9 in the step S41, the process proceeds to No in the step S41 as in the case of the embodiment 3, and in the step S42, the measurement is failure, such that the flow is ended without determining the deterioration degree of the secondary battery 2.

On the other hand, when the battery information can be acquired in the step S41 shown in FIG. 20, as in the step S2 to the step S3 of the case of the embodiment 1 shown in FIG. 5, in the step S2 shown in FIG. 20, the remaining capacity of the secondary battery for which the battery information can be acquired is discharged, and the memory effect is also canceled at the same time when the secondary battery is a nickel-metal hydride battery. In the step S21, the transmission unit 91 transmits the detection value obtained by the detection unit 3 in the external terminal 9 to the server 1, and the receiving unit 12 of the server 1 receives the detection value. Thereafter, in the step S3, with respect to one for which the determination of the deterioration degree is determined to be feasible, the discharging voltage characteristic is acquired as the battery characteristic, and the process proceeds to a step S50.

In the step S50 shown in FIG. 20, the feasibility determination unit 62 determines the feasibility of the determination of the deterioration degree based on the battery characteristic and history information of the secondary batteries 21 to 26 as the battery information and the feasibility determination reference. Among the secondary batteries 21 to 26, for one of which the acquired battery information is not within the feasibility determination reference, the determination of the deterioration degree is determined to be not feasible, steps S6 and S9 are performed as in the case of the embodiment 1, the process proceeds to the symbol A in FIG. 5, and steps S10 to S12 are performed to end the flow. On the other hand, among the secondary batteries 21 to 26, with respect to one for which the determination of the deterioration degree is determined to be feasible, as in the case of the embodiment 1, the steps S7 to S9 are performed, the process proceeds to the symbol A in FIG. 5, and the steps S10 to S12 are performed to end the flow.

According to the modified embodiment 12, the battery information used for determining the feasibility of the determination of the deterioration degree includes both the battery characteristic and the history information of the secondary batteries 21 to 26 as described above, and thus the feasibility of the determination of the deterioration degree can be determined with higher accuracy. The modified embodiment 12 also has the same operation effect as in the case of the embodiments 1 and 2.

Embodiment 4

The deterioration degree determination system 100 of the present embodiment 4 has the same configuration as the configuration of the embodiment 3. In the present embodiment 4, the estimation formula memory unit 52 stores the first feasibility determination reference D1 and the second feasibility determination reference D2. In the present embodiment 4, the first feasibility determination reference D1 stores the Mahalanobis distance D1 as the inter-data distance D1, the second feasibility determination reference D2 stores the Mahalanobis distance D2 as the inter-data distance D2, and the relationship of both is set as D1<D2.

In the present embodiment 4, the correspondence relationship memory unit 51 stores a first correspondence relationship and a second correspondence relationship. The first correspondence relationship is a correspondence relationship suitable for determining the deterioration degree of the secondary battery for which the determination of the deterioration degree is determined to be feasible by the first feasibility determination reference D1. The second correspondence relationship is a correspondence relationship suitable for determining the deterioration degree of the secondary battery for which the determination of the deterioration degree is determined to be feasible by the second feasibility determination reference D2. The correspondence relationship can be created as in the case of the embodiment 1.

Next, the flow of a method for determining the deterioration degree by the deterioration degree determination system 100 of the present embodiment 4 will be described below with reference to FIG. 21. In the present embodiment 4, the same reference numerals as those in the case of the embodiment 3 shown in FIG. 19 are designated by the same reference numerals, and the description thereof will be omitted.

Figure 21:
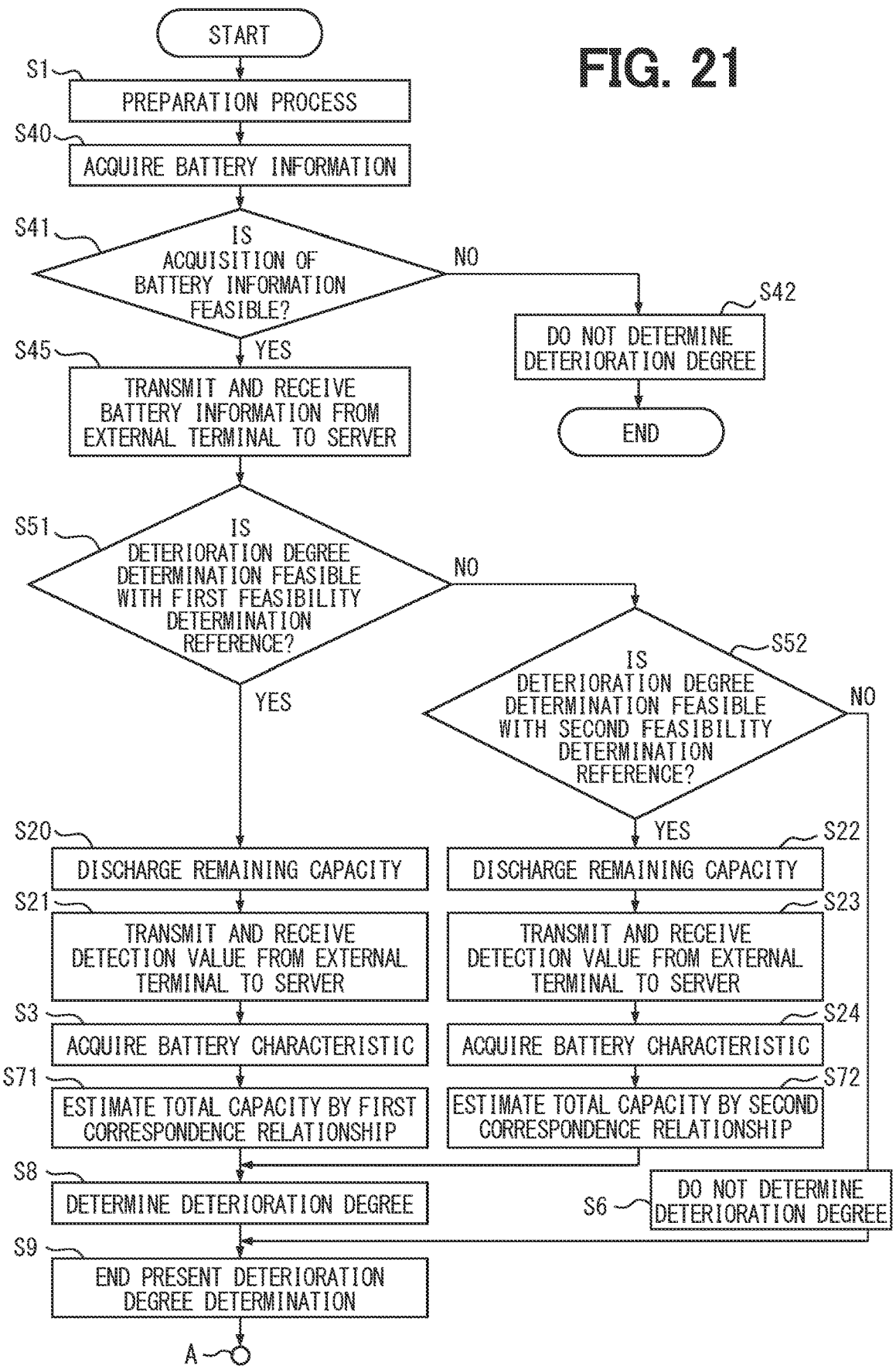
FIG. 21 is a flowchart showing a method for determining the deterioration degree of the secondary battery in the embodiment 4.

In the flow of the present embodiment 4, instead of the case of the embodiment 3 shown in FIG. 19, as shown in FIG. 21, in a step S44, the battery information is received from the server 1, and then in a step S51, the feasibility determination unit 62 determines whether the determination of the deterioration degree of the secondary battery of which battery information can be acquired is feasible based on the first feasibility determination reference D1. In the step S51, among the corresponding secondary batteries, with respect to one for which the determination of the deterioration degree is determined to be feasible, the process proceeds to Yes in the step S51, and the step S20, the step S21, and step S3 shown in FIG. 21 are performed as in the step S20 to the step S3 of the embodiment 3 shown in FIG. 19.

Thereafter, in a step S71 shown in FIG. 21, based on the first correspondence relationship between the battery characteristic and the total capacity based on the prediction model stored in the correspondence relationship memory unit 51, the capacity estimation unit 64 estimates the total capacity, that is, the full charging capacity or the full discharging capacity for, among the secondary batteries 21 to 26, one for which the determination of the deterioration degree is determined to be feasible in the step S51 from the battery characteristic acquired by the battery characteristic acquisition unit 63. As in the case of the embodiment 3, the deterioration degree is determined in the step S8, the step S9 is performed to proceed to the symbol A in FIG. 5, and the steps S10 to S12 are performed to end the flow.

On the other hand, in the step S51 shown in FIG. 21, among the secondary batteries 21 to 26, with respect to one for which the determination of the deterioration degree is infeasible based on the first feasibility determination reference D1, the process proceeds to No in the step S51. In a step S52, among the secondary batteries 21 to 26, with respect to one for which the determination of the deterioration degree is determined to be not feasible in the step S51, the feasibility determination unit 62 determines whether the determination of the deterioration degree is feasible based on the second feasibility determination reference D2. In the step S52, when the determination of the deterioration degree is determined to be feasible, the process proceeds to Yes in the step S52, and a step S22, a step S23, and a step S24 shown in FIG. 21 are performed as in the step S20 to the step S3 of the case of the embodiment 3 shown in FIG. 19.

Thereafter, in a step S72 shown in FIG. 21, based on the second correspondence relationship between the battery characteristic and the total capacity based on the prediction model stored in the correspondence relationship memory unit 51, the capacity estimation unit 64 estimates the total capacity, that is, the full charging capacity or the full discharging capacity for, among the secondary batteries 21 to 26, one for which the determination of the deterioration degree is determined to be feasible in the step S52 from the battery characteristic acquired by the battery characteristic acquisition unit 63. As in the case of the embodiment 3, the deterioration degree is determined in the step S8, and the process proceeds to the step S9 to end the present deterioration degree determination. On the other hand, among the secondary batteries 21 to 26, with respect to one for which the determination of the deterioration degree is determined to be not feasible in the step S52, the process proceeds to No in the step S52 and then proceeds to the steps S6 and S9 as in the case of the embodiment 1 to end the present deterioration degree determination. After the step S9, the process proceeds to the symbol A in FIG. 5, and the steps S10 to S12 are performed to end the flow.

The deterioration degree determination system 100 of the present embodiment 4 has the first feasibility determination reference D1 and the second feasibility determination reference D2 as multiple feasibility determination references, and has, as multiple correspondence relationships, a first correspondence relationship and a second correspondence relationship suitable for one for which the determination of the deterioration degree is determined to be feasible based on the respective feasibility determination references. Accordingly, the consistency between the reference of the determination feasibility of the deterioration degree and the reference of the determination the deterioration degree is high, and the deterioration degree can be determined with higher accuracy. The present embodiment also has the same operation effect as in the case of the embodiment 1.

Embodiment 5

Figure 22:
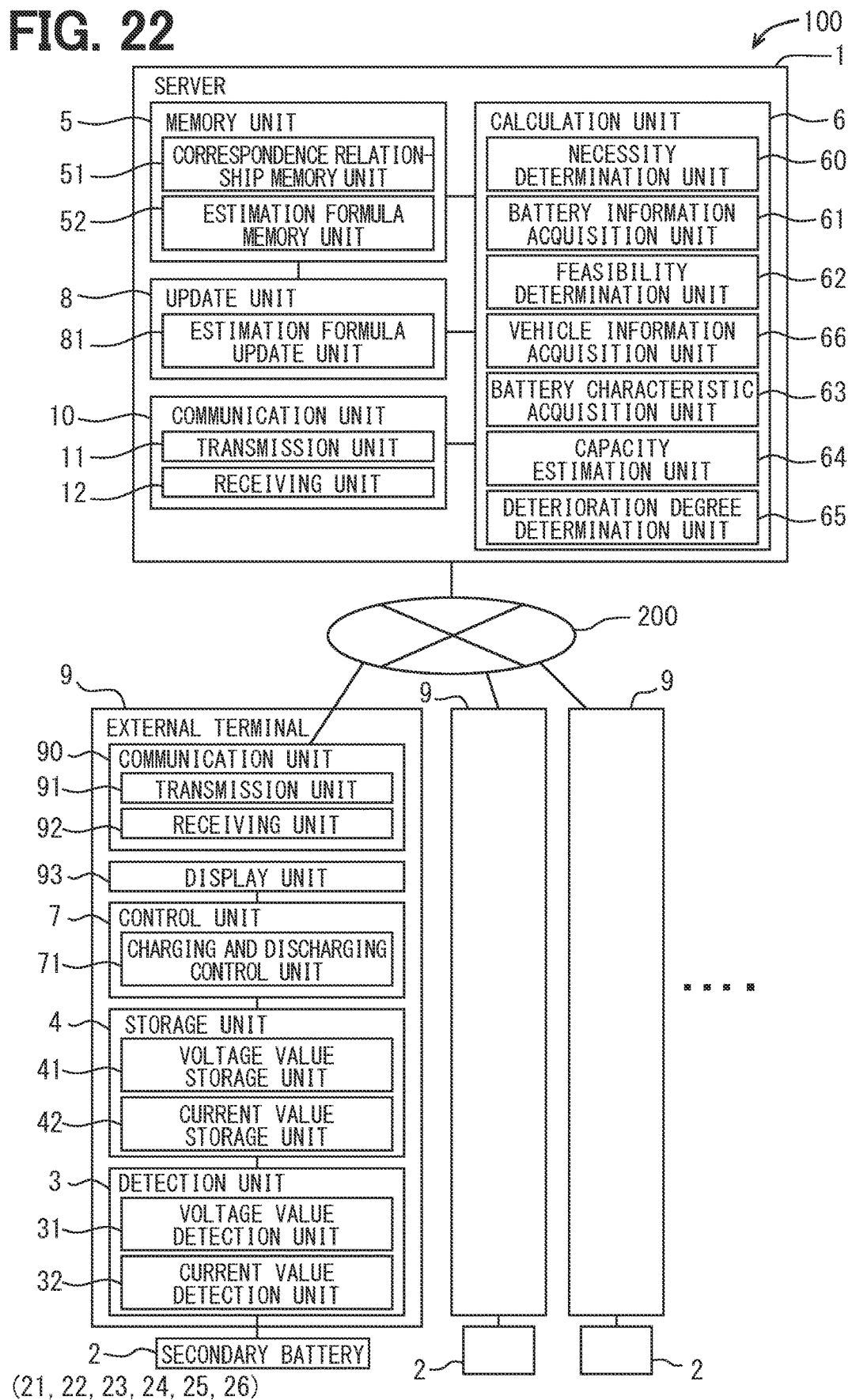
FIG. 22 is a conceptual diagram showing a configuration of a deterioration degree determination system in an embodiment 5.

In the deterioration degree determination system 100 of the embodiment 5, as shown in FIG. 22, the calculation unit 6 further includes a vehicle information acquisition unit 66. As vehicle information, the vehicle type of the vehicle 900, the product number of the battery pack, the module of the secondary battery, and the like, the position of the module in the battery pack, the year of manufacture, the period of use, and the travel distance of the vehicle 900, the location of the store of the vehicle 900, and the like can be exemplified. The estimation formula memory unit 52 stores the vehicle information reference as the determination reference of the vehicle information for determining the feasibility of the determination of the deterioration degree. In the present embodiment 5, multiple specific vehicle types are stored as vehicle information. The correspondence relationship memory unit 51 stores the correspondence relationships corresponding to the corresponding specific vehicle types, respectively. Other configurations are the same as in the case of the embodiment 1 shown in FIG. 1 and the embodiment 3 (not shown), and the same reference numerals are given and the description thereof will be omitted.

Figure 23:
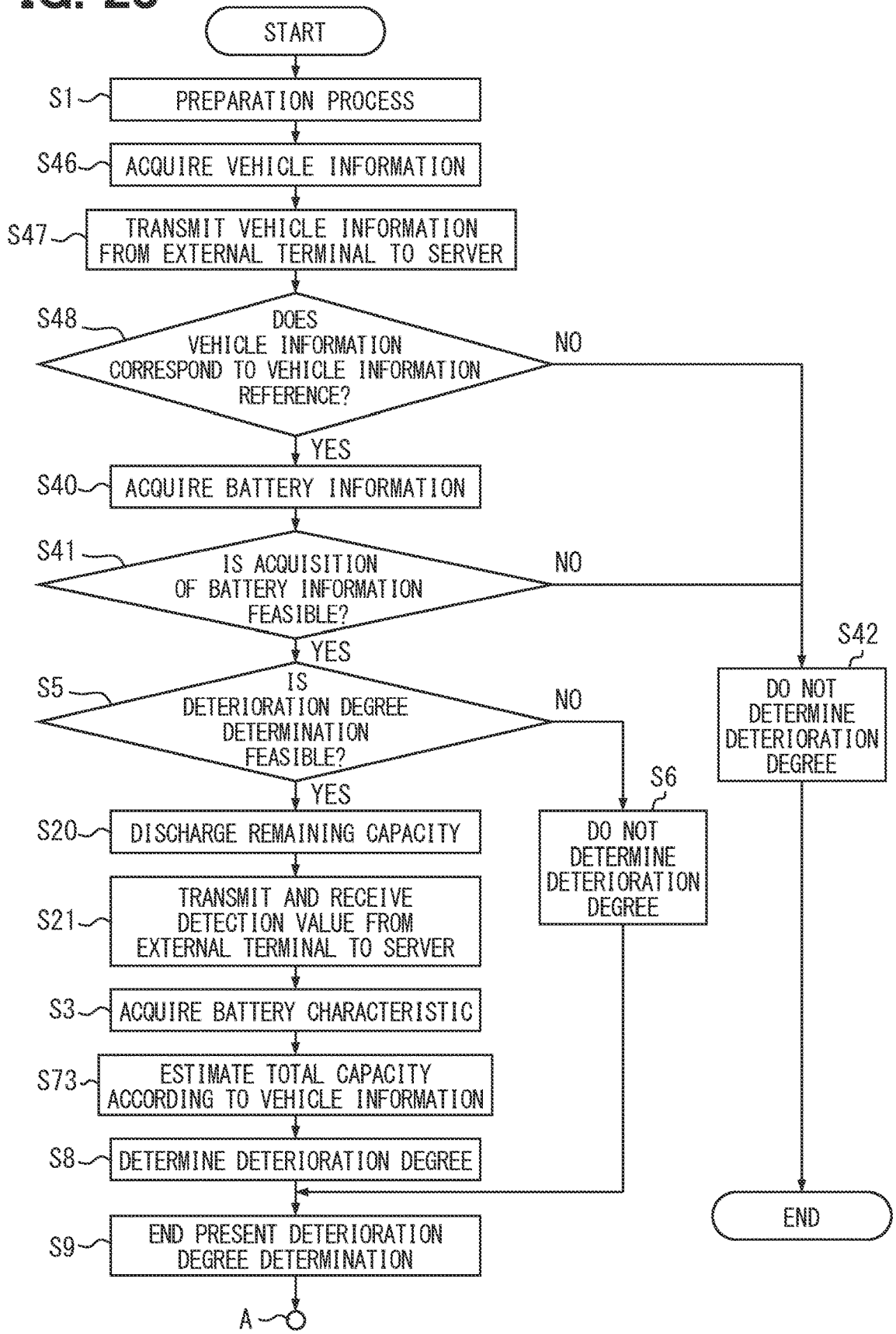
FIG. 23 is a flowchart showing a method for determining a deterioration degree of a secondary battery in an embodiment 5.

Next, the flow of a method for determining the deterioration degree by the deterioration degree determination system 100 of the present embodiment 5 will be described below with reference to FIG. 23. In the present embodiment 5, the same reference numerals as those in the embodiment 3 shown in FIG. 19 are designated by the same reference numerals, and the description thereof will be omitted. In the flow of the present embodiment 5, instead of the step S40 of the embodiment 3 shown in FIG. 19, as shown in FIG. 23, after the step S1, the process proceeds to a step S46, and the vehicle information acquisition unit 66 attempts to acquire the vehicle information of the vehicle 900 mounted with the battery pack 20 at the external terminal 9 via the communication network 200. In a step S47, the transmission unit 91 of the external terminal 9 transmits the vehicle information to the server 1, and the receiving unit 12 of the server 1 receives the vehicle information. The vehicle information is not limited, but in the present embodiment 5, the vehicle type is set to the type of the vehicle 900.

Thereafter, in a step S48 shown in FIG. 23, the feasibility determination unit 62 determines whether the vehicle information acquired by the vehicle information acquisition unit 66 corresponds to the vehicle information reference. In the present embodiment 5, determination is made on whether the vehicle type acquired by the vehicle information acquisition unit 66 corresponds to the specific vehicle type stored in the estimation formula memory unit 52. In the step S48, when determination is made that the corresponding vehicle type does not correspond to a specific vehicle type, the process proceeds to No in the step S48, and the flow is ended without determining the deterioration degree in the step S42 as in the case of the embodiment 3.

On the other hand, in the step S48 shown in FIG. 23, when determination is made that the acquired vehicle information corresponds to the vehicle information reference, the process proceeds to Yes in the step S48. As in the case of the embodiment 3, the step S40 to the end of the control flow are performed. However, in the step S73, instead of the step S7 in the case of the embodiment 3, the capacity estimation unit 64 estimates the total capacity according to the vehicle information. That is, the capacity estimation unit 64 changes the estimation formula used for estimating the corresponding total capacity according to the vehicle information.

According to the deterioration degree determination system 100 of the present embodiment 5, the capacity estimation unit 64 can determine the deterioration degree according to the vehicle type by using an estimation formula for estimating the total capacity corresponding to the vehicle type as the vehicle information, and the estimation accuracy is further improved. The deterioration degree determination system 100 of the present embodiment 5 can also have the same operation effect as the operation effect of the present embodiment 1.

Embodiment 6

Figure 24:
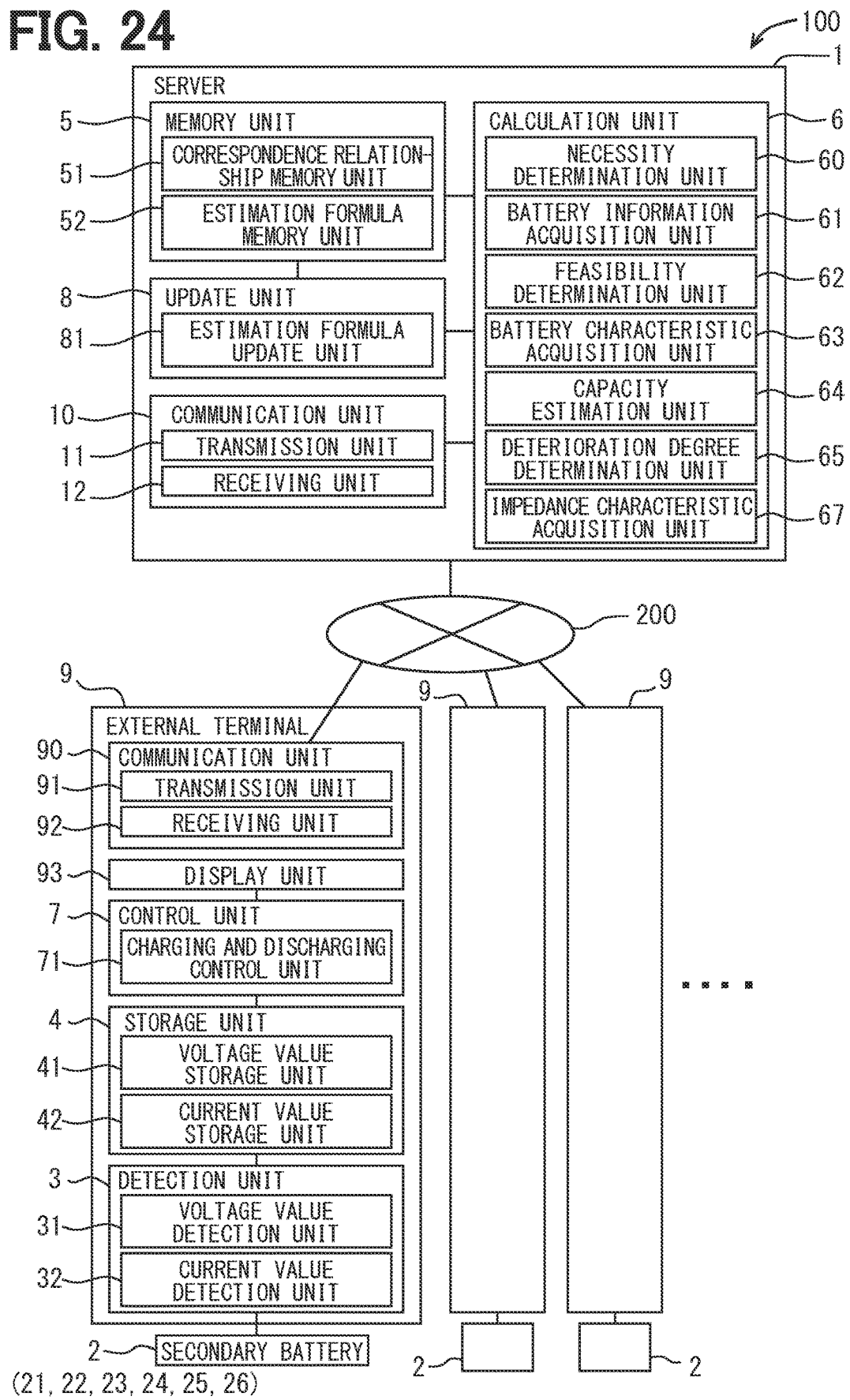
FIG. 24 is a conceptual diagram showing a configuration of a deterioration degree determination system in an embodiment 6.

In the deterioration degree determination system 100 of the present embodiment 6, in addition to the configuration of the embodiment 1 shown in FIG. 1, the calculation unit 6 includes an impedance characteristic acquisition unit 67 as shown in FIG. 24. The impedance characteristic acquisition unit 67 has a configuration for measuring complex impedance, and is configured to be able to measure the impedance of the secondary batteries 21 to 26. Other configurations are the same as those of the embodiment 1, and the same reference numerals are given to the same configurations of the embodiment 1, and the description thereof will be omitted.

In the present embodiment 6, the battery characteristic acquisition unit 63 acquires the discharging voltage characteristic in the predetermined voltage section Vs shown in FIG. 3, as in the case of the embodiment 1. The impedance characteristic acquisition unit 67 measures the complex impedance at the discharging end time $T_{P1}$ and $T_{P2}$ shown in FIG. 3, acquires the impedance at a predetermined frequency, and calculates the values of the real axis and the imaginary axis on the complex plane.

As the impedance characteristic, the value of the real axis and the imaginary axis of the impedance at a predetermined frequency f1 and the absolute value calculated from the value of the real axis and the value of the imaginary axis can be used. In addition to the above-mentioned, the declination calculated from the value of the real axis and the value of the imaginary axis at the predetermined frequency f1 can be used. At the predetermined frequency f1 and the predetermined frequency f2, the difference of the values of the real axis, the difference of the values of the imaginary axis, and the difference of the absolute values calculated from the difference of the values of the real axis and the difference of the values of the imaginary axis, and declination can also be used.

The correspondence relationship memory unit 51 stores in advance the correspondence relationship between the impedance characteristic and the total capacity. The corresponding correspondence relationship can be created by machine learning using the measurement-purpose secondary battery 2, or created based on the measured value obtained by performing an accelerated deterioration test by using the measurement-purpose secondary battery, or created by a calculation formula that logically derives the correspondence relationship between the impedance characteristic and the total capacity in a predetermined voltage by using the model of the secondary battery.

In the present embodiment 6, similarly to the embodiment 1, after the feasibility determination unit 62 determines the feasibility of the deterioration degree determination, the capacity estimation unit 64 shown in FIG. 24 estimates the total capacity of the secondary battery 2 based on the discharging voltage characteristic acquired by the battery characteristic acquisition unit 63 and the impedance characteristic acquired by the impedance characteristic acquisition unit 67. The deterioration degree determination unit 65 determines the deterioration degree of the secondary battery 2 based on the estimation result of the capacity estimation unit 64 as in the case of the embodiment 1. According to the present embodiment 6, the total capacity is estimated based on the discharging voltage characteristic and the impedance characteristic, and thus the determination accuracy can be further improved.

In the present embodiment 6, the timing at which the impedance characteristic acquisition unit 67 measures the complex impedance is set to the discharging end time $T_{P1}$ and $T_{P2}$ but is not limited thereto, and measurement may be performed at other timings. For example, when the battery characteristic acquisition unit 63 acquires the charging voltage characteristic as in the modified embodiment 4, the impedance characteristic acquisition unit 67 may perform complex impedance measurement at the charging end time $T_{Q1}$ and $T_{Q2}$ shown in FIG. 12. The capacity estimation unit 64 may use, instead of the impedance characteristic, the impedance characteristic relationship value calculated based on the impedance characteristic. As the impedance characteristic relationship value, for example, the difference in the impedance characteristic acquired by the impedance characteristic acquisition unit 67 can be adopted.

According to the deterioration degree determination system 100 of the present embodiment 6, the battery pack includes the multiple secondary batteries having the usage history, and the battery pack can be provided in which the difference in the deterioration degree of each of the multiple secondary batteries, which is determined based on the total capacity estimated by using the battery characteristic and the impedance characteristic related to the impedance when the secondary battery is charged or discharged, is within a predetermined range. In such a battery pack, the variation in the deterioration degree of the secondary battery included in the battery pack becomes smaller, and thus the lifetime of the battery pack as a rebuilt product can be extended and the quality improvement can be attempted.

Also in the present embodiment 6, the deterioration degree determination unit 65 may determine the deterioration degree of the secondary batteries 21 to 26 based on the battery characteristic and the impedance characteristic acquired by the battery characteristic acquisition unit 63 without estimating the total capacity. The battery characteristic acquisition unit 63 may acquire the absolute value of the acquired value as the battery characteristic, and the deterioration degree determination unit 65 may determine the deterioration degree based on the corresponding absolute value. The deterioration degree determination unit 65 may determine the deterioration degree of the secondary batteries 21 to 26 based on the difference in the battery characteristic acquired by the battery characteristic acquisition unit 63. The battery pack 20 may be assembled by classifying the secondary batteries 21 to 26 into classes such that the difference between the deterioration degree and the deterioration degree of the secondary batteries 21 to 26 is within a predetermined range.

Embodiment 7

Figure 25:
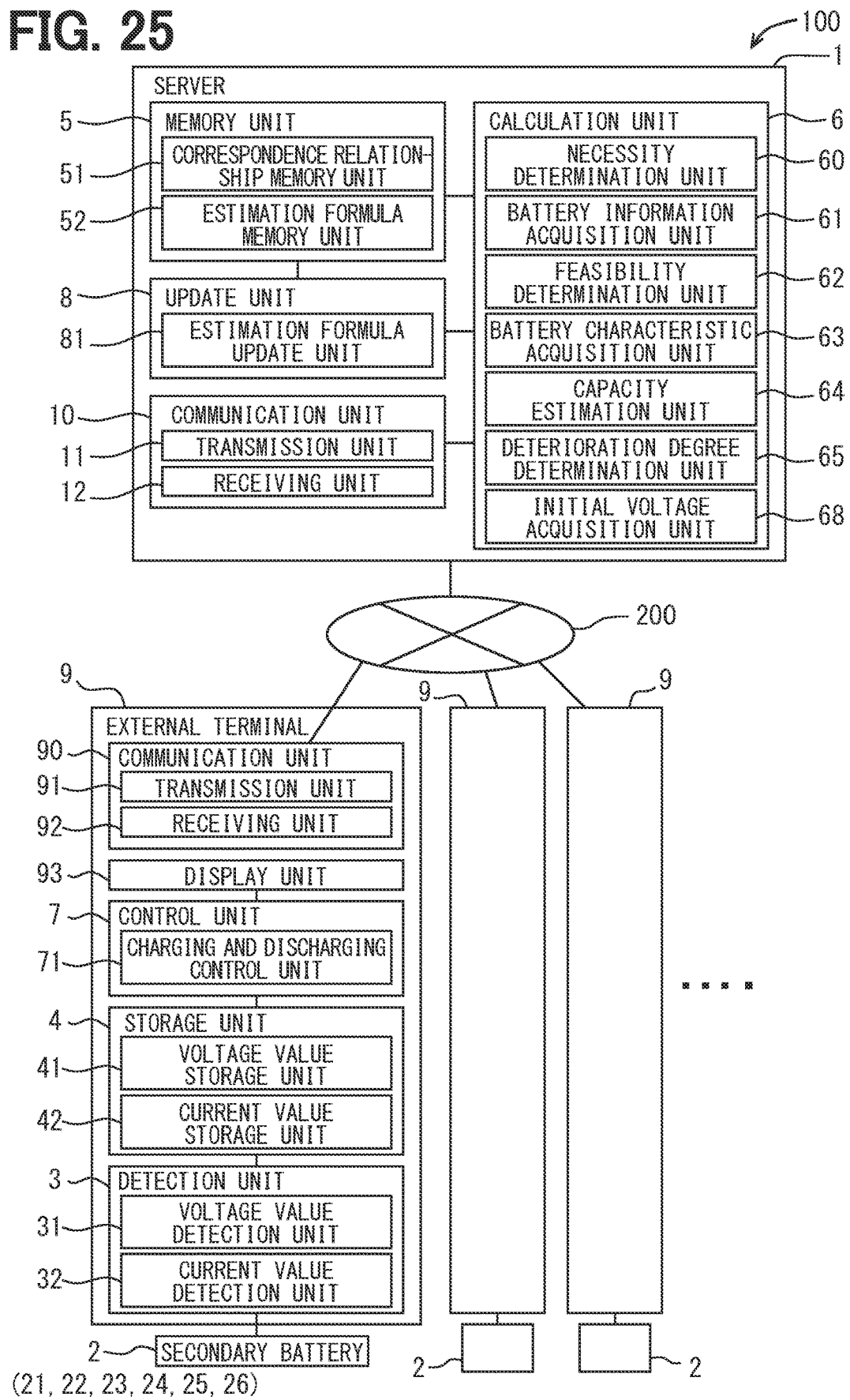
FIG. 25 is a conceptual diagram showing a configuration of a deterioration degree determination system in an embodiment 7.
Figure 26:
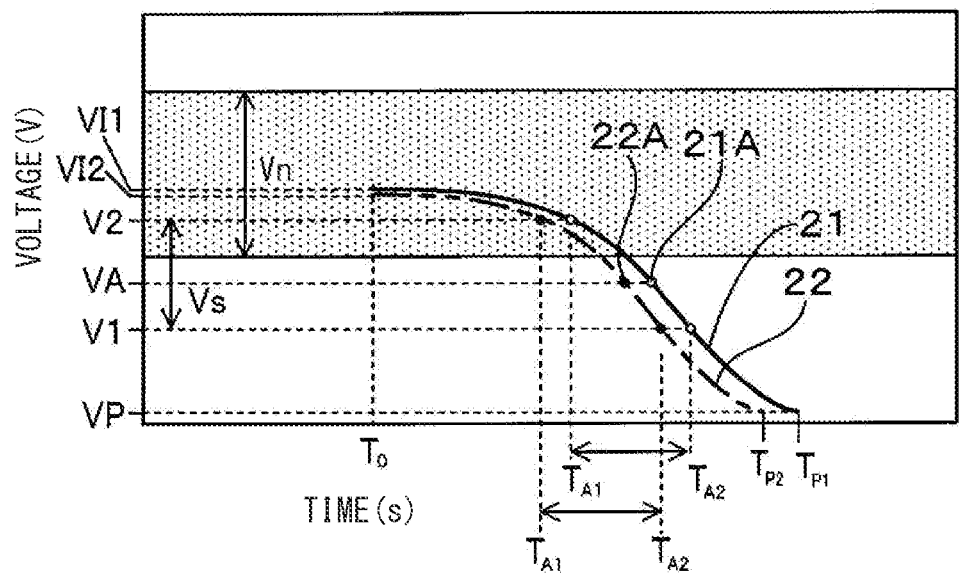
FIG. 26 is a conceptual diagram showing a battery characteristic in the embodiment 7.

In the present embodiment 7, in addition to the configuration of the embodiment 1 shown in FIG. 1, an initial voltage acquisition unit 68 is provided as shown in FIG. 25. As shown in FIG. 26, the initial voltage acquisition unit 68 acquires initial voltages VI1 and VI2 that are the open circuit voltages of the secondary battery 2 at the discharging start time $T_0$. The correspondence relationship memory unit 51 stores in advance the correspondence relationship among the initial voltage value, the battery characteristic, and the total capacity. The correspondence relationship can be created as in the case of the embodiment 1. Other configurations are the same as those of the embodiment 1, and the same reference numerals are given to the same configurations of the embodiment 1, and the description thereof will be omitted.

According to the deterioration degree determination system 100 of the present embodiment 7, the deterioration degree of the secondary battery 2 is determined also in consideration of the initial voltage in addition to the battery characteristic, and thus the determination accuracy can be further improved with a simple configuration. Instead of the initial voltage, the initial voltage relationship value calculated based on the initial voltage may be used. As the initial voltage relationship value, for example, an absolute value of the initial voltage or a difference of the initial voltage acquired by the initial voltage acquisition unit 68 can be used.

According to the deterioration degree determination system 100 of the present embodiment 7, the battery pack 20 includes the secondary batteries 21 to 26 including the usage history, and the battery pack 20 can be provided in which the difference in the deterioration degree of each of the multiple secondary batteries 21 to 26, which is determined based on the total capacity estimated by using the battery characteristic and the initial voltage that is the open circuit voltage of the secondary batteries 21 to 26 when the acquisition of the battery characteristic is started, is within a predetermined range. In such a battery pack 20, the variation in the deterioration degree of the secondary batteries 21 to 26 included in the battery pack 20 becomes smaller, and thus the lifetime of the battery pack 20 as a rebuilt product can be extended and the quality improvement can be attempted.

In the present embodiment 7, as in the modified embodiment of the case of the embodiment 1, the deterioration degree determination unit 65 may determine the deterioration degree of the secondary batteries 21 to 26 based on the battery characteristic and the initial voltage acquired by the battery characteristic acquisition unit 63 without estimating the total capacity. The battery characteristic acquisition unit 63 may acquire the absolute value of the acquired value as the battery characteristic, and the deterioration degree determination unit 65 may determine the deterioration degree based on the corresponding absolute value. The deterioration degree determination unit 65 may determine the deterioration degree of the secondary batteries 21 to 26 based on the difference in the battery characteristic acquired by the battery characteristic acquisition unit 63. The battery pack 20 may be assembled by classifying the secondary batteries 21 to 26 into classes such that the difference between the deterioration degree and the deterioration degree of the secondary batteries 21 to 26 is within a predetermined range.

Figure 27:
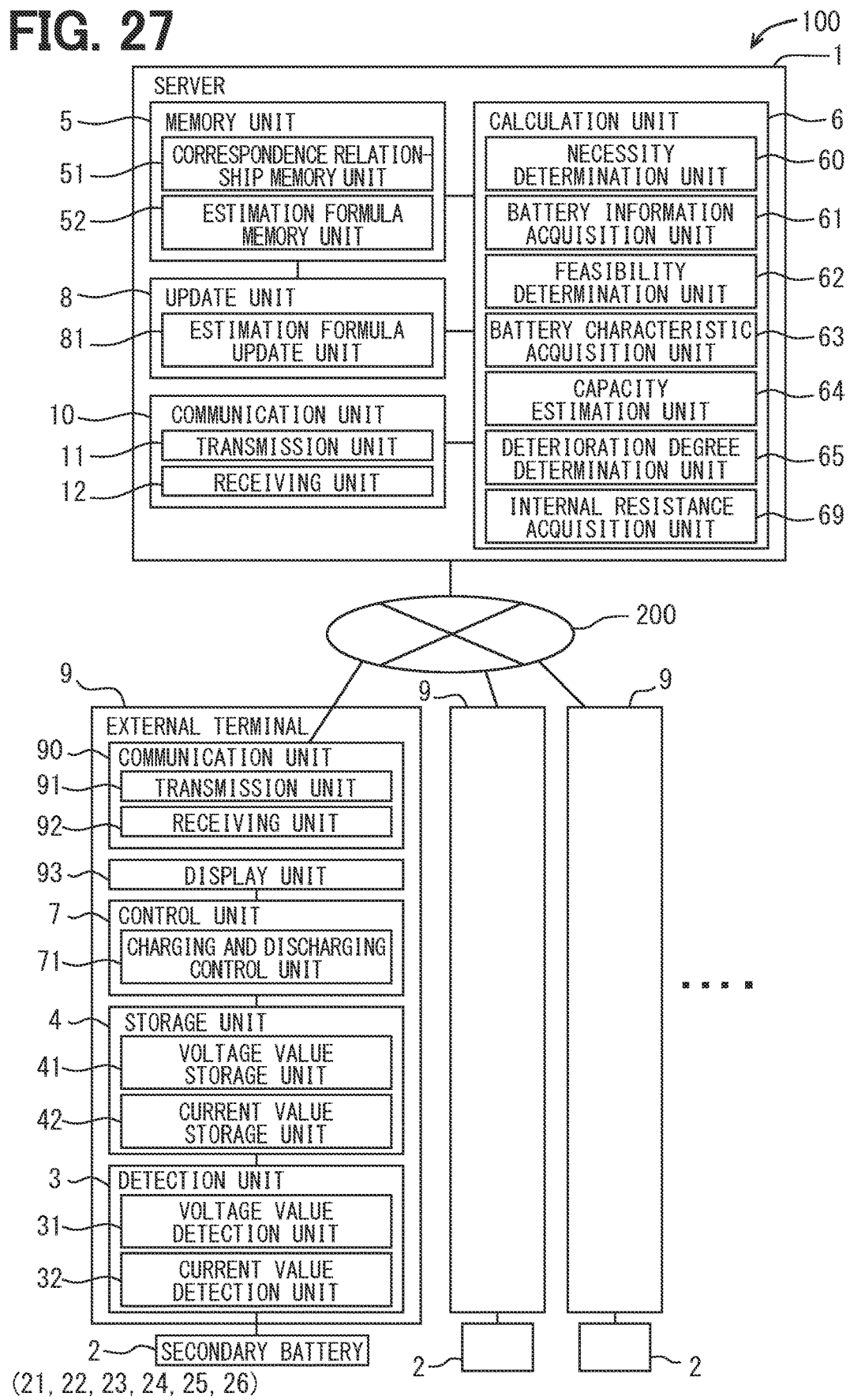
FIG. 27 is a conceptual diagram showing a configuration of a deterioration degree determination system in a modified embodiment 13.

As another modified embodiment 13, as shown in FIG. 27, the calculation unit 6 may have an internal resistance acquisition unit 69 that acquires the internal resistance of the secondary batteries 21 to 26, and the correspondence relationship memory unit 51 may store in advance the correspondence relationship among the internal resistance, the battery characteristic, and the total capacity. In the internal resistance acquisition unit 69, the internal resistance can be calculated and acquired from the measured voltage, which is the voltage value itself detected by the voltage value detection unit 31, the open circuit voltage of the secondary batteries 21 to 26, and the current flowing through the secondary batteries 21 to 26. The open circuit voltage of the secondary battery 2 can be estimated and acquired for each time by using a map showing the correspondence relationship between the residual discharge amount and the initial voltage of the secondary batteries 21 to 26. According to the deterioration degree determination system 100 of the thirteenth present modified embodiment, the deterioration degree of the secondary batteries 21 to 26 is determined also in consideration of the internal resistance in addition to the battery characteristic, and thus the determination accuracy can be further improved with a simple configuration.

Embodiment 8

Figure 28:
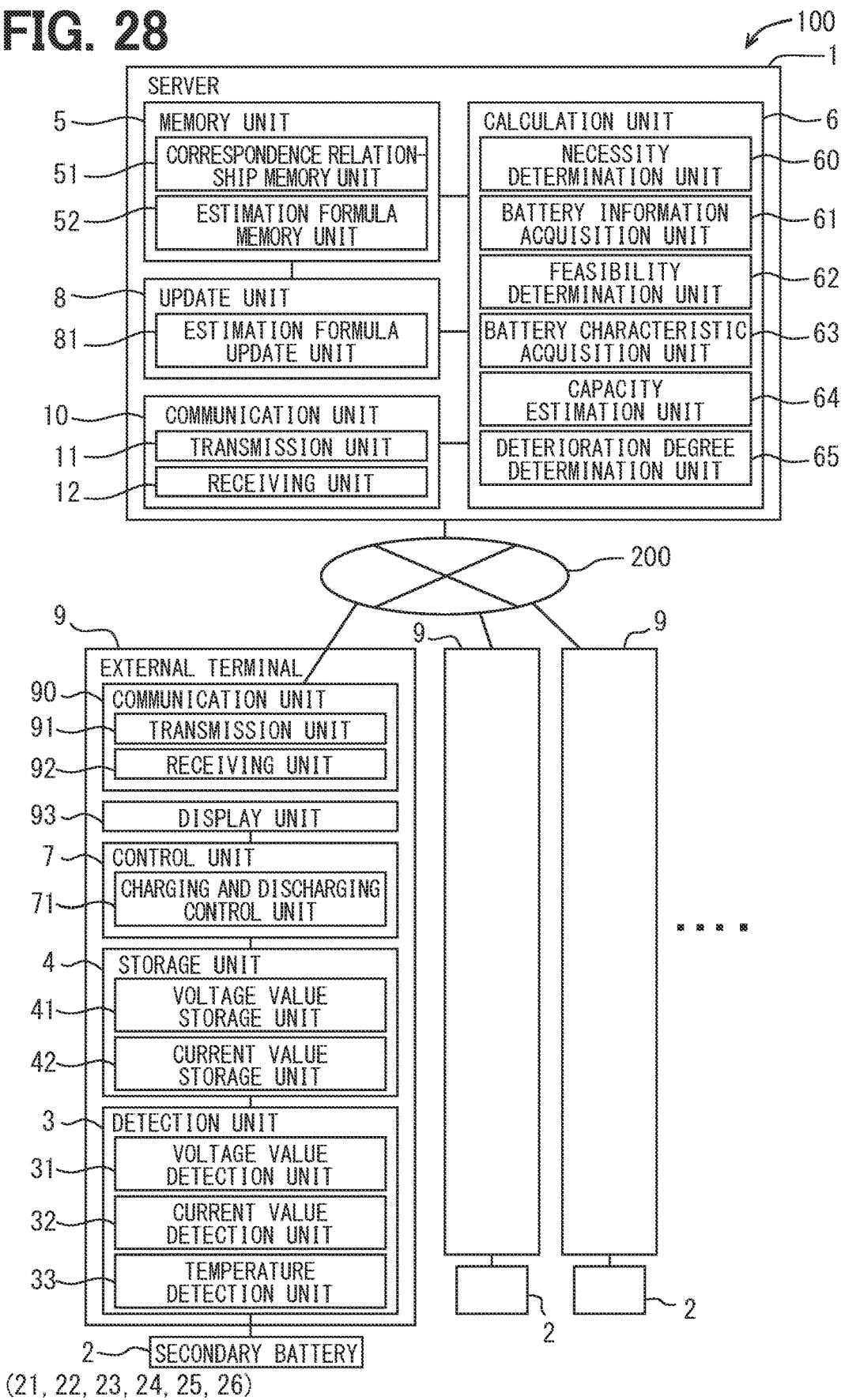
FIG. 28 is a conceptual diagram showing a configuration of a deterioration degree determination system in an embodiment 8.

The deterioration degree determination system 100 of the present embodiment 8 includes a temperature detection unit 33 as shown in FIG. 28 in addition to the configuration of the embodiment 1 shown in FIG. 1. In the above-described embodiment 1, the battery characteristic acquisition unit 63 is configured to acquire the discharging voltage characteristic based on the voltage transition of the secondary battery 2 in the predetermined voltage section Vs as the battery characteristic, but in the present embodiment 8, instead of the above-mentioned, the battery characteristic acquisition unit 63 acquires the temperature characteristic based on the temperature transition of the secondary battery 2 in predetermined voltage sections VsA and VsB as the battery characteristic. Other configurations are the same as those of the embodiment 1, and the same reference numerals are given to the same configurations of the embodiment 1, and the description thereof will be omitted. The voltage section VsA is a section in which the difference in the discharging voltage characteristic is remarkable according to the deterioration degree of the secondary battery 2, and the voltage section VsB is a section in which the difference in the charging voltage characteristic is remarkable according to the deterioration degree of the secondary battery 2.

Figure 29:
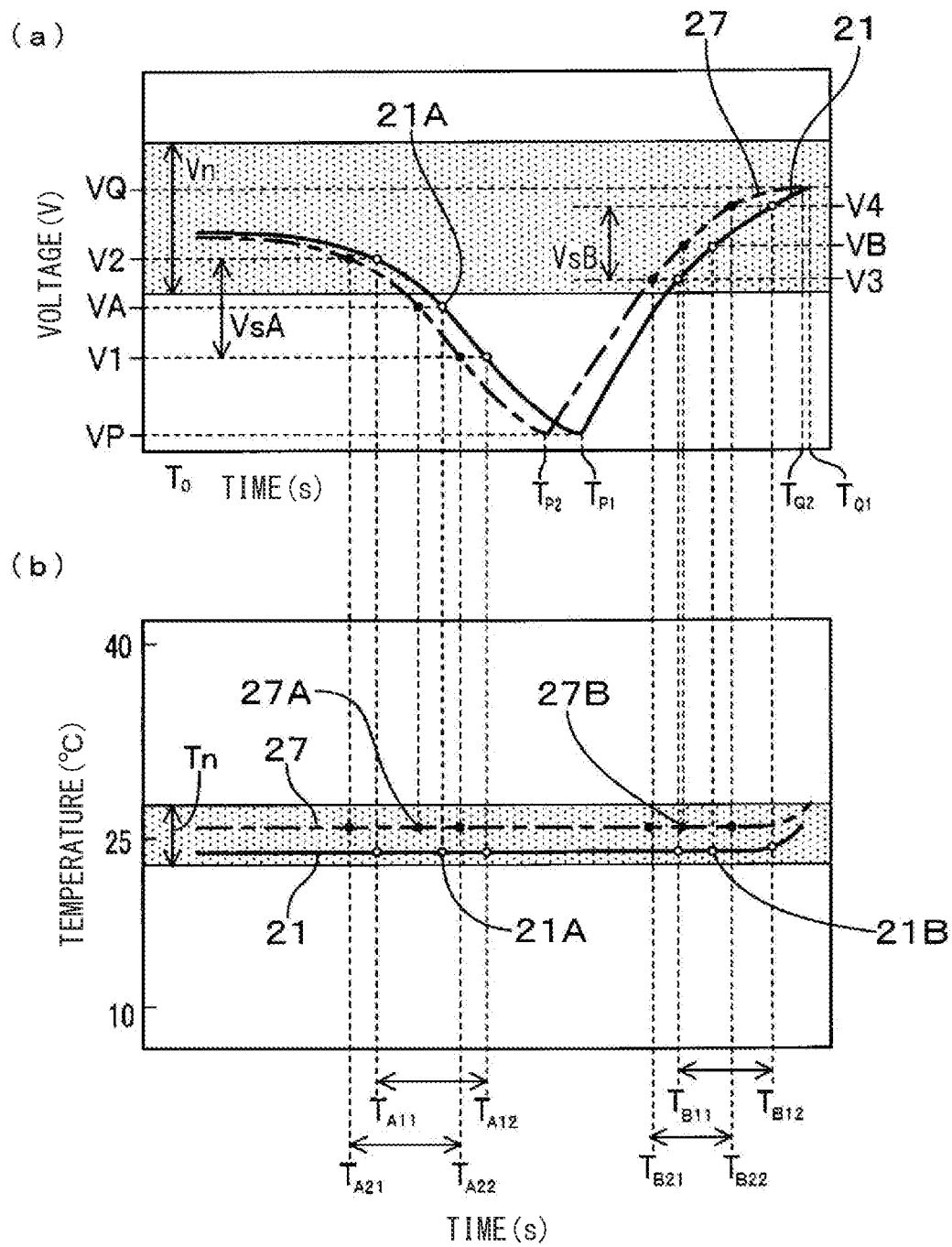
FIG. 29 is a conceptual diagram showing a battery characteristic in the embodiment 8.

In the present embodiment 8, as shown in (a) in FIG. 29 and (b) in FIG. 29, the temperature detection unit 33 acquires the temperature of the secondary battery 2 during charging and discharging. In the present embodiment 8, as the secondary battery 2 for which the determination of the deterioration degree is determined to be feasible, the first secondary battery 21 taken out from the battery pack 20 and the seventh secondary battery 27 taken out from another battery pack are adopted.

The temperature transition of the secondary battery 2 in charging and discharging may show different behaviors depending on the measurement environment and the soak state of the secondary battery 2 when the inserted battery packs are different. In the present embodiment 8, as shown in (b) in FIG. 29, the temperature transitions in the first secondary battery 21 and the seventh secondary battery 27 are within a measured room temperature setting range Tn, but show slightly different behaviors from each other. In the present embodiment 8, after the feasibility determination unit 62 determines that the determination of the deterioration degree is feasible, the battery characteristic acquisition unit 63 acquires the temperature characteristic in discharging and the temperature characteristic in charging based on the battery temperature detected by the temperature detection unit 33 in both the predetermined voltage section VsA during discharging and the predetermined voltage section VsB during charging after the discharging. The capacity estimation unit 64 estimates the total capacity of each of the secondary batteries 21 and 27 based on both temperature characteristics, and the deterioration degree determination unit 65 determines the deterioration degree.

The temperature characteristic acquired by the battery characteristic acquisition unit 63 can be, as in the case of calculating the discharging voltage characteristic in the case of the embodiment 1 and the case of calculating the charging voltage characteristic in the case of the embodiment 4, the differential value of the temperature change of the predetermined voltage VA and VB in the predetermined voltage sections VsA and VsB, the ratio of the temperature change between two points in the predetermined voltage sections VsA and VsB, and the ratio of the temperature change of the secondary battery 2 to the capacity change of the secondary battery 2 in the voltage sections VsA and VsB.

Also in the present embodiment 8, the same operation effect as in the case of the embodiment 1 can be obtained. In the present embodiment 8, the temperature characteristic is acquired in both discharging and charging but is not limited thereto, and only one of discharging and charging may be used.

According to the deterioration degree determination system 100 of the present embodiment 8, the battery pack includes the secondary battery having the usage history, and the battery pack can be provided in which the difference in the deterioration degree of each of the multiple secondary batteries, which is determined based on the total capacity estimated by using the battery characteristic including the temperature characteristic based on the temperature transition of the secondary battery in the predetermined voltage sections VsA and VsB, is within a predetermined range. In such a battery pack, the variation in the deterioration degree of the secondary battery included in the battery pack becomes smaller, and thus the quality improvement of the battery pack as a rebuilt product can be attempted.

Also in the present embodiment 8, the deterioration degree determination unit 65 may determine the deterioration degree of the secondary batteries 21 to 26 based on the temperature characteristic acquired by the battery characteristic acquisition unit 63 without estimating the total capacity. The battery characteristic acquisition unit 63 may acquire the absolute value of the acquired value as the temperature characteristic, and the deterioration degree determination unit 65 may determine the deterioration degree based on the corresponding absolute value. The deterioration degree determination unit 65 may determine the deterioration degree of the secondary batteries 21 to 26 based on the difference in the temperature characteristic acquired by the battery characteristic acquisition unit 63. The battery pack 20 may be assembled by classifying the secondary batteries 21 to 26 into classes such that the difference between the deterioration degree and the deterioration degree of the secondary batteries 21 to 26 is within a predetermined range.

Figure 30:
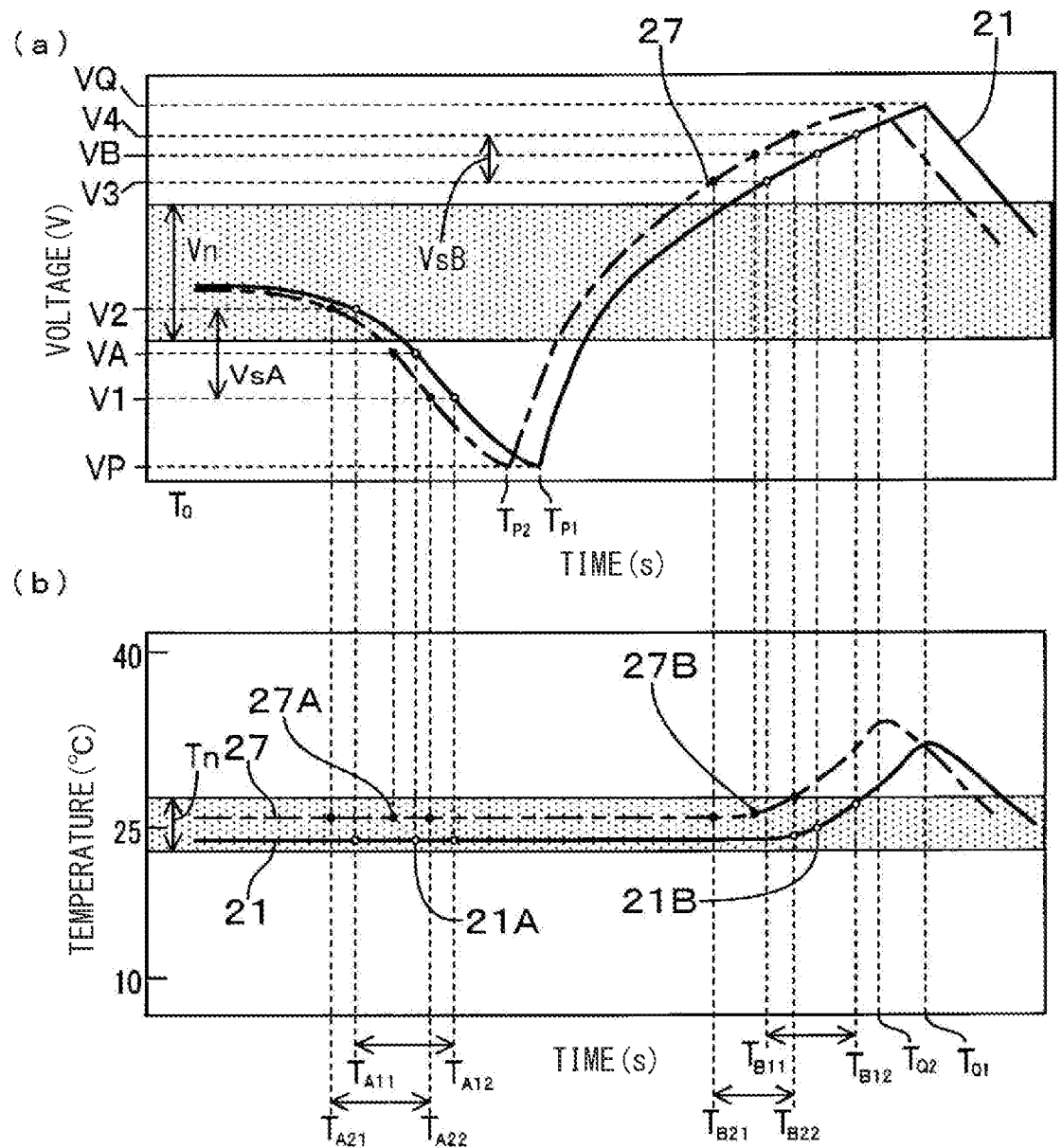
FIG. 30 is a conceptual diagram showing a battery characteristic in a modified embodiment 14.

In the present embodiment 8, as shown in (a) in FIG. 29, as the temperature characteristic at the charging time, the temperature characteristic is acquired when the charging target voltage VQ is within the normal use range Vn and the predetermined voltage section VsA is within the normal use range Vn, but instead of the above-mentioned, as in a modified embodiment 14 shown in (a) in FIG. 30, as the temperature characteristic at the charging time, the temperature characteristic may be acquired when the charging target voltage VQ exceeds the normal use range Vn and the predetermined voltage section VsB is in an area beyond the normal use range Vn. In this case, as shown in (b) in FIG. 30, the temperature of the secondary batteries 21 and 27 easily rises, and thus the deterioration degree is easily reflected in the temperature transition. As a result, the determination accuracy can be improved. In the fourteenth present modified embodiment, the secondary batteries 21 and 27 are charged to the charging target voltage VQ and then discharged to return the voltage of the secondary batteries 21 and 27 to the normal use range Vn.

Figure 31:
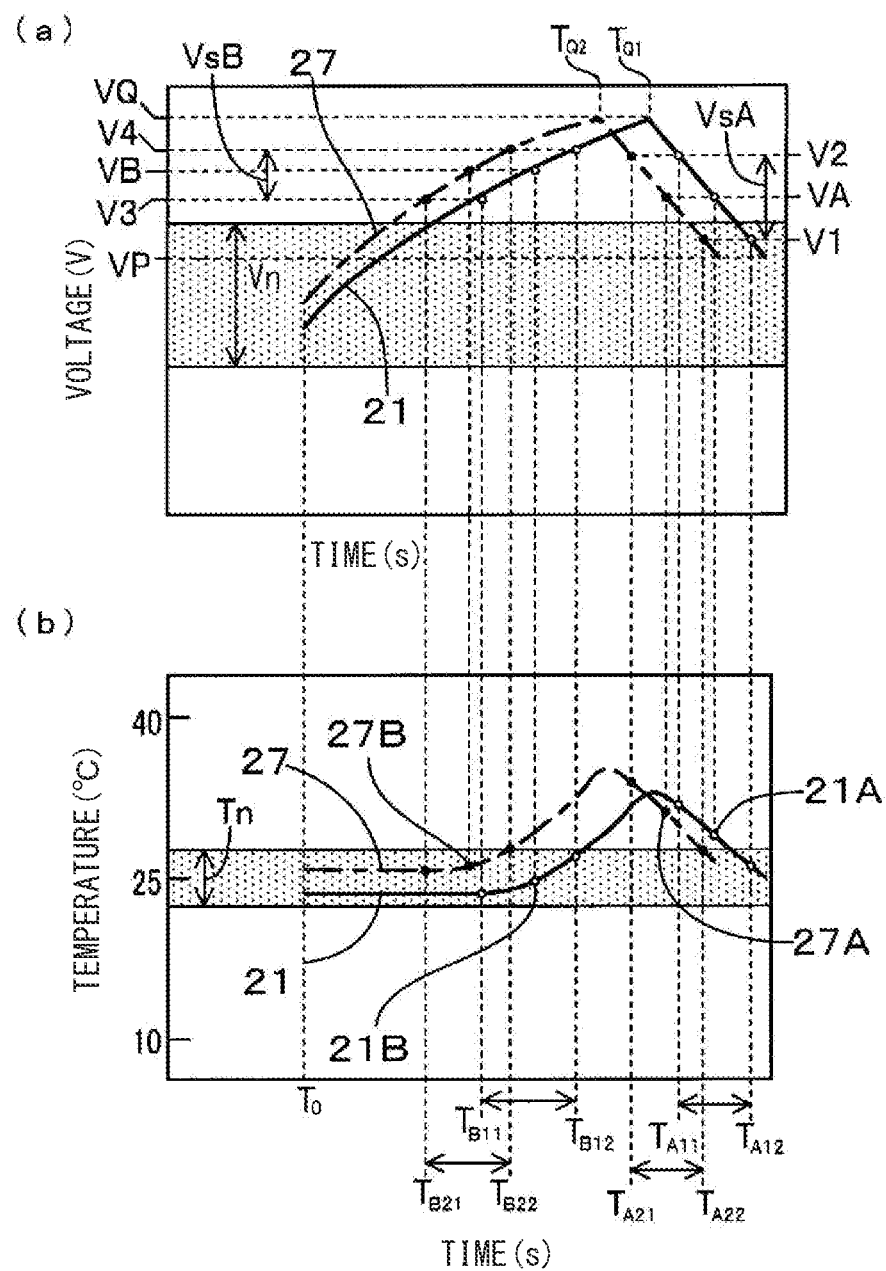
FIG. 31 is a conceptual diagram showing a battery characteristic in a modified embodiment 15.

In the modified embodiment 14, the secondary battery 2 is discharged, then charged, and then discharged again, but instead of the above-mentioned, as in a modified embodiment 15 shown in (a) in FIG. 31 and (b) in FIG. 31, the battery may be charged first and then discharged without first discharging. In this case, the battery characteristic acquisition unit 63 may acquire the charging time temperature characteristic at the charging time and then acquire the discharging time temperature characteristic at the discharging time. Also in this case, the same operation effect as the operation effect of the embodiment 1 is obtained.

Embodiment 9

Figure 32:
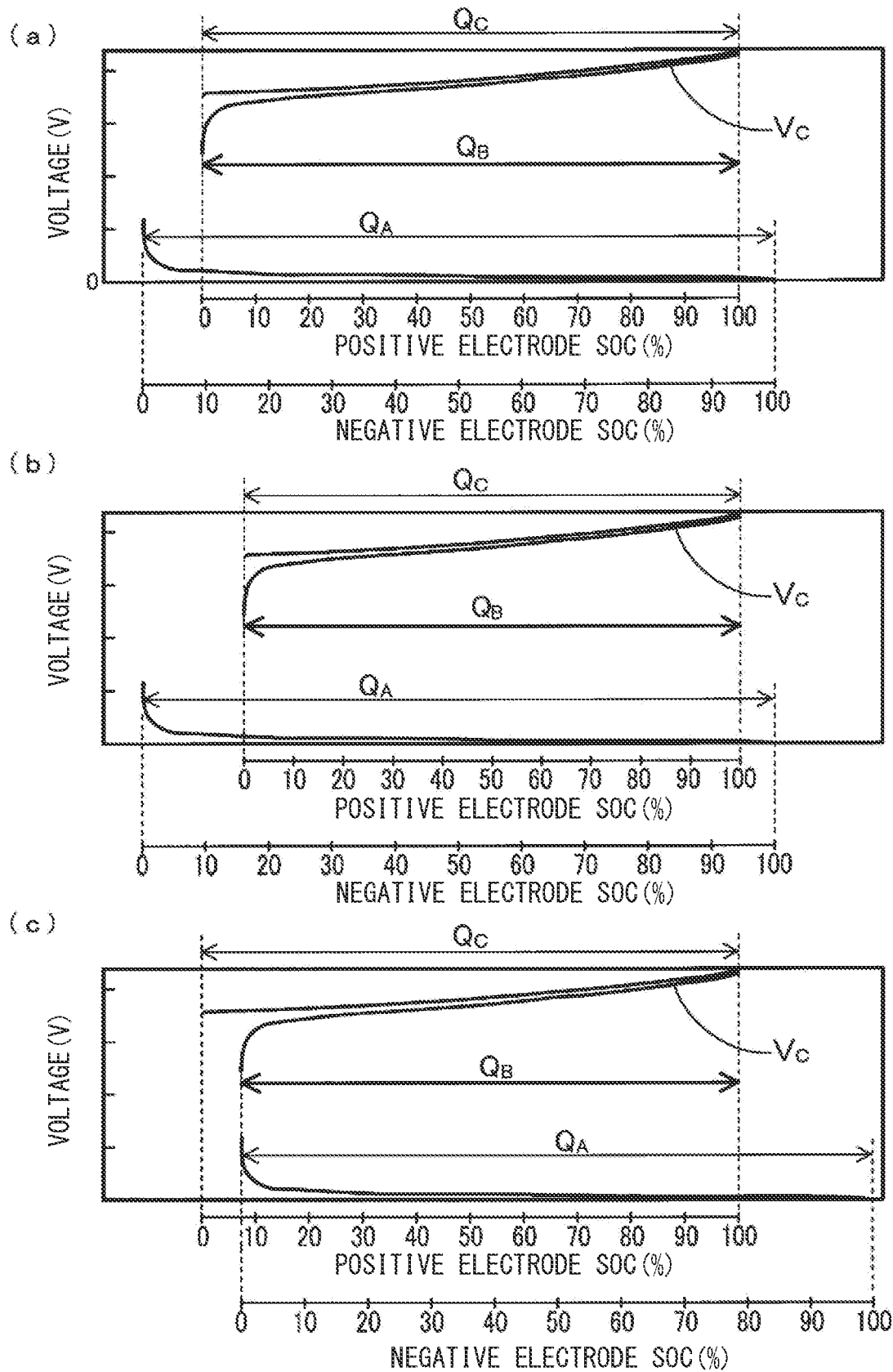
FIG. 32 is a conceptual diagram showing an SOC-OCV curve of a secondary battery in an embodiment 9.

In the above-described embodiment 1, the capacity estimation unit 64 as the estimation unit estimates the total capacity of the secondary battery 2 based on the battery characteristic acquired by the battery characteristic acquisition unit 63, but is not limited thereto, and the capacity estimation unit 64 may estimate at least one of the positive electrode capacity, the negative electrode capacity, the deviation amount of the relative relationship between the negative electrode SOC and the positive electrode SOC, the total capacity variation among the multiple cells forming the secondary batteries 21 to 26, and the battery resistance, positive electrode resistance, and negative electrode resistance of the secondary batteries 21 to 26. In the embodiment 9, the capacity estimation unit 64 estimates a positive electrode capacity Qc of each of the secondary batteries 21 to 26. The correspondence relationship memory unit 51 stores the correspondence relationship between the battery characteristic and the positive electrode capacity Qc. The form of the corresponding correspondence relationship and the method for creating the correspondence relationship are not particularly limited, and can be, for example, a calculation formula, a map, a graph, and a table, as in the case of the embodiment 1. The corresponding correspondence relationship can be created by machine learning using the measurement-purpose secondary battery 2, or created based on the actual measurement value obtained by performing an accelerated deterioration test by using the measurement-purpose secondary battery 2, or created by a calculation formula that logically derives the correspondence relationship between the battery characteristic and the total capacity in a predetermined voltage section by using the model of the secondary battery 2. In the present embodiment 9, the correspondence relationship memory unit 51, for example, stores the correspondence relationship between the battery characteristic and the positive electrode capacity Qc based on the prediction model shown in (a) to (c) in FIG. 32. Other configurations are the same as in the case of the embodiment 1, and the same reference numerals as those in the case of the embodiment 1 are assigned and the description thereof will be omitted.

Next, a method for determining the deterioration degree by the deterioration degree determination system 100 of the present embodiment 9 will be described below. The description of the same steps as in the case of the embodiment 1 shown in FIG. 5 may be omitted by using the same reference numerals.

Figure 33:
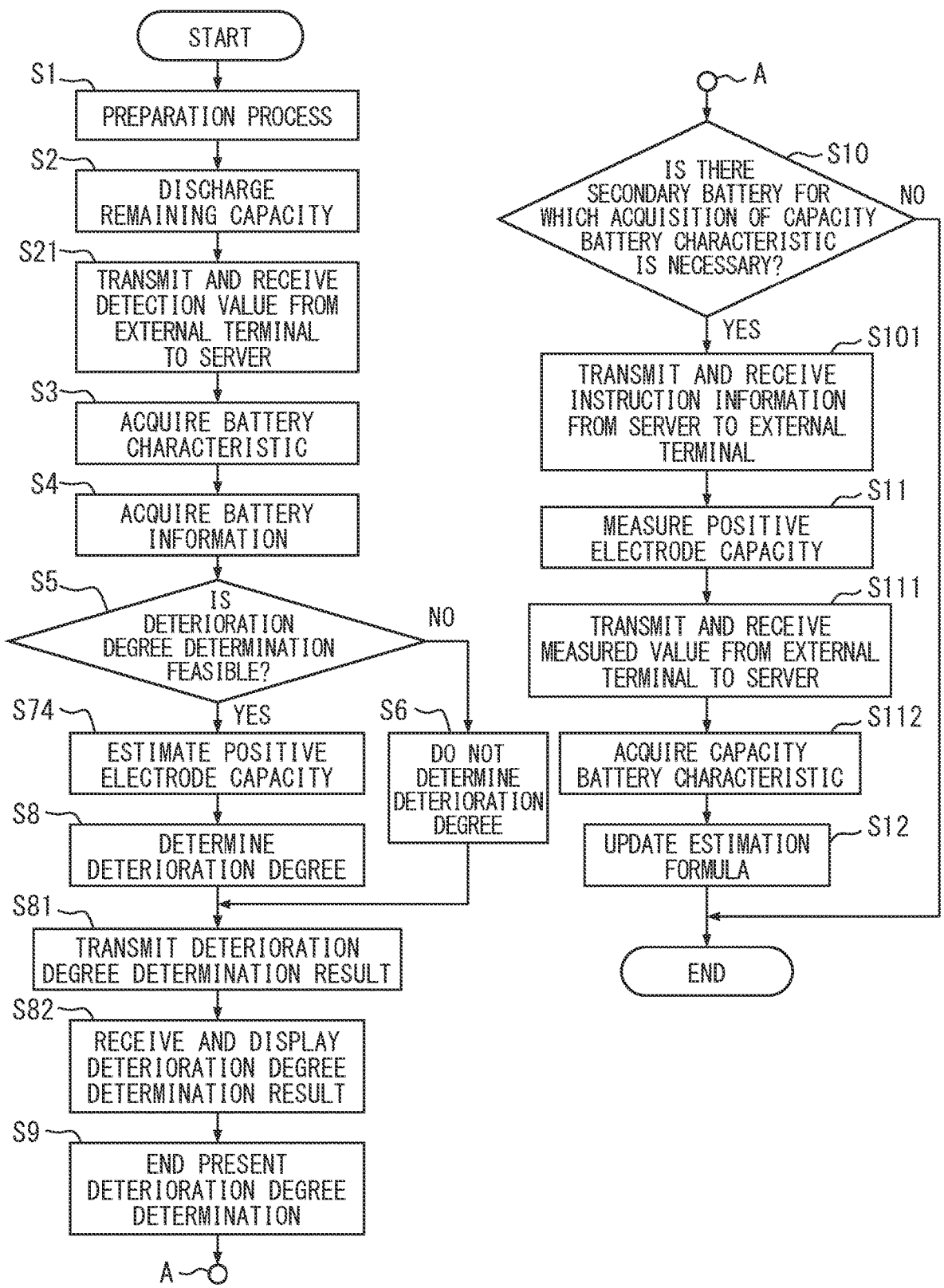
FIG. 33 is a flowchart showing a method for determining a deterioration degree of a secondary battery in an embodiment 9.

First, in the present embodiment 9, the steps S1 to S5 shown in FIG. 33 are performed as in the case of the embodiment 1 shown in FIG. 5. Accordingly, as shown in (a) in FIG. 34, the battery characteristic acquisition unit 63 acquires a discharging curve as the battery characteristic of each of the secondary batteries 21 to 26 in the predetermined voltage section Vs. The predetermined voltage section can be a section corresponding to a specific SOC range.

Next, in a step S74 shown in FIG. 33, the capacity estimation unit 64 estimates the positive electrode capacity Qc of the secondary batteries 21 to 26 from the discharging curve acquired by the battery characteristic acquisition unit 63 based on the correspondence relationship between the battery characteristic and the positive electrode capacity Qc based on the prediction model stored in the correspondence relationship memory unit 51. Thereafter, in the step S8 shown in FIG. 33, the deterioration degree determination unit 65 determines the deterioration degree of the secondary batteries 21 to 26 based on the positive electrode capacity Qc estimated by the capacity estimation unit 64. Other steps are performed as in the case of the embodiment 1 shown in FIG. 5. However, in the step S11 of the embodiment 1 shown in FIG. 5, the measured value of the capacity is acquired, and in the step S111, the corresponding measured value is transmitted from the external terminal 9 to the server 1, but in the present embodiment 9, the above-mentioned is replaced, such that in the step S11 shown in FIG. 33, the measured value of the positive electrode capacity Qc is acquired, and in the step S111, the corresponding measured value is transmitted from the external terminal 9 to the server 1. The present embodiment 9 also has the same operation effect as the operation effect of the embodiment 1.

Figure 34:
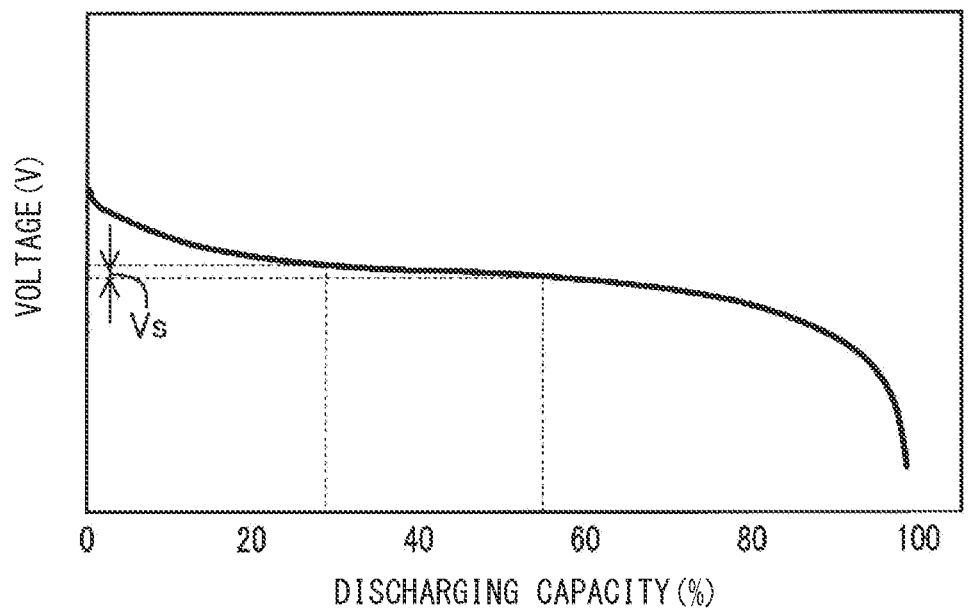
FIG. 34 is a conceptual diagram showing (a) a discharging curve of the secondary battery and (b) a charging curve of the secondary battery in the embodiment 9.
Figure 34:
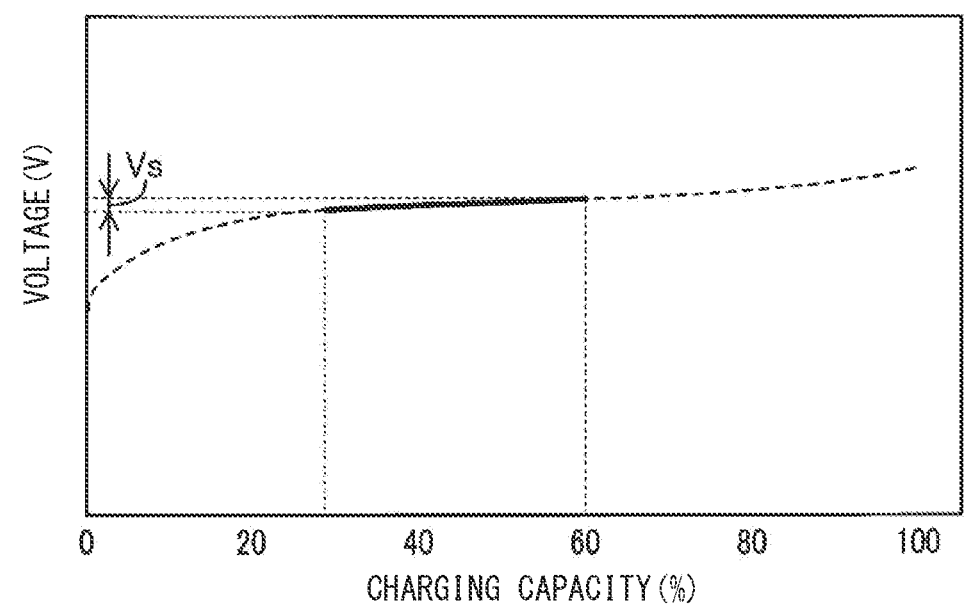

In the present embodiment 9, the battery characteristic acquisition unit 63 acquires the discharging curve shown in (a) in FIG. 34, but instead of the above-mentioned, may acquire the charging curve shown in (b) in FIG. 34. Also in this case, the same operation effect as the operation effect of the embodiment 1 is obtained.

Embodiment 10

Figure 35:
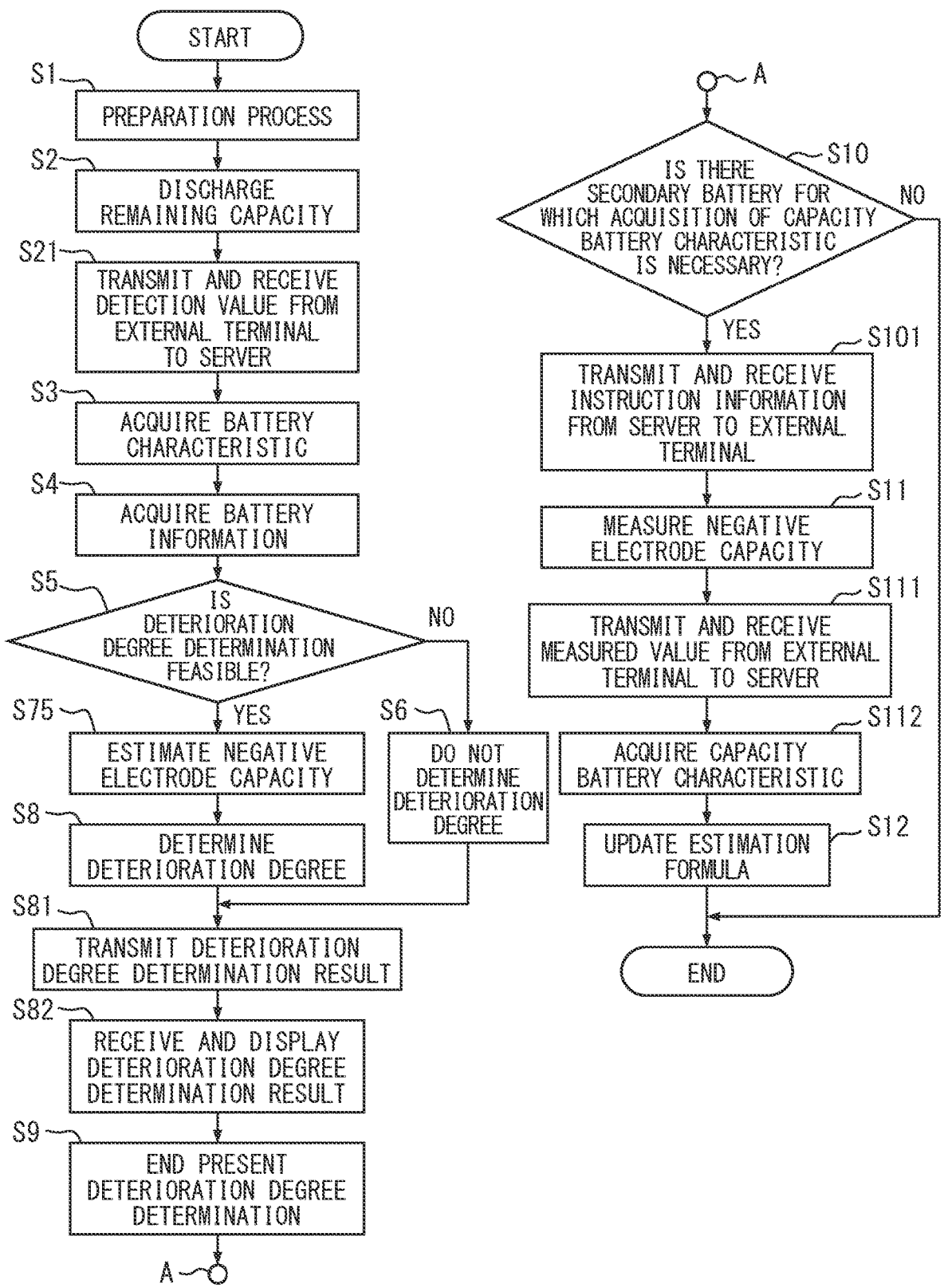
FIG. 35 is a flowchart showing a method for determining a deterioration degree of a secondary battery in an embodiment 10.

In the present embodiment 9, the capacity estimation unit 64 estimates the positive electrode capacity Qc, but instead of the above-mentioned, in the embodiment 10, the capacity estimation unit 64 estimates the negative electrode capacity QA. That is, in the embodiment 10, as shown in FIG. 35, in the steps S75, based on the prediction model shown in (a) to (c) in FIG. 32, the capacity estimation unit 64 estimates the negative electrode capacity QA of the secondary batteries 21 to 26 based on the correspondence relationship between the battery characteristic and the negative electrode capacity QA. Thereafter, in the step S8 shown in FIG. 35, the deterioration degree determination unit 65 determines the deterioration degree of the secondary batteries 21 to 26 based on the negative electrode capacity QA estimated by the capacity estimation unit 64. Other steps are the same as in the embodiment 1, but in the step S11, the measured value of the negative electrode capacity QA is acquired, and in the step S111, the corresponding measured value is transmitted from the external terminal 9 to the server 1. The embodiment 10 also has the same operation effect as the operation effect of the embodiment 1.

Embodiment 11

In the present embodiment 11, the capacity estimation unit 64 estimates the deviation amount of the relative relationship between the negative electrode SOC and the positive electrode SOC of each of the secondary batteries 21 to 26. The correspondence relationship memory unit 51 stores the correspondence relationship between the battery characteristic and the deviation amount of in the relative relationship between the negative electrode SOC and the positive electrode SOC. The form of the corresponding correspondence relationship and the method for creating the correspondence relationship are not particularly limited, and can be as in the case of the embodiment 1.

Figure 36:
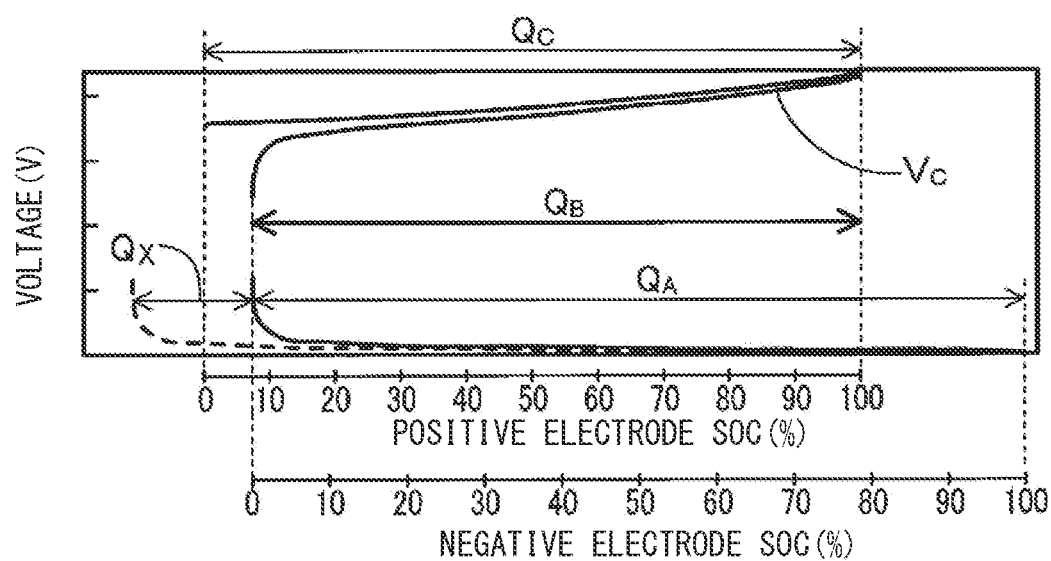
FIG. 36 is a conceptual diagram showing an SOC-OCV curve of a secondary battery in an embodiment 11.

For example, when the secondary batteries 21 to 26 are made of nickel-metal hydride batteries, as shown in FIG. 36, when hydrogen escapes from the reaction system in the battery container, the relative relationship between the negative electrode SOC and the positive electrode SOC deviates, and the OCV curve of the negative electrode deviates to the right side of the figure. For example, when the secondary batteries 21 to 26 are configured with lithium ion batteries, as shown in FIG. 36, the lithium in the electrolytic solution is consumed in the formation of the solid electrolyte interface (SEI) film, such that the relative relationship between the negative electrode SOC and the positive electrode SOC deviates, and thus the OCV curve of the negative electrode deviates to the right side of the figure.

In the present embodiment 11, based on the prediction model shown in FIG. 36, the correspondence relationship memory unit 51 stores the correspondence relationship between a deviation amount Qx of the relative relationship between the negative electrode SOC and the positive electrode SOC, and the battery characteristic. Other configurations are the same as in the case of the embodiment 1, and the same reference numerals as those in the case of the embodiment 1 are assigned and the description thereof will be omitted.

Figure 37:
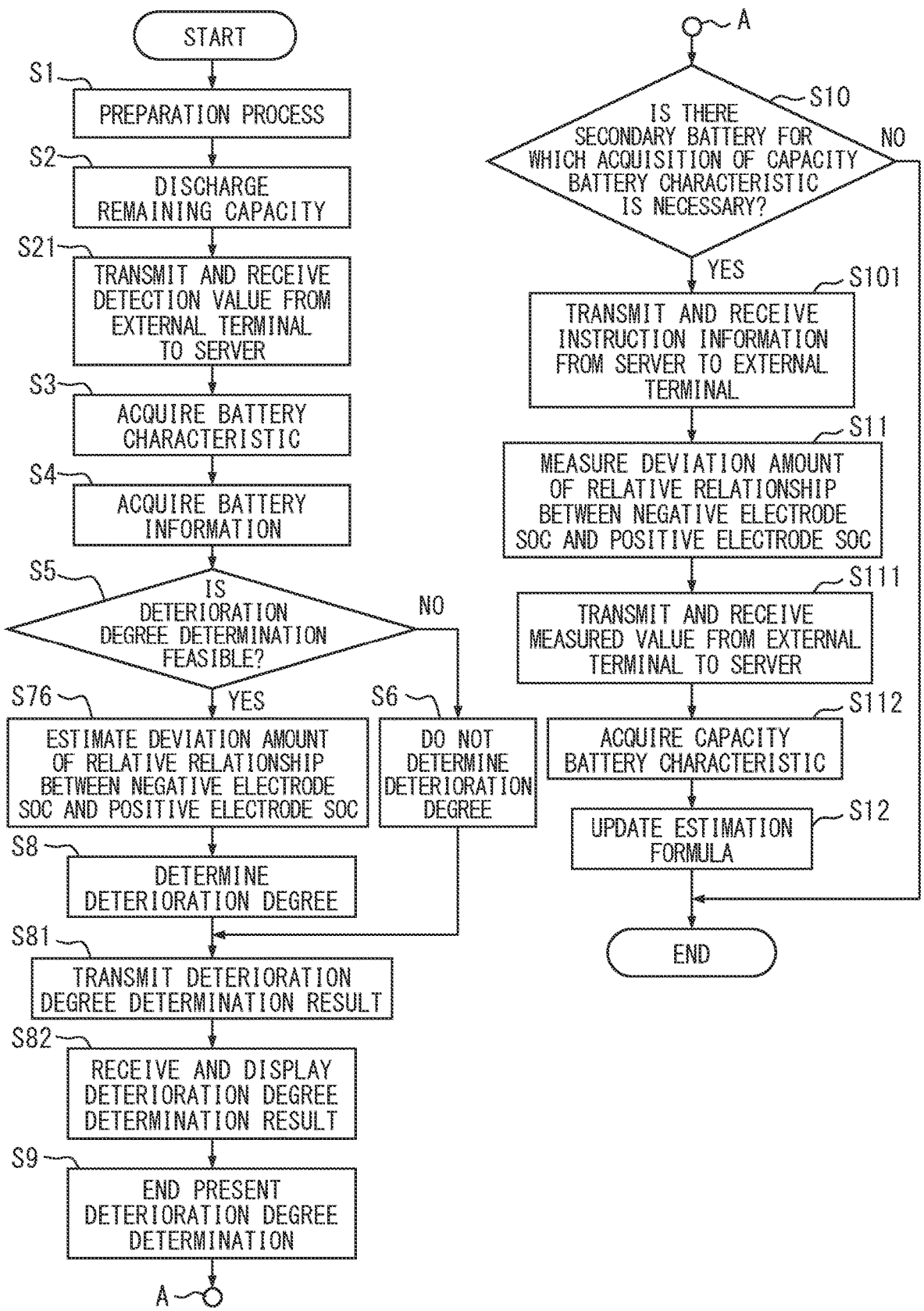
FIG. 37 is a flowchart showing a method for determining a deterioration degree of a secondary battery in an embodiment 12.

A method for determining the deterioration degree by the deterioration degree determination system 100 of the present embodiment 11 is performed as in the case of the above-mentioned embodiment 9, but as shown in FIG. 37, in the step S3, the battery characteristic acquisition unit 63 acquires, as the battery characteristic, a discharging curve of the predetermined voltage section Vs corresponding to a low SOC range as the battery. Thereafter, as in the case of the embodiment 1 shown in FIG. 5, the step S4 to the step S5 shown in FIG. 37 are performed. Thereafter, in a step S76, the capacity estimation unit 64 estimates the deviation amount Qx of the secondary batteries 21 to 26 based on the correspondence relationship between the battery characteristic calculated from the corresponding discharging curve, and the deviation amount Qx of the relative relationship between the negative electrode SOC and the positive electrode SOC stored in the correspondence relationship memory unit 51. Thereafter, in the step S8 shown in FIG. 37, the deterioration degree determination unit 65 determines the deterioration degree of the secondary batteries 21 to 26 based on the deviation amount Qx estimated by the capacity estimation unit 64. Other steps are the same as in the embodiment 1, but in the step S11, the measured value of the deviation amount Qx is acquired, and in the step S111, the corresponding measured value is transmitted from the external terminal 9 to the server 1. The embodiment 11 also has the same operation effect as the operation effect of the embodiment 1. In the present embodiment 11, the battery characteristic is acquired from a low SOC range as the battery, but instead of the above-mentioned, may be acquired from a high SOC range. In the present embodiment 11, the discharging curve is acquired as the battery characteristic, but the charging curve may be acquired.

Embodiment 12

In the present embodiment 12, the correspondence relationship memory unit 51 stores the correspondence relationship between the battery characteristic, and the amount of change of the discharging capacity in the charging and discharging curve for each of the secondary batteries 21 to 26, the capacity estimation unit 64 estimates the amount of change in the discharging capacity in the charging and discharging curve in the predetermined voltage section Vs, and the deterioration degree determination unit 65 detects whether the self-discharge amount of the cell increases based on the estimation result as the deterioration degree. In the present embodiment 12, other configurations are the same as in the case of the embodiment 1, and the same reference numerals as those in the case of the embodiment 1 are assigned and the description thereof will be omitted.

Figure 38:
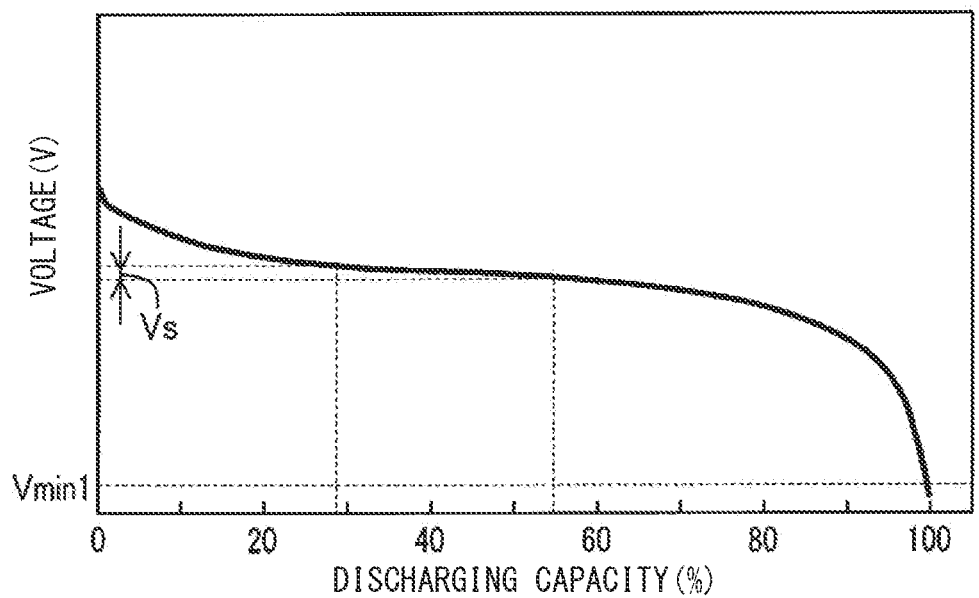
FIG. 38 is a conceptual diagram showing (a) a discharging curve of the secondary battery and (b) another discharging curve of the secondary battery in the embodiment 12.
Figure 38:
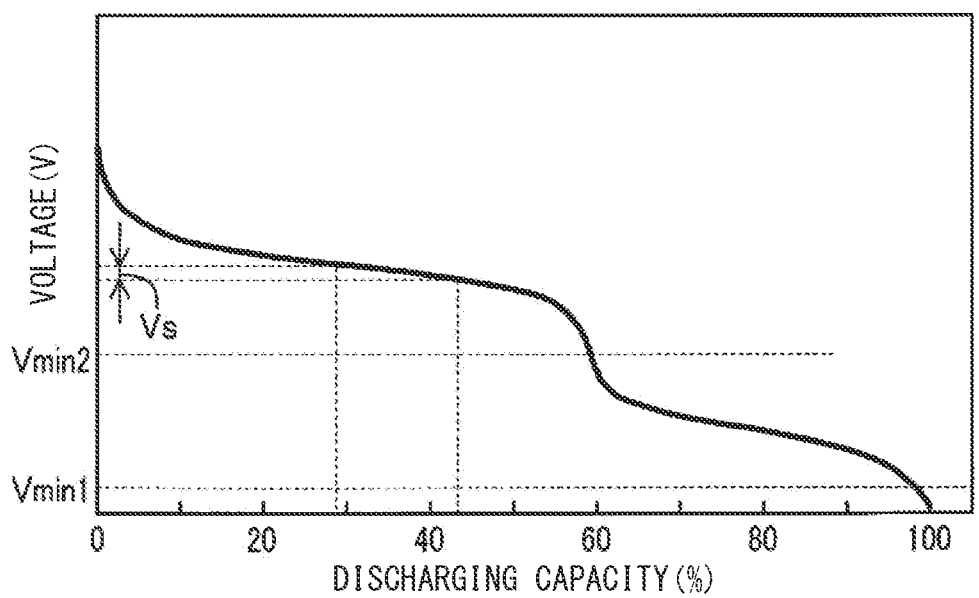

In the present embodiment 12, each of the secondary batteries 21 to 26 has six cells. For example, the discharging curve shown in (a) in FIG. 38 is stored in the correspondence relationship memory unit 51 as a discharging curve showing an initial state, and the discharging curve shown in (b) in FIG. 38 is stored in the correspondence relationship memory unit 51 as a discharging curve indicating that one of the cells has an increasing self-discharge amount. When the discharging curve shown in (a) in FIG. 38 is estimated by the capacity estimation unit 64 based on the battery characteristic of the predetermined voltage section Vs, the deterioration degree determination unit 65 determines that there is no cell having the increasing self-discharge amount. When the discharging curve shown in (b) in FIG. 38 is estimated by the capacity estimation unit 64 based on the battery characteristic of the predetermined voltage section Vs, the deterioration degree determination unit 65 determines that there is a cell having the increasing self-discharge amount. When the discharging curve shown in (b) in FIG. 38 is estimated, the use lower limit can be set to a second use lower limit Vmin2 that is a value higher than a first use lower limit Vmin1 that is for a case where there is no cell having an increasing self-discharge amount in the secondary battery. Accordingly, each cell can be prevented from being excessively discharged.

Embodiment 13

Figure 39:
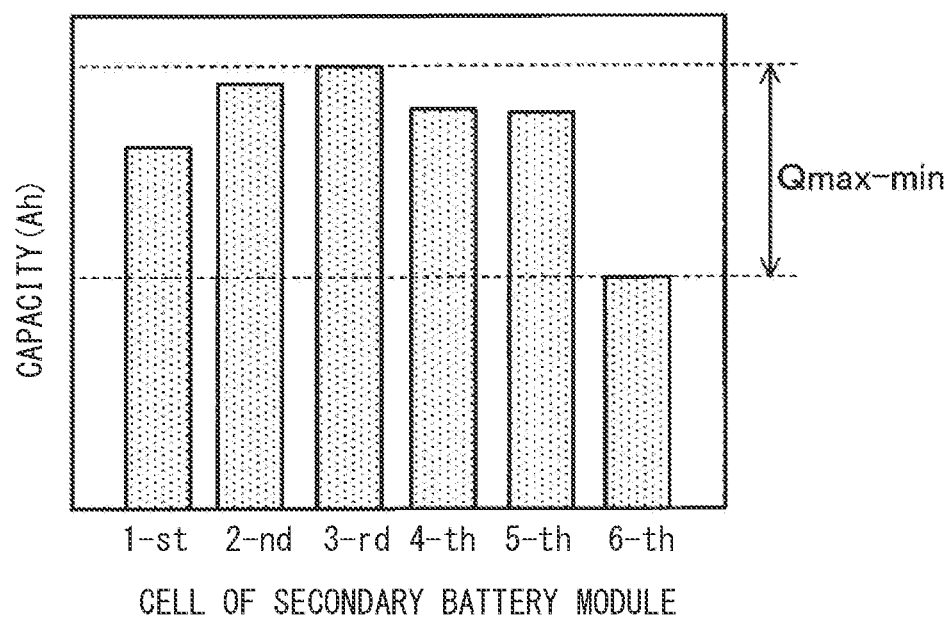
FIG. 39 is a conceptual diagram showing an example of an estimation result in an embodiment 13.

In the present embodiment 13, each of the secondary batteries 21 to 26 includes six cells. The correspondence relationship memory unit 51 stores the correspondence relationship between the total capacity variation between the cells in one of the secondary batteries 21 to 26 and the battery characteristic. The total capacity variation between the cells indicates the degree of variation in the total capacity of each cell in multiple cells included in one of the secondary batteries 21 to 26. In the present embodiment 13, as the total capacity variation between the cells, as shown in FIG. 39, a difference Qmax-min obtained by subtracting a minimum Qmin from a maximum Qmax in the total capacity of the multiple cells is adopted. Other configurations are the same as in the case of the embodiment 1, and the same reference numerals as those in the case of the embodiment 1 are assigned and the description thereof will be omitted.

In the present embodiment 13, the capacity estimation unit 64 estimates the difference Qmax-min from the correspondence relationship stored in the correspondence relationship memory unit 51 based on the battery characteristic acquired by the battery characteristic acquisition unit 63. The deterioration degree determination unit 65 detects the presence or absence of specific capacity deterioration of the cell based on the estimated difference Qmax-min. For example, when the estimated difference Qmax-min is determined to be equal to or greater than a predetermined value, determination is made that specific capacity deterioration occurs in one of the cells of the corresponding secondary batteries 21 to 26.

When the external terminal 9 is provided with the correspondence relationship memory unit 51, the capacity estimation unit 64, and the like as in the embodiment 2, instead of the step S7 in FIG. 15, the steps S74, S75, or S76 in the present embodiments 9 to 13 is performed, such that the same operation effect as the operation effect of the present embodiments 9 to 13 can be obtained.

Embodiment 14

Figure 40:
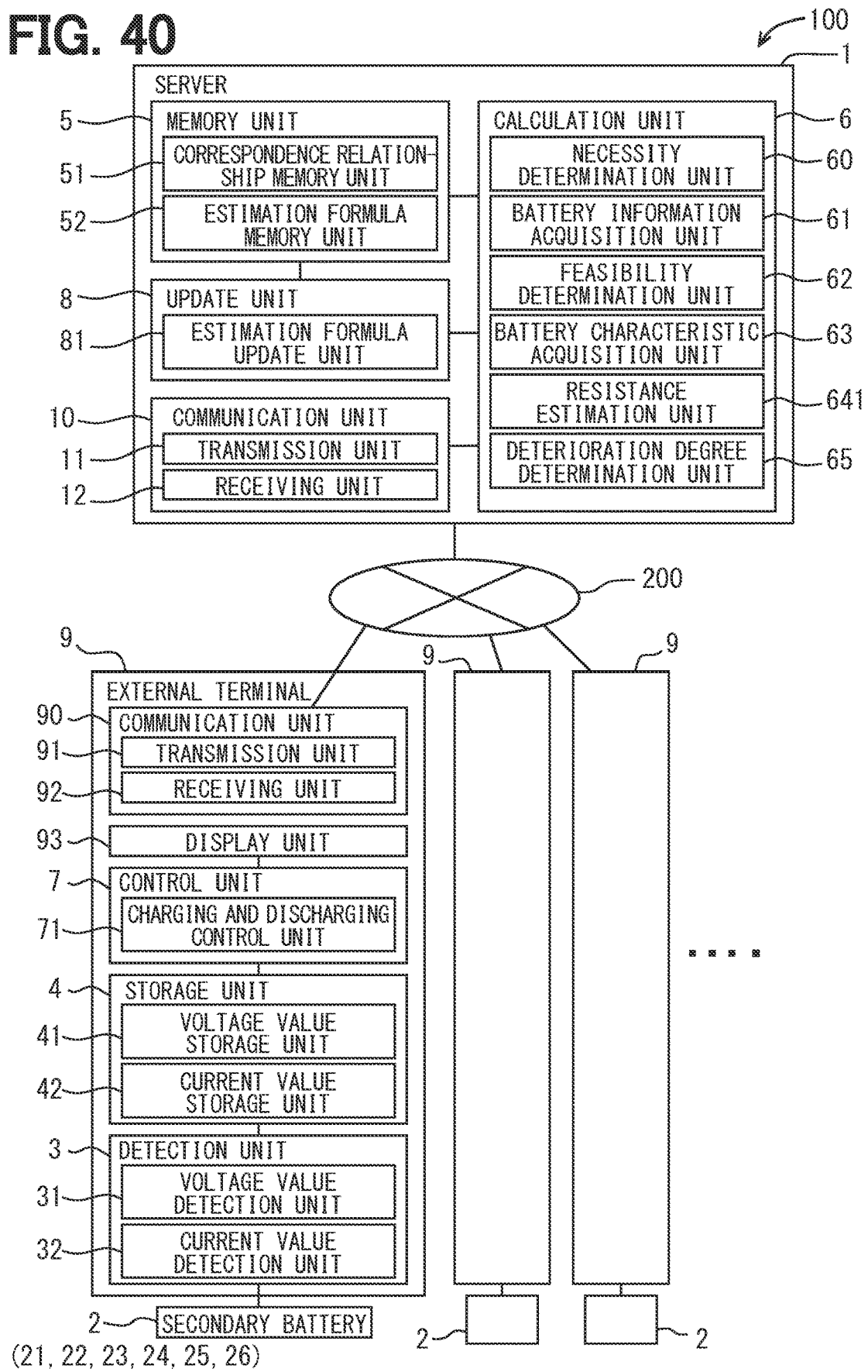
FIG. 40 is a conceptual diagram showing a configuration of a deterioration degree determination device in an embodiment 14.

In the embodiment 14, as shown in FIG. 40, a resistance estimation unit 641 is provided as the estimation unit instead of the capacity estimation unit 64 of the embodiment 1. The resistance estimation unit 641 estimates the internal resistance of the secondary batteries 21 to 26 based on the battery characteristic of the secondary batteries 21 to 26. The correspondence relationship memory unit 51 stores the correspondence relationship between the internal resistance and the battery characteristic of one of the secondary batteries 21 to 26. The battery characteristic acquisition unit 63 can acquire the battery characteristic by performing pulse charging and discharging in a state of stack in which the secondary batteries 21 to 26 are connected to each other. The voltage section for acquiring the battery characteristic can be a predetermined voltage section corresponding to a specific SOC range.

When the temperature and SOC are different between the secondary batteries 21 to 26, the temperature and the voltage change during charging and discharging or the voltage change during the voltage relaxation after charging and discharging are acquired as the battery characteristic, and the resistance value can be estimated when the temperature and SOC are the same conditions. In this case, the correspondence relationship memory unit 51 stores the correspondence relationship between the internal resistance, the temperature, and the battery characteristic of one of the secondary batteries 21 to 26. The secondary batteries 21 to 26 may be individually charged and discharged to acquire the battery characteristic. In this case, it is not necessary to adjust the temperature and SOC to the same conditions, and the determination time can be shortened.

Figure 41:
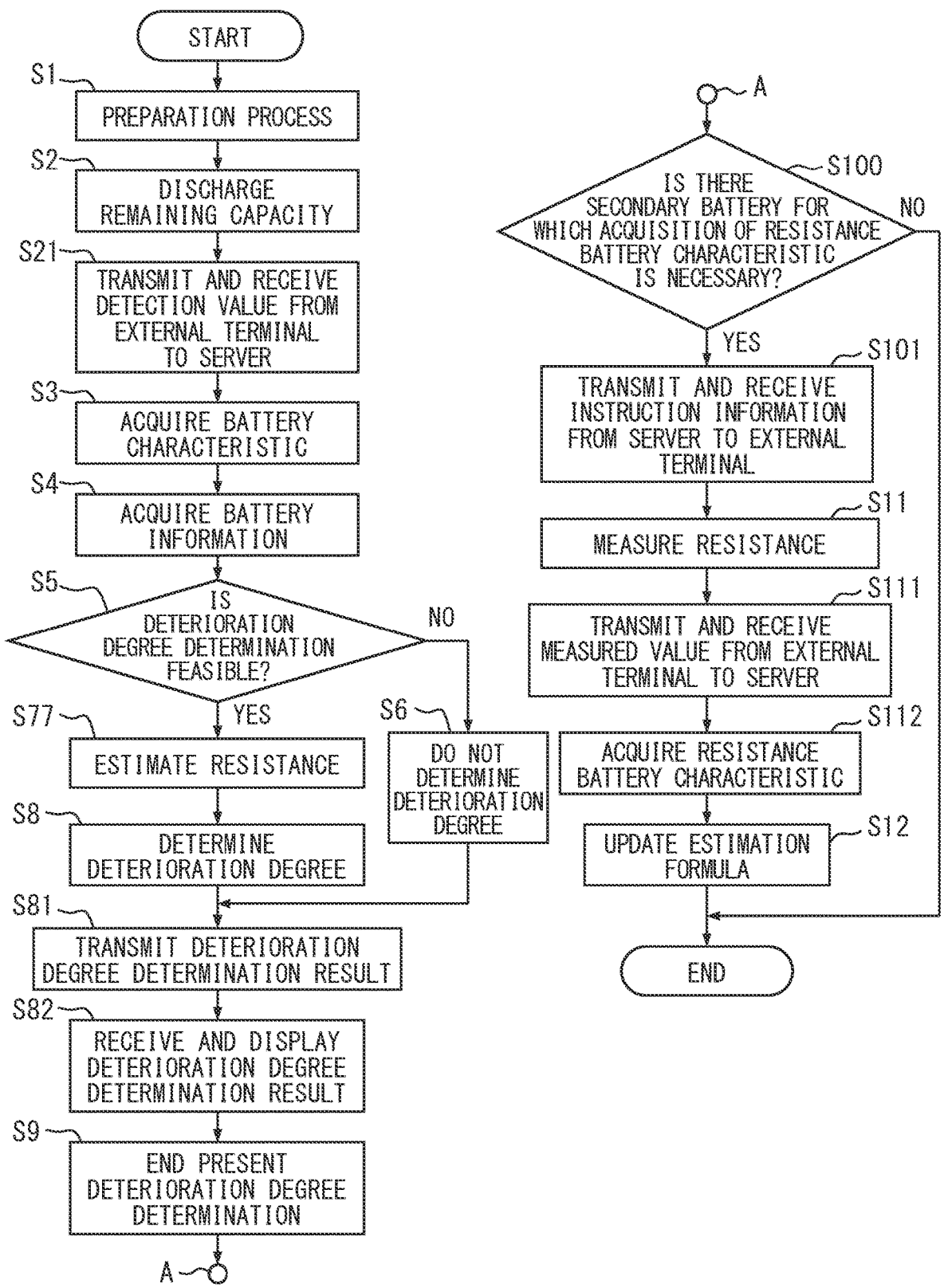
FIG. 41 is a flowchart showing a method for determining a deterioration degree of a secondary battery in the embodiment 14.

Next, a method for determining the deterioration degree by the deterioration degree determination system 100 of the present embodiment 14 will be described below. First, in the present embodiment 14, the steps S1 to S5 shown in FIG. 41 are performed as in the case of the embodiment 1 shown in FIG. 5. Next, in a step S77 shown in FIG. 41, the resistance estimation unit 641 acquires the internal resistance of the secondary batteries 21 to 26 from the battery characteristic acquired by the battery characteristic acquisition unit 63, based on the correspondence relationship between the battery characteristic and the internal resistance of the secondary batteries 21 to 26 stored in the correspondence relationship memory unit 51. Thereafter, in the step S8 shown in FIG. 41, the deterioration degree determination unit 65 determines the deterioration degree of the secondary batteries 21 to 26 based on the internal resistance estimated by the resistance estimation unit 641.

In the embodiment 1, in the step S10 shown in FIG. 5, the necessity determination unit 60 determines the necessity of acquiring the capacity battery characteristic as the battery characteristic, but in the present embodiment 14, instead of the above-mentioned, in a step S100 shown in FIG. 41, the necessity determination unit 60 determines the necessity of acquiring the resistance battery characteristic as the battery characteristic. The resistance battery characteristic refers to the battery characteristic of the secondary batteries 21 to 26 based on the resistance value in a predetermined state. Other steps are the same as in the embodiment 1, but in the step S11, the measured value of the internal resistance is acquired, and in the step S111, the corresponding measured value is transmitted from the external terminal 9 to the server 1. The embodiment 14 also has the same operation effect as the operation effect of the embodiment 1.

Embodiment 15

In the deterioration degree determination system 100 of the embodiment 15, the resistance estimation unit 641 estimates the negative electrode resistance of the secondary batteries 21 to 26, and the deterioration degree determination unit 65 determines the deterioration degree of the secondary batteries 21 to 26.

From the frequency characteristic in the voltage curve of the secondary batteries 21 to 26, the resistance value of the positive electrode, the negative electrode, and other battery elements in the secondary batteries 21 to 26 can be calculated. In nickel-metal hydride batteries and lithium ion batteries, the negative electrode resistance is remarkably reflected in the high frequency region in the voltage curve, and the positive electrode resistance is remarkably reflected in the low frequency region. In the present embodiment 15, nickel-metal hydride batteries are used as the secondary batteries 21 to 26, and the battery characteristic acquisition unit 63 acquires a voltage curve in a predetermined voltage section in a high frequency region as the battery characteristic. The correspondence relationship memory unit 51 stores in advance the correspondence relationship between the voltage curve in the high frequency region as the battery characteristic and the negative electrode resistance. The other configuration elements are the same as in the case of the embodiment 14, and the same reference numerals are given and the description thereof will be omitted.

In the internal resistance having a correlation with the deterioration degree of the secondary batteries 21 to 26, the dominant resistance element differs depending on the deterioration mode. First, the internal resistance of the secondary battery is determined by the relationship among the three resistance components of electronic resistance, reaction resistance, and the resistance of internal material transfer, and the secondary battery can be considered to be a series equivalent circuit of the three resistance components. In general, the electronic resistance is a resistance component mainly generated in the time region immediately after a constant current is applied to a battery. The reaction resistance is a resistance component mainly generated in the time region after the time region in which the electronic resistance is generated. The internal material transfer resistance is generated when a constant current is applied for a long time, and is a resistance component mainly generated in the time region after the time region of the reaction resistance. The negative electrode reaction resistance dominant area is a temporal area in which the ratio of the reaction resistance of the negative electrode in a discharging period among the above three resistance components is the largest. In the corresponding negative electrode reaction resistance dominant area, the reaction resistance of the negative electrode predominantly determines the internal resistance of the secondary battery 2. In the present embodiment 15, the deterioration degree determination unit 65 determines the deterioration degree of the secondary batteries 21 to 26 based on the negative electrode resistance estimated by the resistance estimation unit 641 in the corresponding negative electrode reaction resistance dominant area.

In a method for determining the deterioration degree by the deterioration degree determination system 100 of the present embodiment 15, the steps S1 to S5 shown in FIG. 41 are performed as in the case of the embodiment 14. In the step S77, the resistance estimation unit 641 estimates the negative electrode resistance of the secondary batteries 21 to 26 based on the voltage curve acquired by the battery characteristic acquisition unit 63 and the correspondence relationship stored in the correspondence relationship memory unit 51. The deterioration degree determination unit 65 determines the deterioration degree of the secondary batteries 21 to 26 from the estimated negative electrode resistance. Thereafter, in the step S8 shown in FIG. 41, the deterioration degree determination unit 65 determines the deterioration degree of the secondary batteries 21 to 26 based on the negative electrode resistance estimated by the resistance estimation unit 641. Other steps are the same as in the embodiment 1, but in the step S11, the measured value of the negative electrode resistance is acquired, and in the step S111, the corresponding measured value is transmitted from the external terminal 9 to the server 1. The embodiment 15 also has the same operation effect as the operation effect of the embodiment 1.

Embodiment 16

In the deterioration degree determination system 100 of the embodiment 16, the resistance estimation unit 641 estimates the positive electrode resistance of the secondary batteries 21 to 26, and the deterioration degree determination unit 65 determines the deterioration degree of the secondary batteries 21 to 26. In the present embodiment 16, nickel-metal hydride batteries are used as the secondary batteries 21 to 26, and the battery characteristic acquisition unit 63 acquires a voltage curve in a predetermined voltage section in a low frequency region as the battery characteristic. The correspondence relationship memory unit 51 stores in advance the correspondence relationship between the voltage curve as the battery characteristic and the positive electrode resistance. The deterioration degree determination unit 65 determines the deterioration degree of the secondary batteries 21 to 26 based on the positive electrode resistance estimated by the resistance estimation unit 641 in the positive electrode reaction resistance dominant area. The other configuration elements are the same as in the case of the embodiment 15, and the same reference numerals are given and the description thereof will be omitted.

In a method for determining the deterioration degree by the deterioration degree determination system 100 of the present embodiment 16, the steps S1 to S5 shown in FIG. 41 are performed as in the case of the embodiment 15. In the step S77, the resistance estimation unit 641 estimates the positive electrode resistance of the secondary batteries 21 to 26 based on the voltage curve acquired by the battery characteristic acquisition unit 63 and the correspondence relationship stored in the correspondence relationship memory unit 51. The deterioration degree determination unit 65 determines the deterioration degree of the secondary batteries 21 to 26 from the estimated positive electrode resistance. Thereafter, in the step S8 shown in FIG. 41, the deterioration degree determination unit 65 determines the deterioration degree of the secondary batteries 21 to 26 based on the internal resistance estimated by the resistance estimation unit 641. Other steps are the same as in the embodiment 1, but in the step S11, the measured value of the positive electrode resistance is acquired, and in the step S111, the corresponding measured value is transmitted from the external terminal 9 to the server 1. The embodiment 16 also has the same operation effect as the operation effect of the embodiment 1.

When the resistance estimation unit 641 is provided instead of the capacity estimation unit 64 in the external terminal 9 of the embodiment 2 and the correspondence relationship memory unit 51 and the like is provided in the external terminal 9, instead of the step S7 in FIG. 15, the step S77 in the present embodiments 14 to 16 is performed, such that the same operation effect as the operation effect of the present embodiments 14 to 16 can be obtained.

The present disclosure is not limited to each of the above embodiments, and can be applied to various embodiments without departing from the gist thereof.

Although the present disclosure has been described in accordance with the embodiments, it is understood that the present disclosure is not limited to such embodiments or structures. The present disclosure also includes various modified embodiments and a modification within an equivalent scope. Various combinations or forms as well as other combinations or forms including only one element, one or more elements, or one or fewer elements, fall within the scope or the spirit of the present disclosure.

The server 1, the external terminal 9 or the method described in the present disclosure may be implemented by a special purpose computer, which includes a memory and a processor programmed to execute one or more special functions implemented by computer programs of the memory. Alternatively, the server 1, the external terminal 9 or the method described in the present disclosure may be implemented by a dedicated computer configured as a processor with one or more dedicated hardware logic circuits. Alternatively, the server 1, the external terminal 9 or the method thereof described in the present disclosure may be implemented by one or more dedicated computers configured by a combination of a processor and a memory programmed to execute one or multiple functions and a processor configured by one or more hardware logic circuits. The computer program may also be stored in a computer readable non-transitory tangible storage medium as computer executable instructions. The server 1, the external terminal 9 or the method thereof described in the present disclosure does not necessarily need to include software, and all the functions may be implemented using one or more hardware circuits.

Multiple functions of one configuration element in the above embodiments may be implemented by multiple configuration elements, or a single function of one configuration element may be implemented by multiple configuration elements. Multiple functions of multiple configuration elements in the above embodiments may be implemented by one configuration element, or one function implemented by multiple configuration elements may be implemented by one configuration element. A part of the configurations of the above embodiments may be omitted as appropriate. At least a part of the configuration in one embodiment may be added to or substituted for the configuration of another embodiment.

In addition to the above, the present disclosure can be implemented in various forms, such as a system, a program that controls a computer to function as described above, a non-transitory tangible storage medium, such as a semiconductor memory in which the above-described program is recorded, and a deterioration degree determination method.

What is claimed is:

1. A server for a deterioration degree determination system that determines a deterioration degree for a secondary battery, the server comprising:
   an estimation formula memory unit that stores an estimation formula for determining the deterioration degree based on a battery characteristic related to transition of a battery state over a predetermined voltage section in the secondary battery or a battery characteristic relationship value related to the battery characteristic, and a battery characteristic acquisition reference that is a reference of necessity determination of acquiring the battery characteristic of the secondary battery prepared in advance;
   an update unit that updates the estimation formula stored in the estimation formula memory unit based on the battery characteristic related to the transition of the battery state of the secondary battery acquired by charging and discharging the secondary battery in an external terminal;
   a necessity determination unit that determines necessity of acquiring the battery characteristic for each secondary battery based on a comparison result between battery information including information related to the secondary battery and the battery characteristic acquisition reference;
   a transmission unit that transmits instruction information indicating acquisition of the battery characteristic of the secondary battery to the external terminal based on a determination result of the necessity determination unit; and
   a receiving unit that receives acquired information acquired by the external terminal that has received the instruction information or the battery characteristic of the secondary battery based on the acquired information, from the external terminal, wherein
   the update unit updates the estimation formula by using the battery characteristic of the secondary battery based on the acquired information received by the receiving unit.

2. The server for a deterioration degree determination system for a secondary battery according to claim 1, wherein the update unit updates the battery characteristic acquisition reference by using the battery characteristic of the secondary battery based on the acquired information received by the receiving unit.

3. The server for a deterioration degree determination system for a secondary battery according to claim 1, wherein the necessity determination unit is configured to determine feasibility of deterioration degree determination of the secondary battery based on the battery characteristic acquisition reference, and is defined to determine that acquisition of the battery characteristic of the secondary battery for which the deterioration degree determination is determined to be infeasible is necessary.

4. The server for a deterioration degree determination system for a secondary battery according to claim 1, wherein the transmission unit transmits the instruction information when the number of the secondary battery for which the acquisition of the battery characteristic is determined to be necessary reaches a predetermined number by the necessity determination unit.

5. The server for a deterioration degree determination system for a secondary battery according to claim 1, wherein the necessity determination unit determines the necessity after a predetermined period of time has elapsed from a previous update performed by the update unit.

6. The server for a deterioration degree determination system for a secondary battery according to claim 1, the server further comprising:
   a deterioration degree determination unit that compares the estimation formula with the battery characteristic or the battery characteristic relationship value and determines the deterioration degree of the secondary battery based on a comparison result, wherein
   the transmission unit transmits a determination result by the deterioration degree determination unit to the external terminal.

7. The server for a deterioration degree determination system for a secondary battery according to claim 1, wherein the transmission unit transmits the estimation formula updated by the update unit to the external terminal.

8. An external terminal for a deterioration degree determination system for a secondary battery including a server for deterioration degree determination in which an estimation formula for determining a deterioration degree of the secondary battery is stored, the external terminal comprising:
- a battery characteristic acquisition unit that acquires a battery characteristic related to transition of a battery state over a predetermined voltage section in the secondary battery;
- an estimation formula memory unit that stores the estimation formula for determining the deterioration degree of the secondary battery based on the battery characteristic related to the transition of the battery state over the predetermined voltage section in the secondary battery or a battery characteristic relationship value related to the battery characteristic;
- a transmission unit that transmits the battery characteristic acquired by the battery characteristic acquisition unit or the battery characteristic relationship value related to the battery characteristic to the server;
- a receiving unit that receives update information related to an update of the estimation formula transmitted from the server; and
- a necessity determination unit that determines necessity of acquiring the battery characteristic for each secondary battery based on a comparison result of battery information containing information related to the secondary battery and the battery characteristic acquisition reference.

9. The external terminal for a deterioration degree determination system for a secondary battery according to claim 8, the external terminal further comprising:
- an update unit that updates the estimation formula stored in the estimation formula memory unit based on the update information received by the receiving unit;
- a deterioration degree determination unit that compares the estimation formula with the battery characteristic or the battery characteristic relationship value and determines the deterioration degree of the secondary battery based on a comparison result; and
- a display unit that displays a determination result by the deterioration degree determination unit.

10. A deterioration degree determination system for a secondary battery, comprising:
- a server; and
- an external terminal, wherein
the deterioration degree determination system comprises:
- an estimation formula memory unit that is provided in at least one of the server and the external terminal, and stores an estimation formula for determining deterioration degree of the secondary battery based on a battery characteristic related to transition of a battery state over a predetermined voltage section in the secondary battery or a battery characteristic relationship value related to the battery characteristic, and a battery characteristic acquisition reference that is a reference of necessity determination of acquiring the battery characteristic of the secondary battery prepared in advance;
- a battery characteristic acquisition unit that is provided in the external terminal, and acquires from the secondary battery the battery characteristic related to the transition of the battery state over the predetermined voltage section in the secondary battery;
- a deterioration degree determination unit that is provided in at least one of the server and the external terminal, and determines the deterioration degree of the secondary battery based on a comparison result between the estimation formula and the battery characteristic or the battery characteristic relationship value;
- a necessity determination unit that is provided in at least one of the server and the external terminal, and determines necessity of acquiring the battery characteristic for each secondary battery based on a comparison result between battery information including information related to the secondary battery and the battery characteristic acquisition reference; and
- an update unit that is provided in the server, and causes to update the estimation formula stored in the estimation formula memory unit based on the battery characteristic related to the transition of the battery state of the secondary battery acquired by charging and discharging the secondary battery in the external terminal.

11. The deterioration degree determination system for a secondary battery according to claim 10, wherein
the estimation formula memory unit, the necessity determination unit and the deterioration degree determination unit are provided in the server,
the deterioration degree determination system further comprising:
- a transmission unit that is provided in the server and transmits instruction information indicating acquisition of the battery characteristic of the secondary battery to the external terminal based on a determination result of the necessity determination unit; and
- a receiving unit that receives acquired information acquired by the external terminal that has received the instruction information or the battery characteristic of the secondary battery based on the acquired information, from the external terminal, wherein
the update unit causes to update the estimation formula by using the battery characteristic of the secondary battery based on the acquired information received by the receiving unit.

12. The deterioration degree determination system for a secondary battery according to claim 10, wherein
the estimation formula memory unit, the necessity determination unit and the deterioration degree determination unit are provided in the external device,
the deterioration degree determination system further comprising:
- a transmission unit that is provided in the external device and transmits the battery characteristic acquired by the battery characteristic acquisition unit or the battery characteristic relationship value related to the battery characteristic to the server; and
- a receiving unit that receives update information related to the update of the estimation formula transmitted from the server.

* * * * *